US011224116B2

(12) United States Patent
Long et al.

(10) Patent No.: US 11,224,116 B2
(45) Date of Patent: Jan. 11, 2022

(54) MATCHLESS PLASMA SOURCE FOR SEMICONDUCTOR WAFER FABRICATION

(71) Applicant: Lam Research Corporation, Fremont, CA (US)

(72) Inventors: Maolin Long, Santa Clara, CA (US); Yuhou Wang, Fremont, CA (US); Ricky Marsh, San Ramon, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/853,516

(22) Filed: Apr. 20, 2020

(65) Prior Publication Data

US 2020/0253034 A1    Aug. 6, 2020

Related U.S. Application Data

(63) Continuation of application No. 16/356,180, filed on Mar. 18, 2019, now Pat. No. 10,638,593, which is a
(Continued)

(51) Int. Cl.
*H01J 37/32* (2006.01)
*H05H 1/46* (2006.01)
*H03F 3/217* (2006.01)

(52) U.S. Cl.
CPC ......... *H05H 1/46* (2013.01); *H01J 37/32174* (2013.01); *H01J 37/32183* (2013.01);
(Continued)

(58) Field of Classification Search
CPC .......... H01J 37/32082; H01J 37/32174; H01J 37/32175; H01J 37/32183
(Continued)

(56) References Cited

U.S. PATENT DOCUMENTS 6,812,919 B1 * 11/2004 Park .................... H04N 3/20
  345/211
2006/0132391 A1 * 6/2006 Onozawa ............. G09G 3/2965
  345/68

(Continued)

FOREIGN PATENT DOCUMENTS

DE    102011087106 A1    5/2013
WO    WO 2006133132 A2    12/2006

OTHER PUBLICATIONS

EP Search Report EP18868369, dated Jun. 17, 2021, 7 pages.

*Primary Examiner* — Tung X Le
(74) *Attorney, Agent, or Firm* — Penilla IP, APC

(57) ABSTRACT

A matchless plasma source is described. The matchless plasma source includes a controller that is coupled to a direct current (DC) voltage source of an agile DC rail to control a shape of an amplified square waveform that is generated at an output of a half-bridge transistor circuit. The matchless plasma source further includes the half-bridge transistor circuit used to generate the amplified square waveform to power an electrode, such as an antenna, of a plasma chamber. The matchless plasma source also includes a reactive circuit between the half-bridge transistor circuit and the electrode. The reactive circuit has a high-quality factor to negate a reactance of the electrode. There is no radio frequency (RF) match and an RF cable that couples the matchless plasma source to the electrode.

19 Claims, 36 Drawing Sheets

Related U.S. Application Data continuation of application No. 15/787,660, filed on Oct. 18, 2017, now Pat. No. 10,264,663.

(52) U.S. Cl.
CPC ........... *H03F 3/2173* (2013.01); *H05H 1/466* (2021.05); *H05H 1/4652* (2021.05); *H05H 2242/10* (2013.01); *H05H 2242/20* (2021.05)

(58) Field of Classification Search
USPC .................................................. 315/111.21
See application file for complete search history.

(56) References Cited

U.S. PATENT DOCUMENTS

| | | | |
|---|---|---|---|
| 2009/0015314 A1 | 1/2009 | Kirchmeier et al. | |
| 2009/0194508 A1* | 8/2009 | Ui | H01J 37/32027 216/67 |
| 2010/0194195 A1* | 8/2010 | Coumou | H01J 37/32174 307/24 |
| 2012/0313596 A1 | 12/2012 | Heid | |
| 2013/0208393 A1* | 8/2013 | Hampton | F02P 23/04 361/247 |
| 2014/0285021 A1* | 9/2014 | Yamagishi | H03K 4/023 307/52 |
| 2014/0361690 A1* | 12/2014 | Yamada | H01J 37/32155 315/111.21 |
| 2017/0352523 A1* | 12/2017 | Kasai | H02M 7/493 |

\* cited by examiner

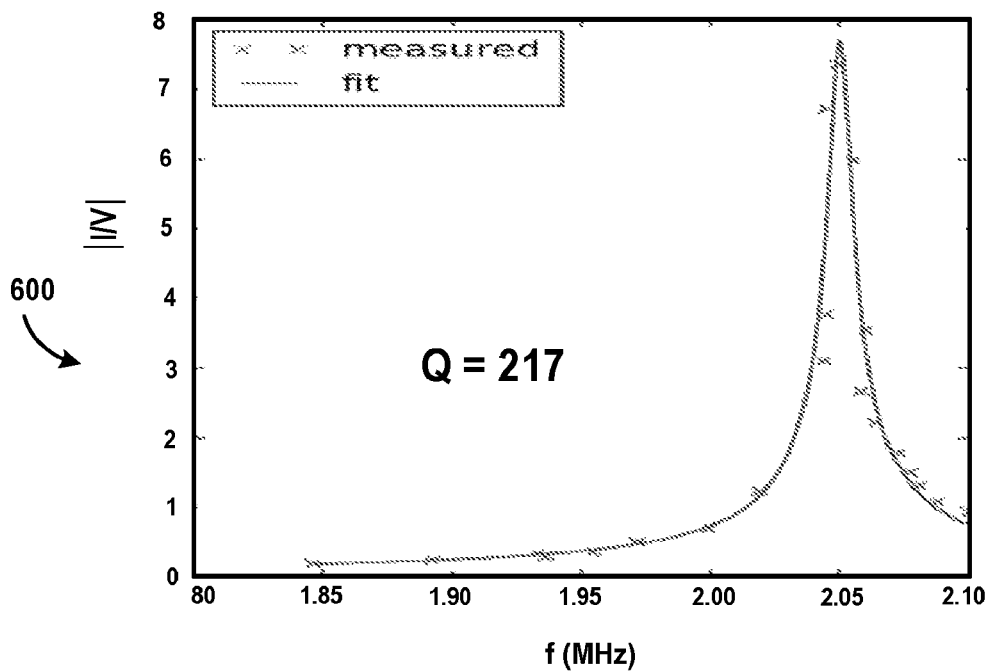
FIG. 6A (No Plasma Q)
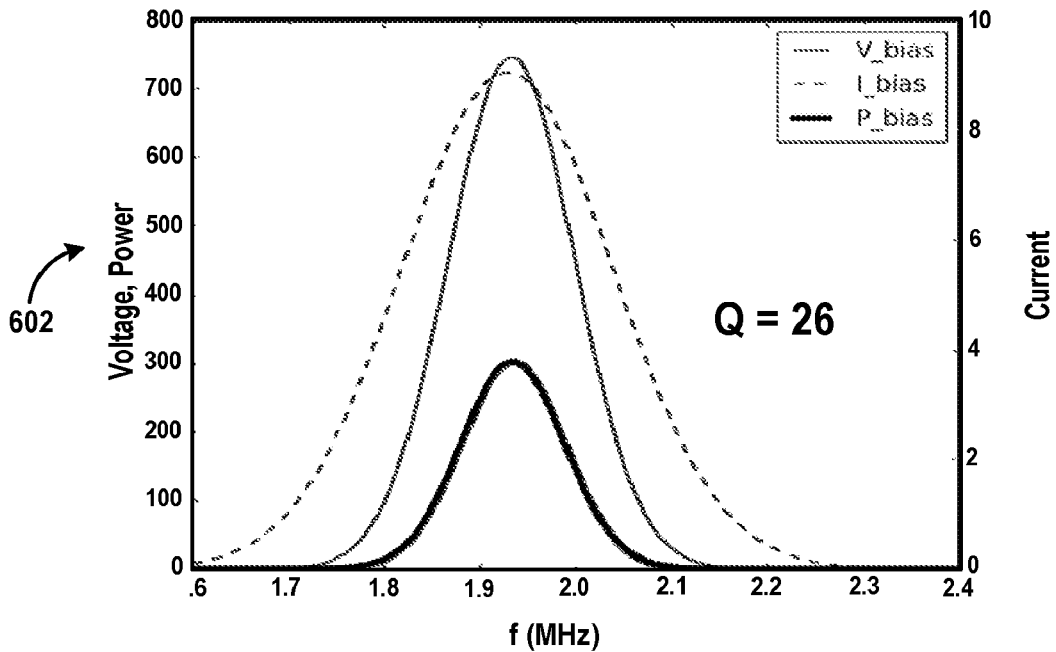
FIG. 6B (Plasma Q)

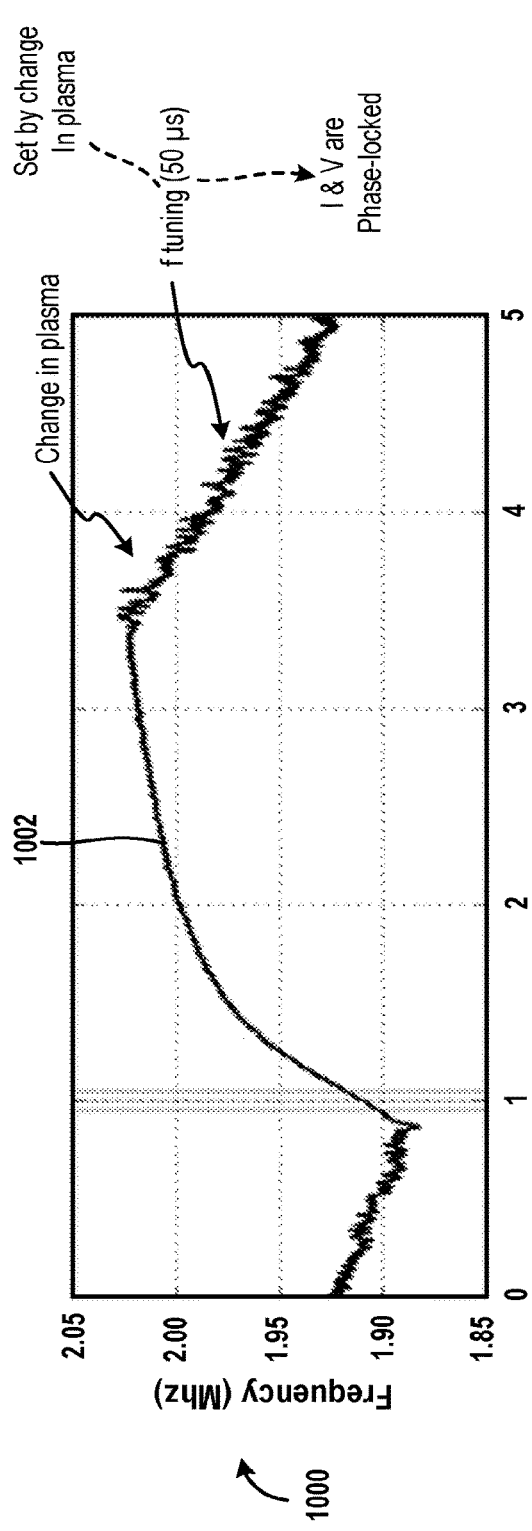
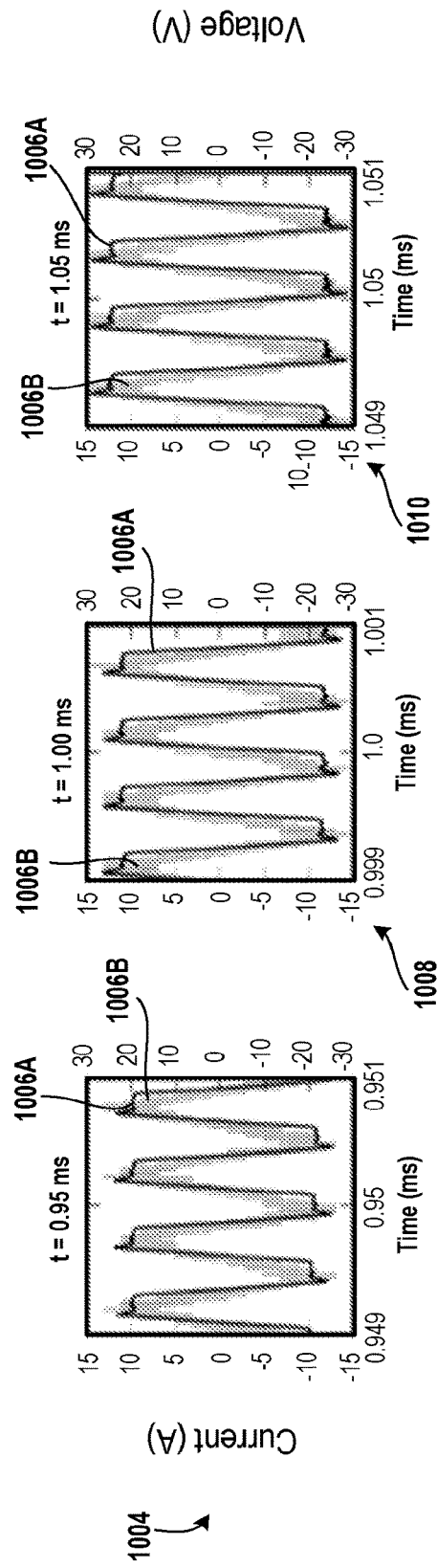
FIG. 10A
FIG. 10B
FIG. 10C
FIG. 10D

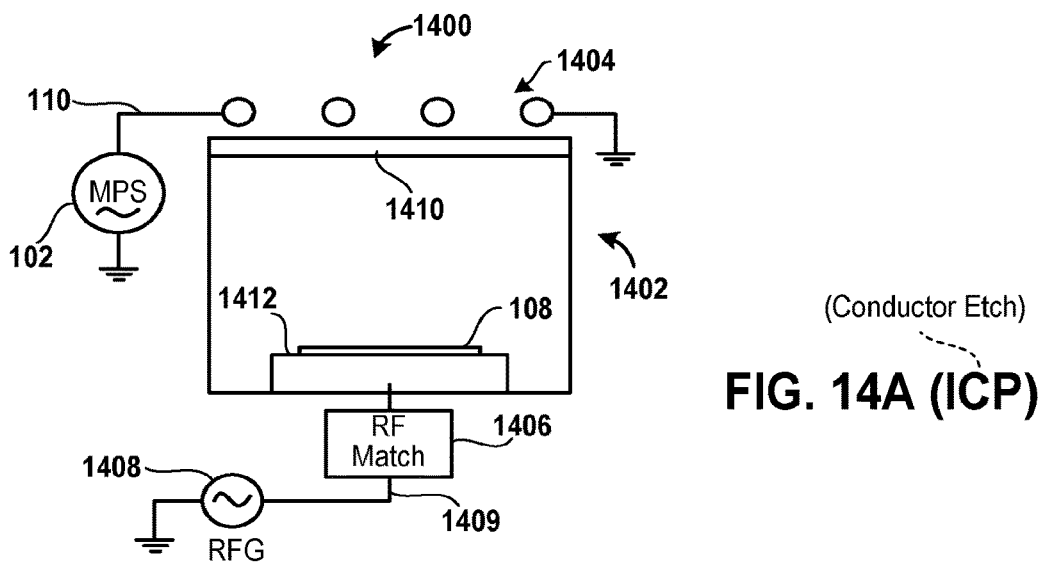
FIG. 14A (ICP) (Conductor Etch)
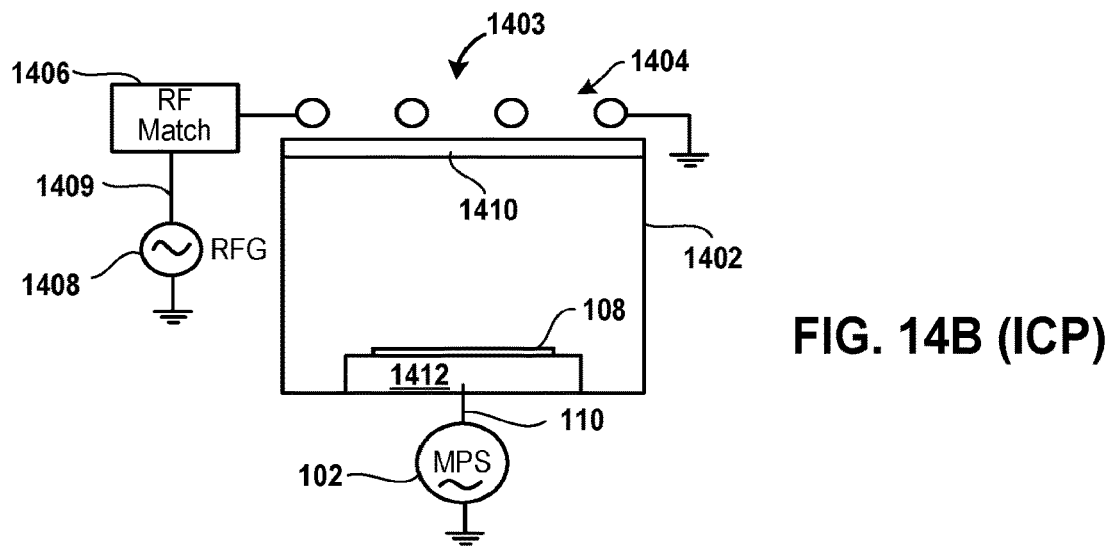
FIG. 14B (ICP)
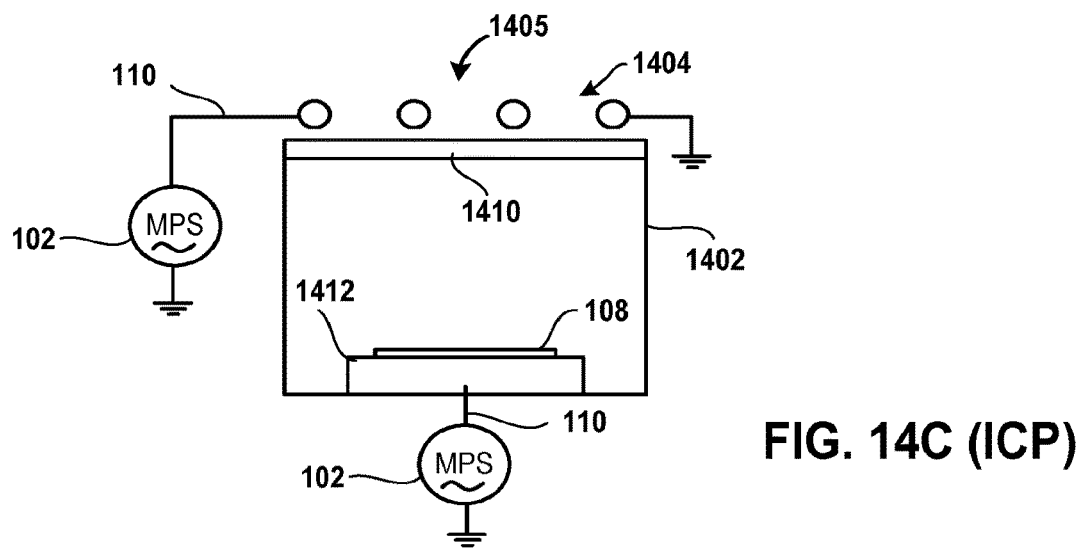
FIG. 14C (ICP)

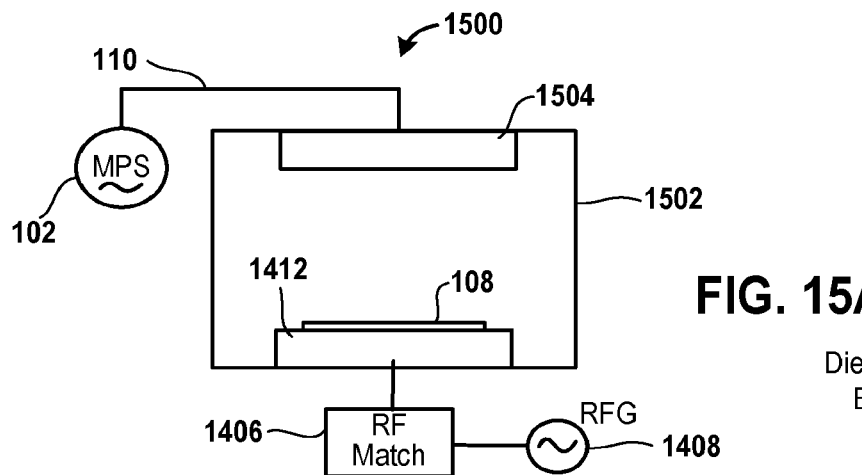
FIG. 15A (CCP)
Dielectric Etch
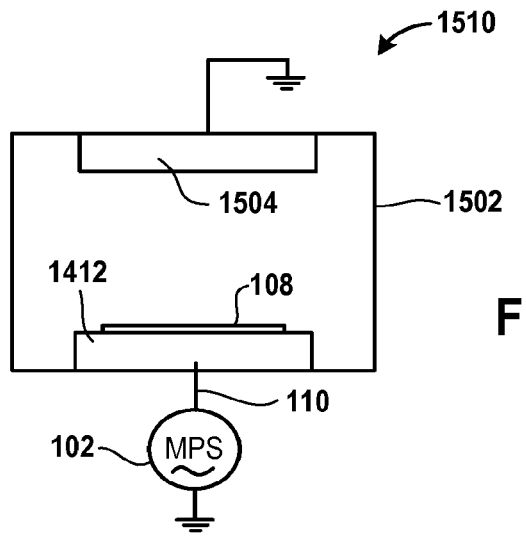
FIG. 15B (CCP)
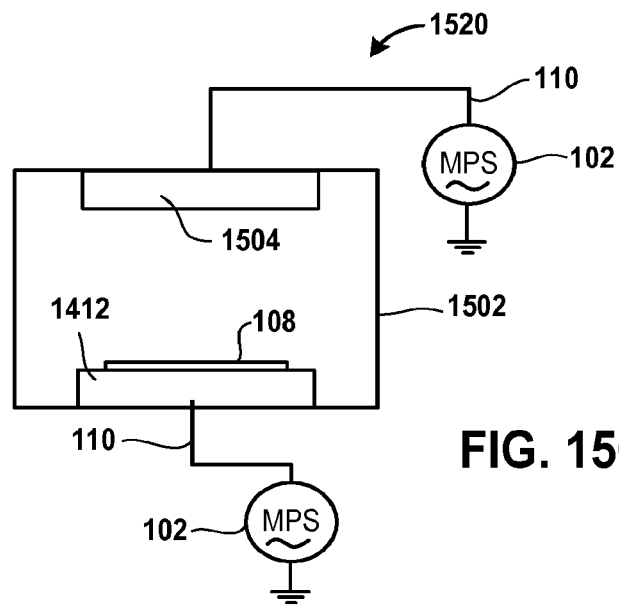
FIG. 15C (CCP)

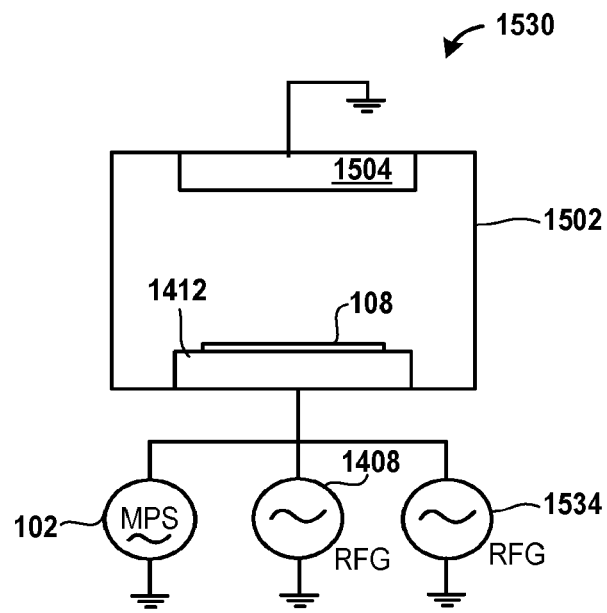
FIG. 15D (CCP)
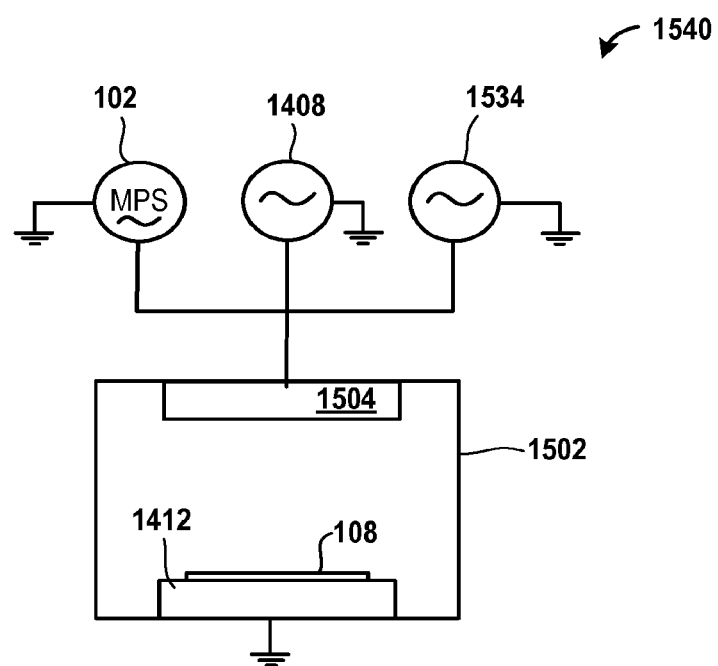
FIG. 15E (CCP)

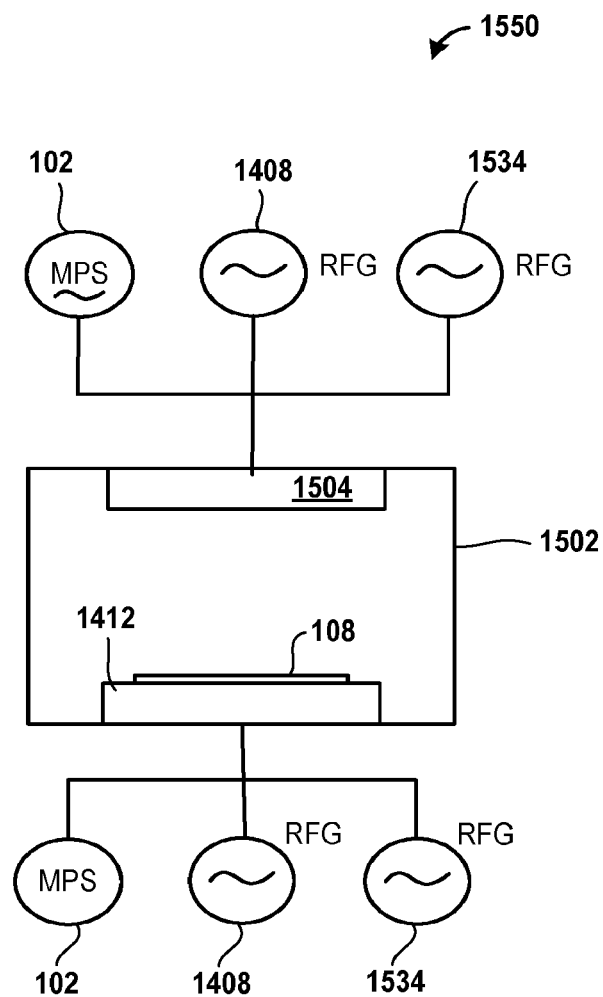
FIG. 15F (CCP)

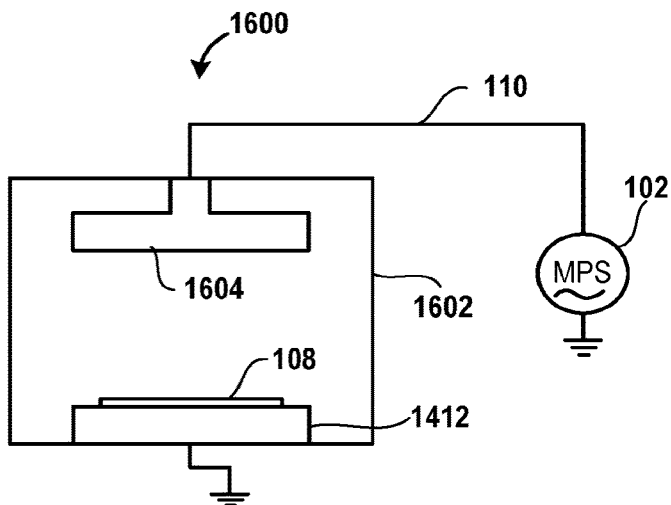
FIG. 16A (PECVD, PEALD)
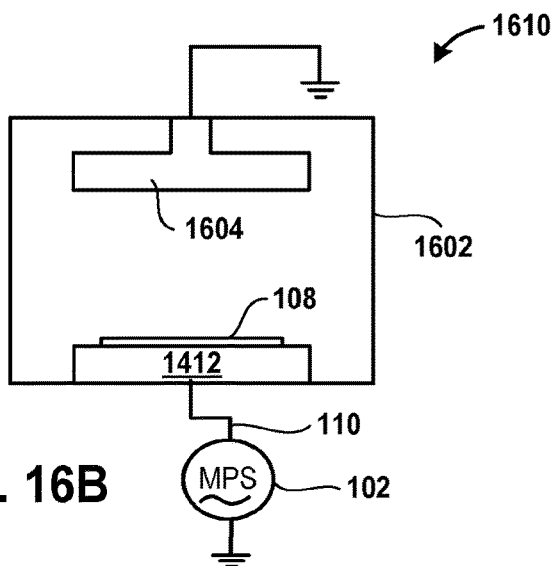
FIG. 16B
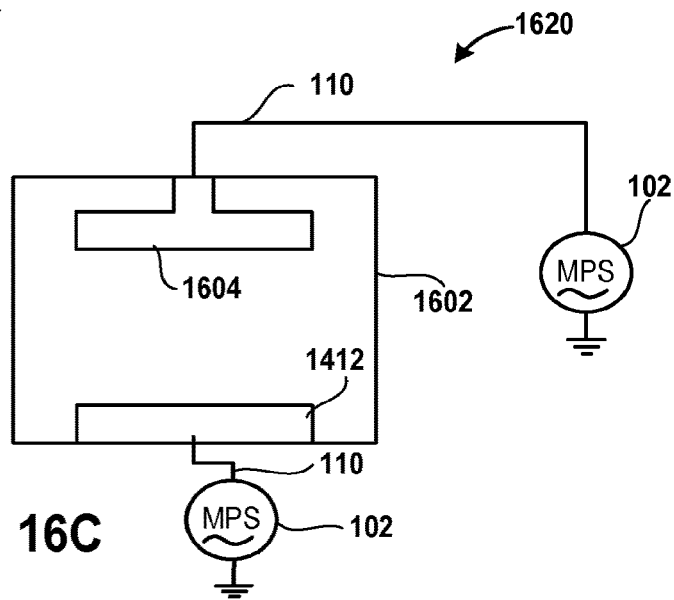
FIG. 16C

MATCHLESS PLASMA SOURCE FOR SEMICONDUCTOR WAFER FABRICATION

CLAIM OF PRIORITY

This application is a continuation of and claims the benefit of and priority, under 35 U.S.C. § 120, to U.S. patent application Ser. No. 16/356,180, filed on Mar. 18, 2019, and titled "Matchless Plasma Source for Semiconductor Wafer Fabrication", which is a continuation of and claims the benefit of and priority, under 35 U.S.C. § 120, to U.S. patent application Ser. No. 15/787,660, filed on Oct. 18, 2017, titled "Matchless Plasma Source for Semiconductor Wafer Fabrication", and issued as U.S. Pat. No. 10,264,663, all of which are hereby incorporated by reference in their entirety.

FIELD

The present embodiments relate to a matchless plasma source for coupling to an electrode.

BACKGROUND

A plasma system is used to perform a variety of operations on wafers. The plasma system includes a radio frequency (RF) generator, an RF match, and a plasma chamber. The RF generator is coupled to the RF match via an RF cable and the RF match is coupled to the plasma chamber. An RF power is provided via the RF cable and the RF match to the plasma chamber in which a wafer is processed. Also, one or more gases are supplied to the plasma chamber and upon reception of the RF power, plasma is generated within the plasma chamber.

It is in this context that embodiments described in the present disclosure arise.

SUMMARY

Embodiments of the disclosure provide systems, apparatus, methods and computer programs for providing a matchless plasma source for coupling to an electrode. It should be appreciated that the present embodiments can be implemented in numerous ways, e.g., a process, or an apparatus, or a system, or a piece of hardware, or a method, or a computer-readable medium. Several embodiments are described below.

In some embodiments, an RF power deliver system, such as the matchless plasma source, is coupled to an excitation electrode that can be used to generate or modify plasma, in any wafer fabrication chamber that uses RF power. For instance, the RF power delivery system provides RF power to the excitation electrode; such as one or more coils, or a showerhead, or a wafer platen, or a chuck. RF power is coupled to the electrode using power transistors, such as field-effect transistors (FETs) or insulated-gate bipolar transistors (IGBTs), that are operated as a low impedance voltage source to couple power to the electrode. There are numerous benefits in doing this compared to a system in which an RF generator, an RF cable, and an RF match are used. The benefits include a decrease in cost of the RF match and the RF cable, an increase in a speed of plasma ignition and impedance tuning, an increase in capabilities of forming different types of advanced pulses, and coil power multiplexing.

The RF generator with a 50 ohm output section provides power to a load using the RF cable, which is a 50 ohm transmission line. Moreover, the power is supplied from the RF cable to the RF match, which is a mechanical or electronic RF impedance match box, to transform an impedance of the load to be 50 ohms. When all impedances are matched to 50 ohms, maximum power is delivered to the load, with 0 watts of reflected power. This is how power is delivered in wafer fabrication using plasma processing, e.g., etch, deposition and physical vapor deposition (PVD). Therefore, the operation has limitations that inhibit future process capability. The limitations include limited speed of plasma ignition and impedance tuning, high cost of the RF match and the RF cable, limited capability of generating different types of pulses, and limited control of plasma uniformity.

In some embodiments described in the present disclosure, the 50 ohm RF power generator, 50 ohm RF cable, and the RF match used to transform the load impedance to be as close to 50 ohms, is replaced with a connection of a low impedance voltage source to an excitation electrode to be powered. The low impedance voltage source includes power transistors, such as FETs or IGBT's, which are organized in a half-bridge setup and operated in a push-pull configuration or full bridge (H) to avoid shoot through. The power transistors are controlled from a controller board with signals associated with RF frequency and pulsing sent to a gate driver, such as a FET gate driver. Power that is output from the low impedance voltage source is determined by an agile direct current (DC) rail. The agile DC rail is used to increase, decrease, or pulse the power output from the low impedance voltage source. The use of the agile DC rail is for power regulation and modulation while enabling arbitrary shape pulses to be constructed. The pulsing capabilities are enhanced compared to a plasma tool that has the RF generator, the RF cable, and the RF match.

Moreover, in various embodiments, depending on power requirements, multiple transistors, such as FETs or IGBTs, are combined in the full or half-bridge setup to provide a pre-determined power output. Typically, an output impedance of each transistor is from about 0.01 ohms to about 10 ohms. With a change in the number of the transistors, the pre-determined power output is achieved.

In some embodiments, to power the excitation electrode, a reactive circuit is placed in series with the power transistors to nullify a reactance of the excitation electrode. With no plasma, the power transistors essentially see a low resistive load. The reactive circuit placed between an output of the full or half-bridge setup of the power transistors and the excitation electrode provides a series resonance and produces a high-quality factor (Q) to nullify the reactance of the electrode. The reactance of the reactive circuit is designed to provide a high Q at an operating frequency of a power generator. For example, the Q is approximately between about 50 to about 500, in a no plasma case in which plasma is not lit within the wafer fabrication chamber. A benefit of the high Q is that the excitation electrode experiences a high voltage and electromagnetic field, which makes plasma ignition within the chamber substantially instantaneous. The substantial instantaneous ignition is followed by plasma sustainment within the wafer fabrication chamber.

Once the plasma is lit, in various embodiments, the operating frequency together with the agile DC rail voltage is adjusted to maintain constant output power from the power transistors by measuring a phase difference between a complex voltage and a complex current at an output of the power transistors and maintaining a zero degree phase difference. For example, a fast digitizer is used for measuring a current that is input to the excitation electrode and the operating frequency is changed to achieve the phase difference of zero degrees.

In several embodiments, the systems and methods, described herein, cover all of plasma processing impedance ranges.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 6A is an embodiment of a resonance plot to illustrate a change in a magnitude of a ratio of a current and voltage at an electrode within a plasma chamber of the system of FIG. 1 with a change in an operating frequency of a generator with no plasma.

FIG. 6B is an embodiment of a resonance plot to illustrate a change in voltage, current, and power at the electrode with a change in the operating frequency of the generator with plasma.

FIG. 10A is an embodiment of a graph to illustrate the operating frequency versus the time t during a pulse.

FIG. 10B is an embodiment of a graph to illustrate that a voltage and a current being supplied to the electrode are in phase during a time period to achieve a level of power for supply to the electrode.

FIG. 10C is an embodiment of a graph to illustrate that the voltage and the current being supplied to the electrode are in phase during another time period to achieve the level of power.

FIG. 10D is an embodiment of a graph to illustrate that the voltage and the current being supplied to the electrode are in phase during yet another time period to achieve the level of power.

FIG. 12B-1 is a side view of an embodiment of a system to illustrate cooling of multiple integrated circuit chips.

FIG. 12B-2 is a top view of the system illustrated in FIG. 12B-1.

FIG. 14A is a diagram of an embodiment of a system to illustrate use of an inductively coupled plasma (ICP)/transformer coupled (TCP) chamber with the matchless plasma source.

FIG. 14B is a diagram of an embodiment of a system to illustrate use of the ICP chamber in which the matchless plasma source is coupled to a substrate holder and a TCP coil is coupled to an RF generator via the RF match.

FIG. 14C is a diagram of an embodiment of a system to illustrate another use of the ICP chamber in which the matchless plasma source is coupled to the substrate holder and another matchless plasma source is coupled to the TCP coil.

FIG. 15A is a diagram of an embodiment of a system to illustrate use of the matchless plasma source with the CCP chamber.

FIG. 15B is a diagram of an embodiment of a system to illustrate use of the matchless plasma source with the CCP chamber in which the matchless plasma source is coupled to the substrate holder.

FIG. 15C is a diagram of an embodiment of a system to illustrate use of the matchless plasma source with the CCP chamber in which the matchless plasma source is coupled to the substrate holder and another matchless plasma source is coupled to an upper electrode of the CCP chamber.

FIG. 15D is a diagram of an embodiment of a system to illustrate coupling of the matchless power source and of RF power supplies to a substrate holder of the CCP chamber.

FIG. 15E is a diagram of an embodiment of a system to illustrate coupling of the matchless power source and of RF power supplies to an upper electrode of the CCP chamber.

FIG. 15F is a diagram of an embodiment of a system to illustrate coupling of the matchless power source and of RF power supplies to the upper electrode of the CCP chamber and coupling of another matchless power source and of another set of RF power supplies to the substrate holder of the CCP chamber.

FIG. 16A is a diagram of an embodiment of a system to illustrate a plasma chamber having a showerhead that is coupled to the matchless plasma source.

FIG. 16B is a diagram of an embodiment of a system to illustrate the plasma chamber of FIG. 16A in which the matchless plasma source is coupled to the substrate holder instead of the showerhead.

FIG. 16C is a diagram of an embodiment of a system to illustrate the plasma chamber of FIG. 16A in which the matchless plasma source is coupled to the substrate holder and another matchless plasma source is coupled to the showerhead.

DETAILED DESCRIPTION

Figure 1:
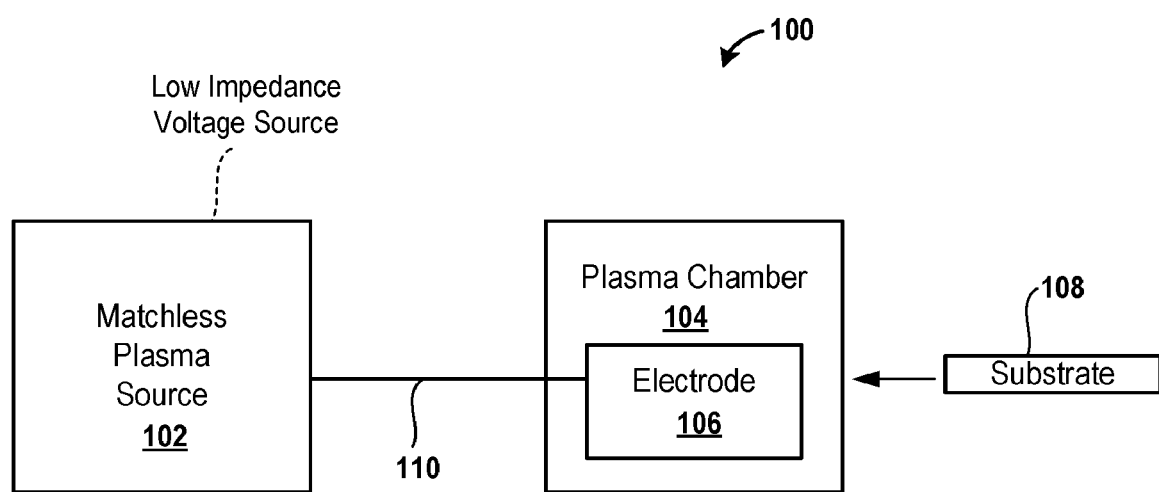
FIG. 1 is a diagram of an embodiment of a system for providing power to an electrode from a matchless plasma source without coupling a radio frequency (RF) match and an RF cable between the matchless plasma source and the electrode.

The following embodiments describe a matchless plasma source for coupling to an electrode. It should be understood that an electrode may take on many forms, and be integrated into many types of systems for providing radio frequency (RF) power. Broadly speaking, an electrode may also be referred to as an antenna, which by way of the electrical connection receives RF power. In the context of several embodiments described herein, RF power is supplied to an electrode of a chamber for purposes of igniting a plasma for performing one or more process operations. By way of example, the plasma may be ignited using the delivered RF power to perform etching operations, deposition operations, chamber cleaning operations, and other operations described throughout this application. Examples of a matchless plasma source (MPS) will be described, which illustrate useful structural implementations and uses for efficient delivery of RF power and for precision controlled ignition of plasma. It will be apparent that the present embodiments may be practiced without some or all of these specific details. In other instances, well known process operations have not been described in detail in order not to unnecessarily obscure the present embodiments.

The matchless plasma source has technical advantages, which include a high-quality factor, which results in a high current and a high voltage, for pre-striking of plasma. The technical advantages further include an optimal quality factor for plasma sustainability for stable processing operation. Moreover, the technical advantages include lower cost for higher performance of a plasma tool. The matchless plasma source has a low output impedance. Moreover, when the matchless plasma source is used, there is no need to use a radio frequency (RF) match and an RF cable.

The matchless plasma source is provided to increase an impedance tuning speed, to provide advanced pulse capabilities, and to provide coil power multiplexing. The matchless plasma source is configured to be connected to an electrode, such as a showerhead, a coil, an antenna, or a wafer platen. There is no need to use an RF cable and an RF match between the matchless plasma source and a plasma chamber. The lack of the RF match and the RF cable reduces chances of, such as eliminates, any power being reflected from the plasma chamber towards the matchless plasma source. Because the RF match is not used, there is an increase in the impedance tuning speed. The RF match has a large number of circuit components, some of which are adjusted to tune impedance associated with the plasma chamber. Such adjustment reduces the impedance tuning speed. The systems and methods, described herein, lack the RF match to increase the impedance tuning speed. In addition, costs for the RF match and the RF cable are saved.

The matchless plasma source has an input section and an output section. The input section has a signal generator that operates at a drive frequency. A reactive circuit associated with the output section produces a high-quality factor (Q) with no plasma. The high Q produced by the reactive circuit at a drive frequency facilitates providing a high voltage to the electrode. The high voltage to the surface of the electrode makes plasma ignition within the plasma chamber extremely favorable.

Moreover, the output section includes a half-bridge field-effect transistor (FET) circuit. Once plasma is ignited within the plasma chamber, the drive frequency is adjusted to maintain constant output power from the half-bridge FET circuit. For example, a fast digitizer is coupled to an output of the half-bridge FET circuit to measure an input current waveform and an input voltage waveform. The input current and voltage waveforms are measured while changing the drive frequency until a phase difference between the input current waveform and the input voltage waveform is zero degrees. As such, a desirable constant power is provided to the electrode by controlling the phase difference to be zero.

Furthermore, the electrode is driven by different types of waveforms to support different types of processes, such as, etching, cleaning, sputtering, depositing, etc. For example, an arbitrary-shaped pulse is generated at the output of the half-bridge FET circuit or a multi-state pulse is generated at the output. Accordingly, pulses of different shapes and of different power levels are used to drive the electrode. The different waveforms are generated by controlling an amount of direct current (DC) voltage that is provided at an output of an agile DC rail within the half-bridge FET circuit. The DC voltage is controlled by a controller board that provides voltage values to a DC source of the agile DC rail. In addition, the drive frequency is tuned at a high rate, such as less than 10 microseconds, to tune the impedance associated with the plasma chamber.

FIG. 1 is a diagram of an embodiment of a system 100 for providing power to an electrode 106 from a matchless plasma source 102. The system 100 includes the matchless plasma source 102 and a plasma chamber 104. An example of the matchless plasma source 102 is a low impedance voltage source. Examples of the plasma chamber 104 include a capacitively coupled plasma (CCP) chamber, a chemical vapor deposition (CVD) chamber, an atomic layer deposition (ALD) chamber, a transformer coupled plasma (TCP) reactor, a plasma enhanced chemical vapor deposition (PECVD) chamber, a plasma etch chamber, a plasma deposition chamber, or a plasma enhanced atomic layer deposition (PEALD) chamber Moreover, examples of the electrode 106 include a showerhead, a chuck, a substrate support, a capacitive upper electrode, a transformer coupled plasma (TCP) coil, and a wafer platen. The matchless plasma source 102 is coupled to the electrode 106 via a connection 110, such as a conductor, or an RF strap, or a cylinder, or a bridge conductor, or a combination thereof.

It should be noted that there is no RF match between the matchless plasma source 102 and the plasma chamber 104. Moreover, there is no RF cable that couples the matchless plasma source to the antenna. The RF match includes multiple circuit components, such as inductors and capacitors, to match an impedance of a load, such as a plasma chamber, that is coupled to the output of the RF match with an impedance of the source, such as an RF generator and the RF cable, that is coupled to an input of the RF match. A majority of power that is generated by the matchless plasma source 102 is applied to the electrode 106. For example, because there is no RF match and RF cable between the matchless plasma source 102 and the electrode 106, power is efficiently supplied from the matchless plasma source 102 to the electrode 106.

A substrate 108, such as a wafer, on which integrated circuits are fabricated, is placed within the plasma chamber 104 on a top surface of the electrode 106 or under the electrode 106. The matchless plasma source 102 operates at an operating frequency, which ranges from and including 50 kilohertz (kHz) to 100 megahertz (MHz), to generate a shaped sinusoidal waveform, which is an RF signal. The shaped sinusoidal waveform is supplied from the matchless plasma source 102 via the connection 110 to the electrode 106 to process the substrate 108. Illustrations of processing the substrate 108 include depositing materials on the substrate 108, etching the substrate 108, cleaning the substrate 108, and sputtering the substrate 108.

Figure 2:
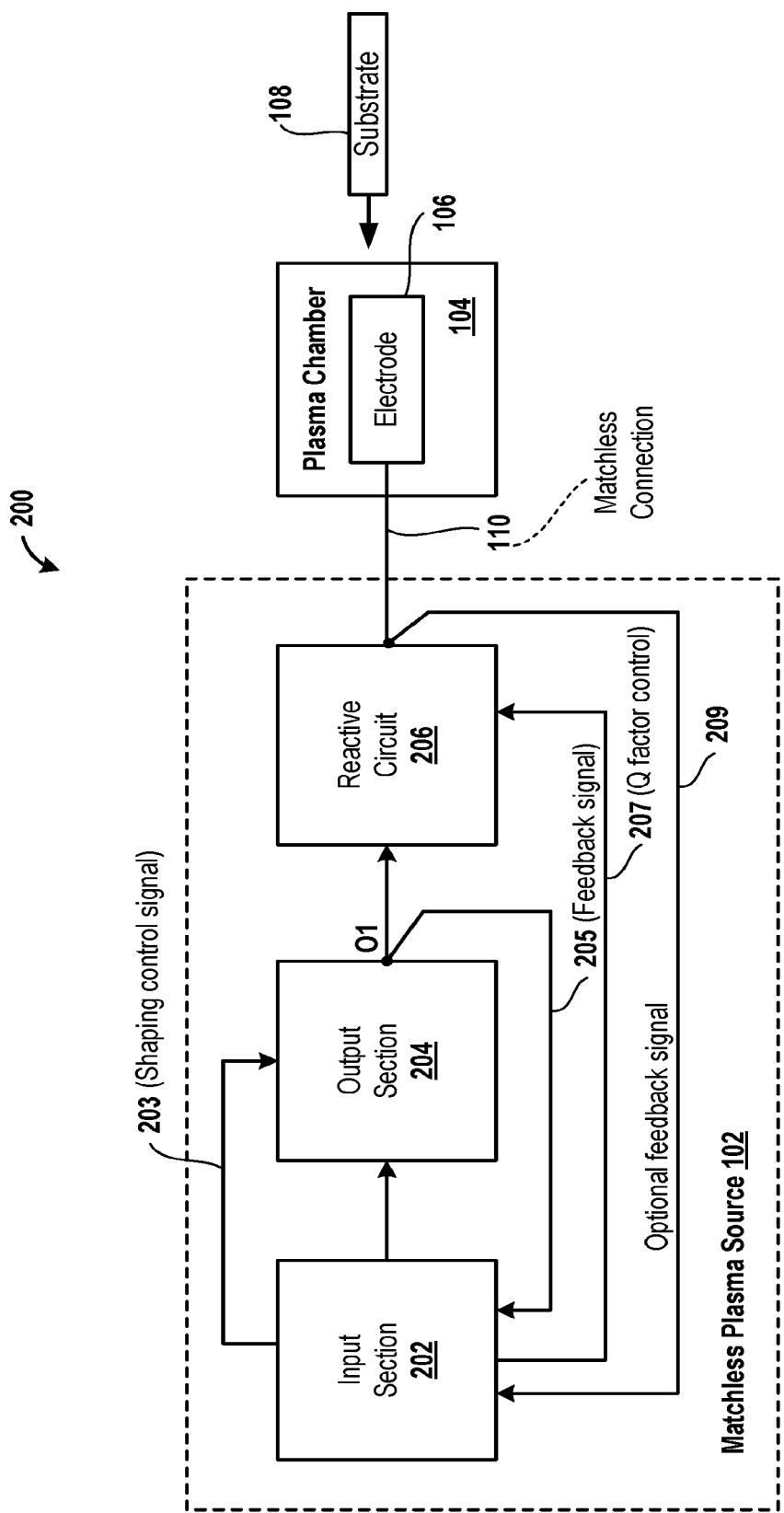
FIG. 2 is a diagram of an embodiment of a system to illustrate details of the matchless plasma source.

FIG. 2 is a diagram of an embodiment of a system 200 to illustrate details of the matchless plasma source 102. The system 200 includes the matchless plasma source 102, the connection 110, and the plasma chamber 104. The matchless plasma source 102 includes an input section 202, and output section 204, and a reactive circuit 206. The input section 202 is coupled to the output section 204, which is further coupled to the reactive circuit 206. The reactive circuit 206 is coupled via the connection 110 to the electrode 106.

The input section 202 includes a signal generator and a portion of a gate driver. The output section 204 includes the remaining portion of the gate driver and a half-bridge transistor circuit. An example of the reactive circuit 206 includes a variable capacitor. Another example of the reactive circuit 206 includes a fixed capacitor. Yet another example of the reactive circuit 206 includes multiple capacitors and/or inductors that are coupled to each other in series, or in parallel, or a combination thereof. Some of the capacitors are variable and the remaining of the capacitors are fixed. As another example, all the capacitors are variable or fixed. Similarly, some of the inductors are variable and the remaining of the inductors are fixed. As another example, all the inductors are variable or fixed.

The input section 202 generates multiple square wave signals and provides the square wave signals to the output section 204. The output section 204 generates an amplified square waveform from the multiple square wave signals received from the input section 202. Moreover, the output section 204 shapes an envelope, such as a peak-to-peak magnitude, of the amplified square waveform. For example, a shaping control signal 203 is supplied from the input section 202 to the output section 204 to generate the envelope. The shaping control signal 203 has multiple voltage values for shaping the amplified square waveform.

The amplified square waveform that is shaped is sent from the output section 204 to the reactive circuit 206. The reactive circuit 206 removes, such as filters out, higher-order harmonics of the amplified square waveform to generate the shaped sinusoidal waveform having a fundamental frequency. The shaped sinusoidal waveform has the envelope that is shaped.

The shaped sinusoidal waveform is sent from the reactive circuit 206 via the connection 110 to the electrode 106 for processing the substrate 108. For example, one or more process materials, such as fluorine containing gases, oxygen containing gases, nitrogen containing gases, liquids for deposition of metals and dielectrics, etc., are supplied to the plasma chamber 104. Upon receiving the shaped sinusoidal waveform and the process materials, plasma is lit within the plasma chamber 104 to process the substrate 108.

Moreover, a reactance of the reactive circuit 206 is modified by sending a quality factor control signal 207 from the input section 202 to the reactive circuit 206 to change a reactance of the reactive circuit 206. In addition, in some embodiments, a feedback signal 205 is sent from an output O1 of the output section 204 to the input section 202. A phase difference is identified or determined from the feedback signal 205 to control the output section 204 to reduce, such as nullify, the phase difference.

In various embodiments, in addition to or instead of the feedback signal 205, an optional feedback signal 209 is provided from an output of the reactive circuit 206 to the input section 202.

In some embodiments, the input section 202 includes a controller board having the signal generator and further includes the gate driver and the output section includes the half-bridge transistor circuit.

Figure 3A:
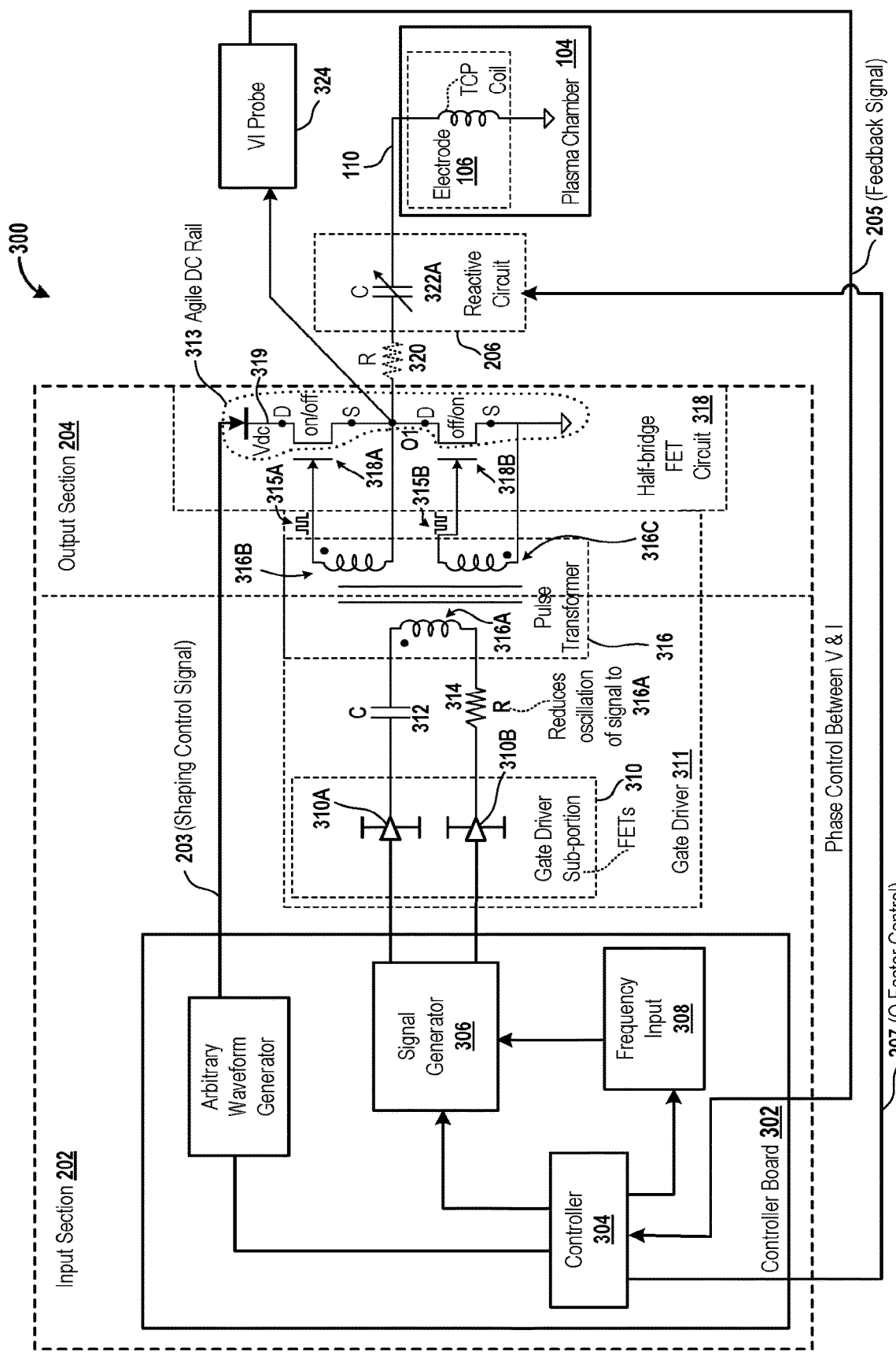
FIG. 3A is a diagram of an embodiment of a system to illustrate further details about an input section, an output section, and a reactive circuit of the matchless plasma source of FIG. 2.

FIG. 3A is a diagram of an embodiment of a system 300 to illustrate further details about the input section 202, the output section 204, and the reactive circuit 206. The input section 202 includes a controller board 302 and a portion of a gate driver 311. The gate driver 311 is coupled to the controller board 302. The output section 204 includes the remaining portion of the gate driver 311 and a half-bridge field effect transistor (FET) circuit 318. The half-bridge FET circuit 318 or a tree, described below, is sometimes referred to herein as an amplification circuit and is coupled to the gate driver 311.

The reactive circuit 206 includes a capacitor 322A, which is a variable capacitor. The controller board 302 includes a controller 304, a signal generator 306, and a frequency input 308. An example of a controller, as used herein, includes a processor and a memory device. Other examples of a controller include a microprocessor, an application specific integrated circuit (ASIC), a central processing unit, a processor, or a programmable logic device (PLD), or ideally a Field Programmable Gate Array (FPGA). The signal generator 306 is a square wave oscillator that generates a square wave signal, such as a digital waveform or a pulse train. The square wave pulses between a first logic level, such as high or one, and a second logic level, such as low or zero. The signal generator 306 generates the square wave signal at the operating frequency, such as 400 kHz, or 2 MHz, or 13.56 MHz, or 27 MHz, or 60 MHz.

The gate driver 311 includes a portion, which has a gate driver sub-portion 310, a capacitor 312, a resistor 314, and a primary winding 316A of a transformer 316. Moreover, the gate driver 311 includes the remaining portion, which includes secondary windings 316B and 316C of the transformer 316. The gate driver sub-portion 310 includes multiple gate drivers 310A and 310B. Each of the gate drivers 310A and 310B are coupled to a positive voltage source at one end and to a negative voltage source at its opposite end.

The half-bridge FET circuit 318 includes a FET 318A and a FET 318B that are coupled to each other in a push-pull configuration. An example of a FET includes a metal oxide semiconductor field effect transistor (MOSFET). To illustrate, each FET of a half-bridge FET circuit 318 is made from silicon carbide, or silicon, or gallium nitride. Each FET 318A and 318B has an output impedance that lies within a pre-determined range, such as from including 0.01 ohms to 10 ohms. Moreover, the half-bridge FET circuit 318 includes a DC rail 313 (illustrated within a dotted section), which includes a voltage source Vdc and a conductive element 319, such as a conductor, that is coupled to a drain terminal D of the FET 318A and a source terminal S of the FET 318A. Moreover, the conductive element 319 is coupled to a drain terminal D of the FET 318B and to a source terminal S of the FET 318B. The source terminal S of the FET 318A is coupled to the drain terminal D of the FET 318B and the source terminal S of the FET 318 is coupled to a ground potential. The electrode 106 is illustrated as a TCP coil, but instead can be an electrode in CCP configuration, within the plasma chamber 104.

The system 300 further includes a voltage and current (VI) probe 324 that is coupled to the output O1 of the half-bridge FET circuit 318. That VI probe 324 is a sensor that measures a complex current at the output O1, a complex voltage at the output O1, and a phase difference between the complex voltage and the complex current. The complex current has a magnitude and a phase. Similarly, the complex voltage has a magnitude and a phase. The output O1 is between the source terminal S of the FET 318A and the drain terminal D of the FET 318B. The VI probe 324 is coupled to the controller 304.

The controller 304 is coupled to the signal generator 306 to provide the frequency input 308, such as the operating frequency, to the signal generator 306. The controller 304 is further coupled via a conductor to the voltage source Vdc of the DC rail 313. Moreover, the signal generator 306 is coupled at its output to the gate drivers 310A and 310B. The gate driver 310A is coupled to the capacitor 312 and the gate driver 310B is coupled to the resistor 314. The capacitor 312 and the resistor 314 are coupled to the primary winding 316A of the transformer 316.

Moreover, the secondary winding 316B of the transformer 316 is coupled to a gate terminal of the FET 318A and the secondary winding 316C of the transformer 316 is coupled to a gate terminal of the FET 318B. The output O1 of the half-bridge FET circuit 318 is coupled to the capacitor 322A and the capacitor 322A is coupled via the connection 110 to the TCP coil of the electrode 106.

The controller 304 generates a setting, such as the frequency input 308, and provides the frequency input 308 to the signal generator 306. The frequency input 308 is the value, such as 2 MHz or 13.56 MHz, of the operating frequency. The signal generator 306 generates an input RF signal having the operating frequency upon receiving the setting from the controller 304. The input RF signal is the square wave signal. The gate drivers 310A and 310B amplify the input RF signal to generate an amplified RF signal and provide the amplified RF signal to the primary winding 316A of the transformer 316.

Based on a directionality of flow of current of the amplified RF signal, either the secondary winding 316B or the secondary winding 316C generates a gate drive signal having a threshold voltage. For example, when a current of the amplified RF signal flows from a positively charged terminal, indicated by a dot, of the primary winding 316A to a negatively charged terminal, lacking a dot, of the primary winding 316A, the secondary winding 316B generates a gate drive signal 315A having the threshold voltage to turn on the FET 318A and the secondary winding 316C does not generate the threshold voltage and the FET 318B is off. On the other hand, when the current of the amplified RF signal flows from the negatively charged terminal of the primary winding 316A to the positively charged terminal of the primary winding 316A, the secondary winding 316C generates a gate drive signal 315B having the threshold voltage to turn on the FET 318B and the secondary winding 316B does not generate the threshold voltage and the FET 318A is off.

Each gate drive signal 315A and 315B is a square wave, e.g., is a digital signal or a pulsed signal, having the operating frequency. For example, each gate driver signal 315A and 315B transitions between a low level and a high level. The gate driver signals 315A and 315B have the operating frequency and are in reverse synchronization with respect to each other. To illustrate, the gate driver signal 315A transitions from the low level, such as a low power level, to the high level, such as a high power level. During a time interval or a time at which the gate driver signal 315A transitions from the low level to the high level, the gate driver signal 315B transitions from the high level to the low level. Similarly, during a time interval or a time in which the gate driver signal 315A transitions from the high level to the low level, the gate driver signal 315B transitions from the low level to the high level. The reverse synchronization allows the FETs 318A and 318B to be turned on consecutively and to be turned off consecutively.

The FETs 318A and 318B are consecutively operated. For example, when the FET 318A is turned on, the FET 318B is turned off and when the FET 318B is turned on, the FET 318A is turned off. To illustrate, during a time period in which or a time at which the FET 318A and is turned on, the FET 318B is turned off. Moreover, during a time period in which or a time at which the FET 318B is turned on, the FET 318A is turned off. The FETs 318A and 318B are not on at the same time or during the same time period.

When the FET 318A is on, a current flows from the voltage source Vdc to the output O1 to generate a voltage at the output O1 and the FET 318B is off. The voltage at the output is generated according to the voltage values received from the controller 304 or an arbitrary waveform generator, which is further described below. When the FET 318B is off, there is no current flowing from the output O1 to the ground potential that is coupled to the FET 318B. The current flows from the output O1 to the capacitor 322A. The current is pushed from the voltage source Vdc to the capacitor 322A when the FET 318A is on. Moreover, when the FET 318B is on, the voltage that is generated at the output O1 generates a current that flows from the output O1 to the ground potential coupled to the FET 318B and the FET 318A is off. The current is pulled from the output O1 to the ground potential. During a time interval in which the FET 318A is off, there is no current flowing from the voltage source Vdc to the output O1.

Furthermore, the controller 304 generates a control signal, such as the shaping control signal 203, having voltage values and provides the control signal to the voltage source Vdc via the conductor that couples the voltage source Vdc to the controller 304. The voltage values range, for example, from zero to eighty volts so that the agile DC rail 313 operates in the range. The voltage values are magnitudes of the voltage signal that is generated by the voltage source Vdc to define the shaped envelope of the voltage signal to further define the shaped envelope of the amplified square waveform at the output O1. For example, to generate a continuous waveform at the output O1, the voltage values provide a peak-to-peak magnitude of the continuous waveform. The peak-to-peak magnitude defines the shaped envelope of the continuous waveform. As another example, to generate the amplified square waveform that has the shaped envelope of a pulsed shape at the output O1, the voltage values are changed substantially instantaneously, such as at a time or during a pre-determined time period, so that a peak-to-peak magnitude of the amplified square waveform changes from a first parameter level, such as a high level, to a second parameter level, such as a low level, or changes from the second parameter level to the first parameter level. As yet another example, to generate the amplified square waveform that has the shaped envelope of an arbitrary shape at the output O1, the voltage values are changed in an arbitrary manner by the controller 304 so that a peak-to-peak magnitude of the amplified square waveform changes in a desired manner. When the amplified square waveform of the arbitrary shape is generated, the controller 304 acts as the arbitrary waveform generator. As yet another example, to generate the amplified square waveform that has the shaped envelope of a multi-state pulsed shape at the output O1, the voltage values are changed substantially instantaneously, such as at a time, so that a peak-to-peak magnitude of the amplified square waveform changes from a high parameter level to one or more middle levels, and then changes from the one or more middle levels to another level, such as a low parameter level or the high parameter level. It should be noted that the amplified square waveform that has the shaped envelope of the multi-state pulsed shape has any number of states, such as ranging from two to a thousand.

A parameter level as used herein includes one or more parameter values which are exclusive of one or more parameter values of another parameter level. For example, a power amount at a parameter level is greater than or less than a power amount at a different parameter level. Examples of the parameter include current, voltage, and power.

By consecutively operating the FETs 318A and 318B based on the gate drive signals 315A and 315B and controlling the agile DC voltage rail voltage Vdc to change the voltage values, the amplified square waveform is generated at the output O1. An amount of amplification of the amplified square waveform is based on the output impedances of the FETs of the half-bridge FET circuit 318, the voltage values that are supplied by the controller 304 to the voltage source Vdc, and a maximum achievable voltage value of the voltage source Vdc. The amplified square waveform has the shaped envelope. The capacitor 322A in combination with the inductance of the TCP coil, receives the amplified square waveform and reduces, such as removes or filters, the higher-order harmonics of the amplified square waveform to generate the shaped sinusoidal waveform having the fundamental frequency. The shaped sinusoidal waveform also has the shaped envelope. The shaped sinusoidal waveform is supplied from an output of the capacitor 322A via the connection 110 to the TCP coil of the electrode 106 to ignite or maintain plasma within the plasma chamber 104. The plasma is used to process the substrate 108 (FIG. 1).

The VI probe 324 measures the complex voltage and current of the amplified square waveform at the output O1 and provides the feedback signal 205, which includes a complex voltage and current, to the controller 304. The controller 304 identifies the phase difference between the complex voltage of the amplified square waveform and the complex current of the amplified square waveform from the complex voltage and current received from the VI probe 324, and determines whether the phase difference is within a predetermined limit. For example, the controller 304 determines whether the phase difference is zero or within a predetermined percentage from zero. Upon determining that the phase difference is not within the predetermined limit, the controller 304 changes frequency values of the operating frequency to change the frequency input 308. The changed frequency values are provided from the controller 304 to the signal generator 306 to change the operating frequency of the signal generator 306. The operating frequency is changed in, for example, less than or equal to 10 microseconds. The operating frequency of the signal generator 306 is changed until the controller 304 determines that the phase difference between the complex voltage and the complex current that is measured by the VI probe 324 is within the predetermined limit. Upon determining that the phase difference between the complex voltage and the complex current is within the predetermined limit, the controller 304 does not further change the frequency input 308. When the phase difference is within the pre-determined limit, a pre-determined amount of power is provided from the output O1 via the reactive circuit 206 to the electrode 106.

In addition to or instead of changing the frequency input 308, the controller 304 changes the voltage values that are being supplied to the agile DC rail voltage Vdc to change the voltage signal generated by the voltage source Vdc. Upon receiving the changed voltage values, the voltage source Vdc changes the voltage signal to have the changed voltage values. The controller 304 continues to change the voltage values until a pre-determined power setpoint is achieved. The pre-determined power setpoint is stored in a memory device of the controller 304

In various embodiments, instead of changing a voltage of the amplified square waveform at the output O1, a current of the amplified square waveform is changed. For example, the change in the voltage values controls a change in a current of the amplified square waveform generated at the output O1 of the half-bridge FET circuit 318. To illustrate, the voltage values are changed to achieve pre-determined current values of the amplified square waveform at the output O1. The pre-determined current values are stored in the memory device of the controller 304. Moreover, in some embodiments, instead of changing a voltage of the amplified square waveform at the output O1, a power of the amplified square waveform is changed. For example, the change in the voltage values controls a change in power of the amplified square waveform generated at the output O1. For example, the voltage values are changed to achieve pre-determined power values of the amplified square waveform at the output O1. The pre-determined power values are stored in the memory device of the controller 304. It should be noted that any change in the voltage, current, or a power of the amplified square waveform generated at the output O1 produces the same change in the voltage, current, or the power of the shaped sinusoidal waveform generated at an output of the reactive circuit 206.

In some embodiments, the controller 304 is coupled via a motor driver and a motor to the reactive circuit 206. An example of the motor driver includes one or more transistors. The controller 304 sends a signal, such as the quality factor control signal 207, to the motor driver to generate a current signal, which is sent from the motor driver to the motor. The motor operates upon receiving the current signal to change a reactance of the reactive circuit 206. For example, the motor operates to change an area between plates of the capacitor 322A to change a capacitance of the reactive circuit 206. As another example, the motor operates to change an inductance of an inductor of the reactive circuit 206. For example, the reactance of the reactive circuit 206 is changed to maintain a pre-determined quality factor, such as a high-quality factor, of the reactive circuit 206. As another example, the reactance of the reactive circuit 206 is changed based on a type, such as the CCP or ICP, of a plasma chamber to which the reactive circuit 206 is coupled.

Capacitor 312 and Resistor 314

The capacitor 312 has a capacitance that reduces, such as cancels or negates, an inductance of the primary winding 316A. The reduction of the inductance of the primary winding 316A facilitates generation of a square shape of the gate drive signals 315A and 315B. Moreover, the resistor 314 reduces an oscillation of the square wave signal that is generated by the signal generator 306.

Agile DC Rail 313

The DC rail 313 is agile in that there is fast control of the voltage source Vdc by the controller 304. Both the controller 304 and the voltage source Vdc are electronic circuits, which allow the controller 304 to substantially instantaneously control the voltage source Vdc. For example, at a time the controller 304 sends the voltage values to the voltage source Vdc, the voltage source Vdc changes voltage of the voltage signal that is generated by the voltage source.

Resistance 320

The resistance 320 is viewed by the output O1 of the half-bridge FET circuit 318. The resistance 320 is a stray resistance in the electrode 106, in the plasma when lit within the plasma chamber 104, and of the connection 110.

Capacitor 322A

The capacitor 322A in combination with the TCP coil's inductance has a high-quality factor (Q). For example, an amount of power of the amplified square waveform lost in the capacitor 322A is low compared to an amount of power of the amplified square waveform transferred via the capacitor 322A to the electrode 106. The power of the amplified square waveform is transferred via the shaped sinusoidal waveform output from the capacitor 322A to the electrode 106. The high-quality factor of the circuit facilitates fast plasma ignition within the plasma chamber 104. Moreover, the capacitor 322A has a capacitance value that resonates out an inductive reactance of the TCP coil and the plasma, when lit, within the plasma chamber 104. For example, the reactive circuit 206 has a reactance that reduces, such as nullifies or cancels, a reactance of the electrode 106, or a reactance of the connection 110, or a reactance of the plasma, when lit, within the plasma chamber 104, or a combination thereof. The reactance of the reactive circuit 206 is achieved by adjusting a capacitance of the capacitor 322A. In case of a CCP chamber, the reactive circuit 206 includes one or more inductors, and the reactance of the inductor is achieved by adjusting an inductance of the one or more inductors. Due to the reduction in the reactance, the output O1 sees the resistance 320 and does not see any reactance.

FETs 318A and 318B

Figure 11A:
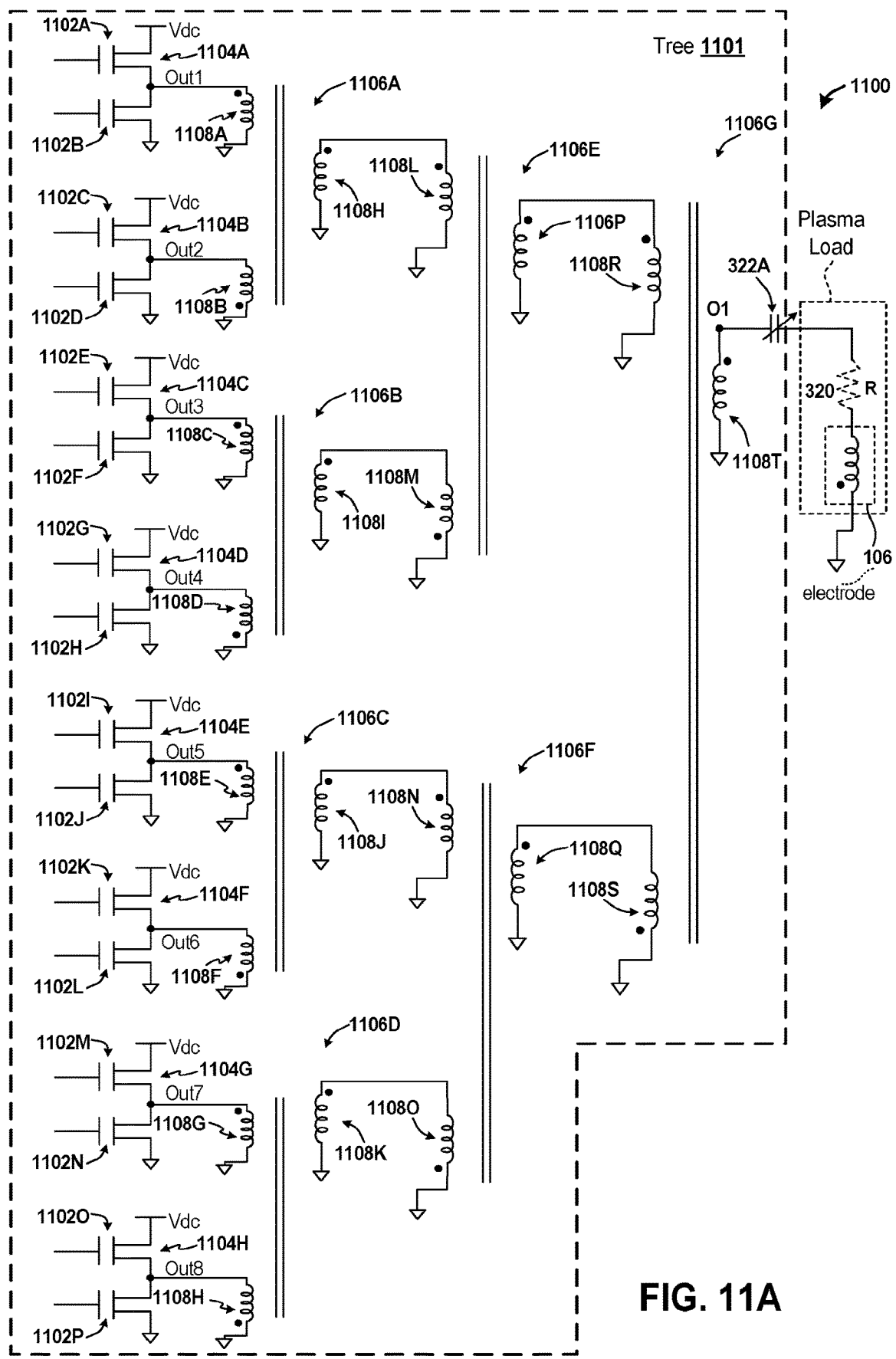
FIG. 11A is a diagram of an embodiment of a system to illustrate a tree having FETs and transformers to power the electrode.
Figure 11B:
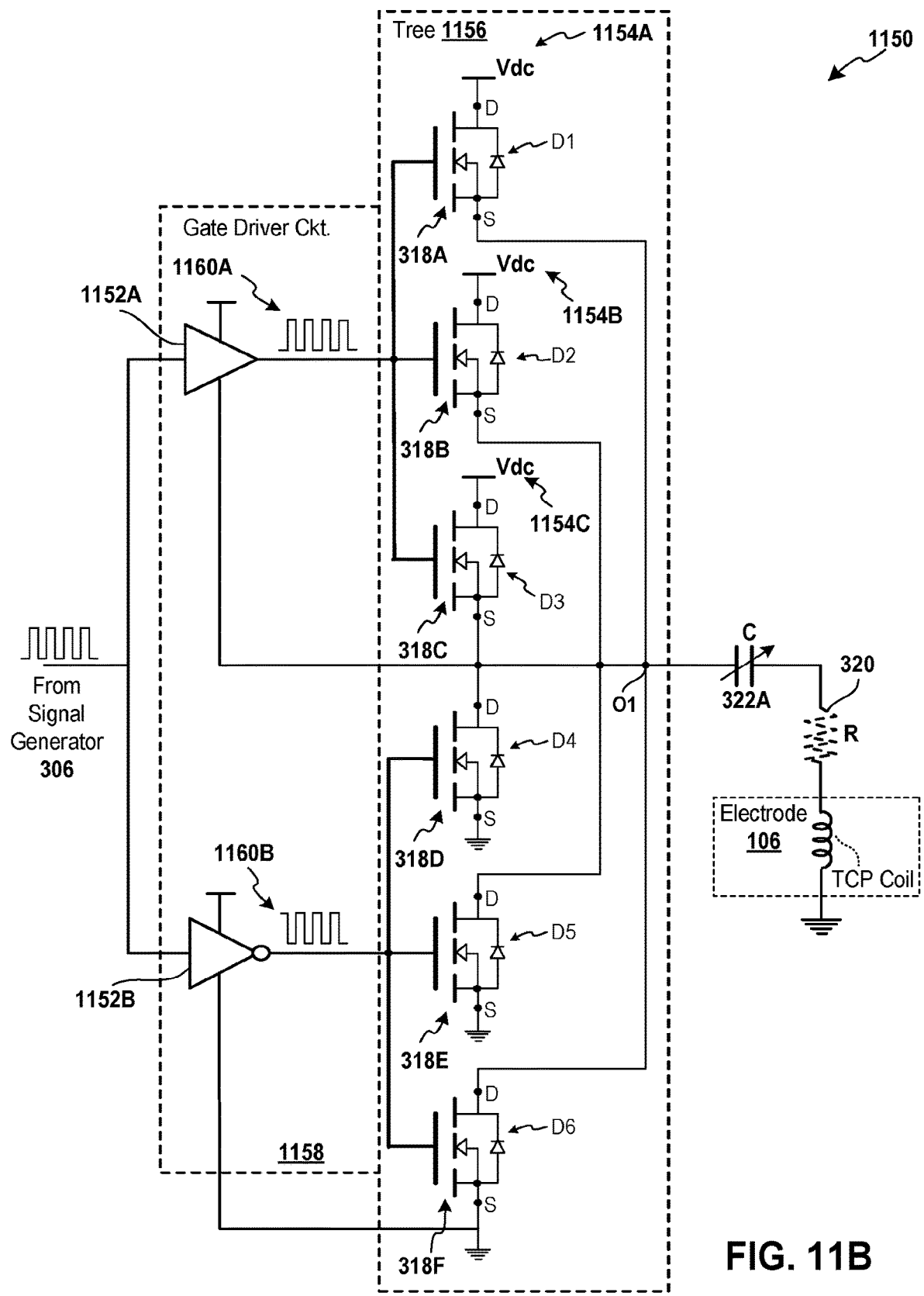
FIG. 11B is a diagram of an embodiment of a system to illustrate another tree of a transistor circuit used to power the electrode.

Each FET of the half-bridge FET circuit 318 or a tree, described below in FIGS. 11A and 11B, is fabricated, in some embodiments, from silicon carbide. The silicon carbide FET has a low internal resistance and fast switching time. The low internal resistance provides for higher efficiency, which facilitates the FET to turn on nearly instantaneously and to turn off fast, such as in less than 10 microseconds. For example, each FET, described herein, is turned on or off in less than a pre-determined time period, such as less than 10 microseconds. As an illustration, each FET is turned on or off in a time period between about 1 microsecond and about 5 microseconds. As another illustration, each FET is turned on or off in a time period between about 3 microsecond and about 7 microseconds. As yet another illustration, each FET is turned on or off in a time period between about 0.5 microseconds and about 10 microseconds. Because of the fast turning on and off, there is less, such as zero, delay in a transition from turning on to turning off and in a transition from turning off to turning on. For example, the FET 318A turns on at the same time or during a time period in which the FET 318B turns off and the FET 318A turns off at the same time or during a time period in which the FET 318B turns on. When overlap of the on-time of the FETs 318A and 318B occurs, there is shoot through, which may damage the FETs. The nearly instantaneous turning on and off of the FETs reduces the chances of shoot through occurring, reducing chances of the damage. Moreover, the silicon carbide FET is easier to cool. For example, the low internal resistance of the silicon carbide FET reduces an amount of heat generated by the silicon carbide FET. Therefore, it is easier to cool the silicon carbide FET using a cooling plate or a heat sink.

Components, such as transistors, of the matchless plasma source 102 are electronic. Moreover, there is no RF match and RF cable between the matchless plasma source 102 and the electrode 106. The electronic components and the lack of the RF match and the RF cable facilitates the repeatability and the consistency to facilitate fast plasma ignition and plasma sustainability.

In some embodiments, instead of or in addition to the controller 304, multiple controllers are used. For example, one of the multiple controllers is coupled to the voltage source Vdc and another one of the multiple controllers is coupled to the signal generator 306 to provide the frequency input 308. To illustrate, the controller 304 is coupled to the arbitrary waveform generator, such as a digital signal processor, and is coupled to a frequency controller. The frequency controller is coupled to the signal generator 306. The controller 304 sends a signal to the arbitrary waveform generator and sends another signal to the frequency controller. Upon receiving the signal from the controller 304, the arbitrary waveform generator generates the voltage values of the shaping control signal 203 for shaping the amplified square waveform at the output O1. Moreover, upon receiving the other signal from the controller 304, the frequency controller generates frequency values of the square wave signal that is generated by the signal generator 306 to reduce the phase difference between the complex voltage and complex current received within the feedback signal 205.

In various embodiments, the controller 304 and the signal generator 306 are manufactured on separate circuit boards.

In several embodiments, instead of the transformer 316 being used as a portion of the gate driver 311, transistors, such as FETs or insulated-gate bipolar transistors (IGBTs), are coupled with each other to produce the portion of the gate driver 311.

In various embodiments, instead of FETs, another type of transistor, such as an IGBT or a metal semiconductor field effect transistor (MESFET), or a junction field effect transistor (JFET), is used herein.

In some embodiments, instead of the half-bridge FET circuit 318, another half-bridge circuit that includes a tree of transistors is used. For example, a first column of the tree includes 32 transistors coupled to a first voltage source. Half of the 32 transistors are coupled to a secondary winding of a transformer in the same manner in which the FET 318A is coupled to the secondary winding 316B and the remaining half of the 32 transistors are coupled to a secondary winding of the transformer in the same manner in which the FET 318B is coupled to the secondary winding 316C. A second column of the tree located besides the first column includes 16 transistors coupled to a second voltage source. Moreover, a third column of the tree is located besides the second column and includes 8 transistors. Also, a fourth column of the tree is located besides the third column and includes four transistors. A fifth column of the tree is located besides the fourth column and includes two transistors, which are coupled to the output O1.

In various embodiments, instead of the VI probe 324, a voltage sensor and a current sensor are coupled to the output O1.

In some embodiments, in addition to the series capacitor 322A, a shunt capacitor is also used. The shunt capacitor is coupled at one end to the connection 110 and at another end to the ground potential. In various embodiments, multiple shunt capacitors are used instead of the shunt capacitor. The multiple shunt capacitors are coupled to each other in series or in parallel.

In various embodiments, instead of or in addition to the capacitor 322A, an inductor is coupled in series or parallel to the capacitor 322A to negate a reactance of the electrode 106. In some embodiments, any number of inductors are coupled in series or in parallel to the capacitor 322A to negate the reactance of the electrode 106.

The FETs described herein are n-type. In some embodiments, instead of the n-type FETs, p-type FETs are used. For example, in a half-bridge circuit, the voltage source Vdc is coupled via the conductive element 319 to a source terminal of a p-type FET. Moreover, a drain terminal of the p-type FET is coupled to a source terminal of another p-type FET. A drain terminal of the other p-type FET is coupled to the ground potential.

Figure 3B:
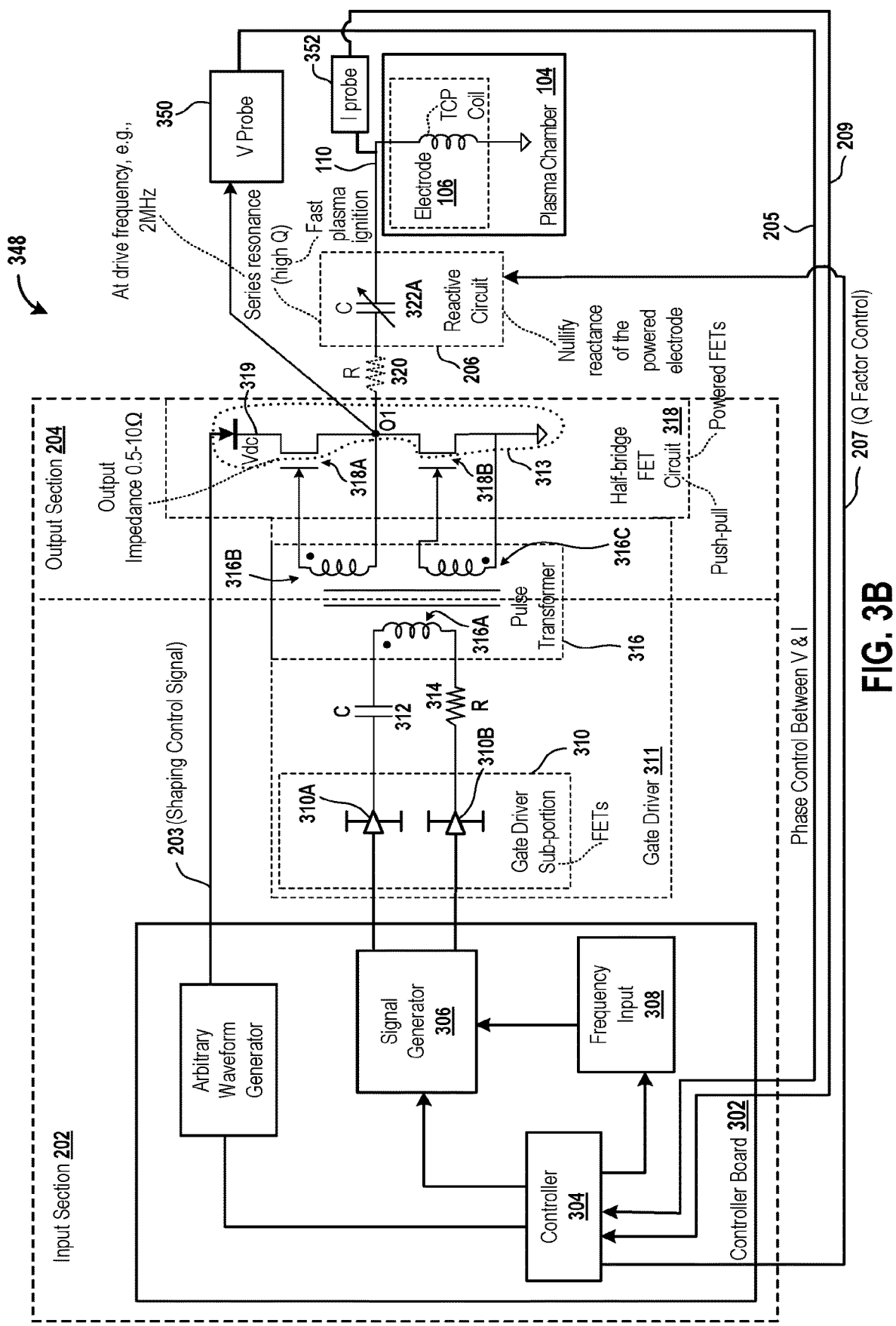
FIG. 3B is a diagram of an embodiment of a system to illustrate that instead of using a voltage and current (VI) probe in the system of FIG. 3A, a voltage probe and a current probe are used.

FIG. 3B is a diagram of an embodiment of a system 348 to illustrate that instead of the VI probe 324 (FIG. 3A), a voltage probe 350 and a current probe 352 are used. The system 348 is the same as the system 300 except that in the system 348, instead of the VI probe 324, the voltage probe 350 and the current probe 352 are used. The voltage probe 350 is a sensor coupled to the output O1 of the half-bridge FET circuit 318 to measure voltage of the amplified square waveform at the output O1. Moreover, the current probe 352 is coupled to a point on the connection 110, such as to the output of the reactive circuit 206. The point is located between the reactive circuit 206 and the electrode 106. The voltage probe 350 is coupled via a conductor to the controller 304 and the current probe 352 is coupled via a conductor to the controller 304.

The voltage probe 350 measures the complex voltage of the amplified square waveform at the output O1 and provides the complex voltage to the controller 304. Moreover, the current probe 352 measures the complex current of the shaped sinusoidal waveform output from the reactive circuit 206 and provides the complex current to the controller 304. The complex voltage is provided within the feedback signal 205 and the complex current is provided within the optional feedback signal 209 to the controller 304. The controller 304 identifies a phase of the complex voltage and a phase of the complex current, and determines a phase difference between the phases of the complex voltage and the complex current. The controller 304 controls the operating frequency of the signal generator 306, or a magnitude of the parameter at the output O1, or a combination thereof, to reduce the phase difference to be within the pre-determined limit.

Figure 3C:
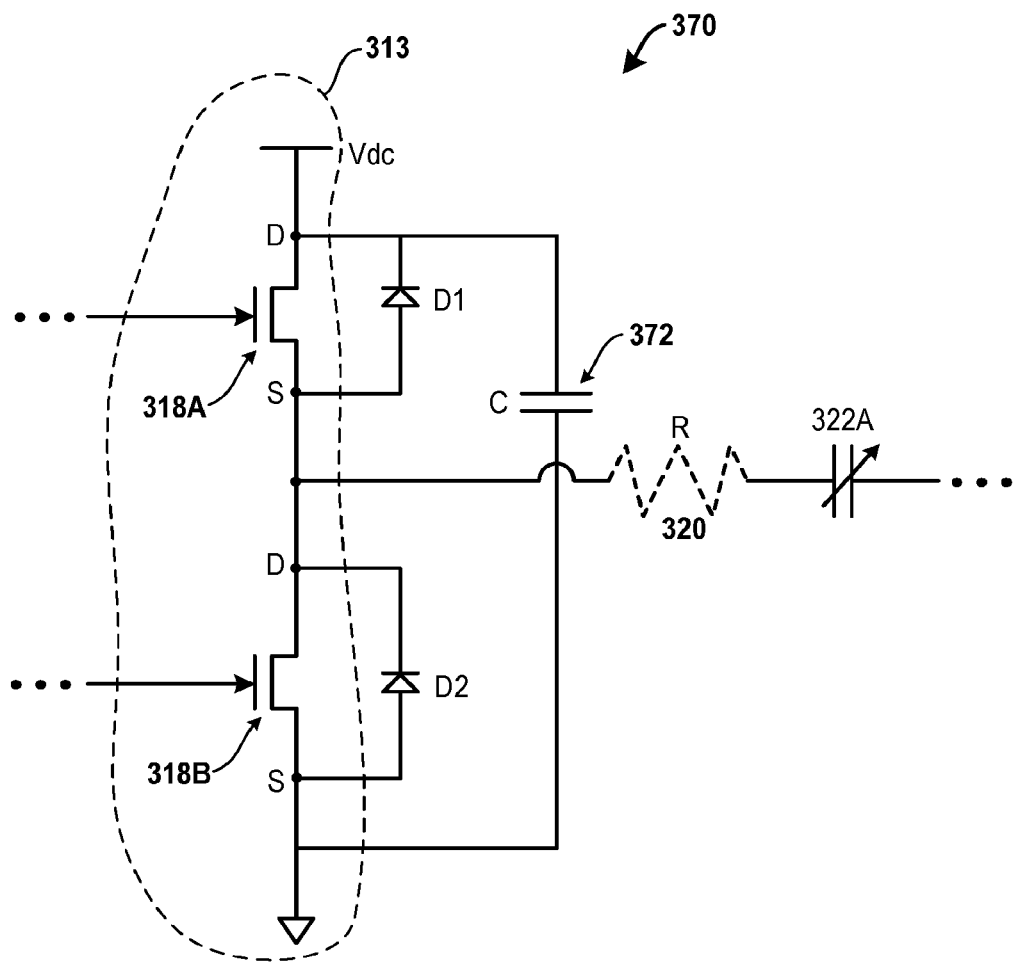
FIG. 3C is a diagram of an embodiment of a system to illustrate diodes are used to limit voltages across transistors of a half-bridge field-effect transistor (FET) circuit of the system of FIGS. 3A and 3B.

FIG. 3C is a diagram of an embodiment of a system 370 to illustrate diodes are used to limit voltages across the FETs 318A and 318B of the half-bridge FET circuit 318 (FIGS.

3A, 3B, & 3D). The system 370 is the same as the system 300 of FIG. 3A or the system 348 of FIG. 3B except that in the system 370 multiple diodes D1 and D2 are used. Moreover, in the system 370, a capacitor 372 is used. The diode D1 is coupled between the drain and source terminals of the FET 318A and the diode D2 is coupled between the drain and source terminals of the FET 318B. Moreover, the capacitor 372 is coupled to the drain terminal D of the FET 318A and to the source terminal S of the FET 318B.

When the FET 318A is turned on and the FET 318B is turned off, voltage across the FET 318A increases and continues to go positive until the voltage is limited by the diode D1. Similarly, when the FET 318A is turned off and the FET 318B is turned on, voltage across the FET 318B increases and continues to go negative until the voltage is limited by the diode D2. As such, the diode D1 reduces chances, such as prevents, of a shoot through across the FET 318A and the diode D2 reduces chances, such as prevents, of a shoot through of voltage across the FET 318B.

In case there is a delay in the turning off and on of the FETs 318A and 318B, current in the DC rail 313 passes via the capacitor 372 to reduce chances of the current flowing from the output O1 to the electrode 106 via the capacitor 322A. For example, during the time period in which both the FETs 318A and 318B are on or off, current flows from the DC rail 313 to the capacitor 372. This reduces chances of the current flowing to the electrode 106.

Figure 3D:
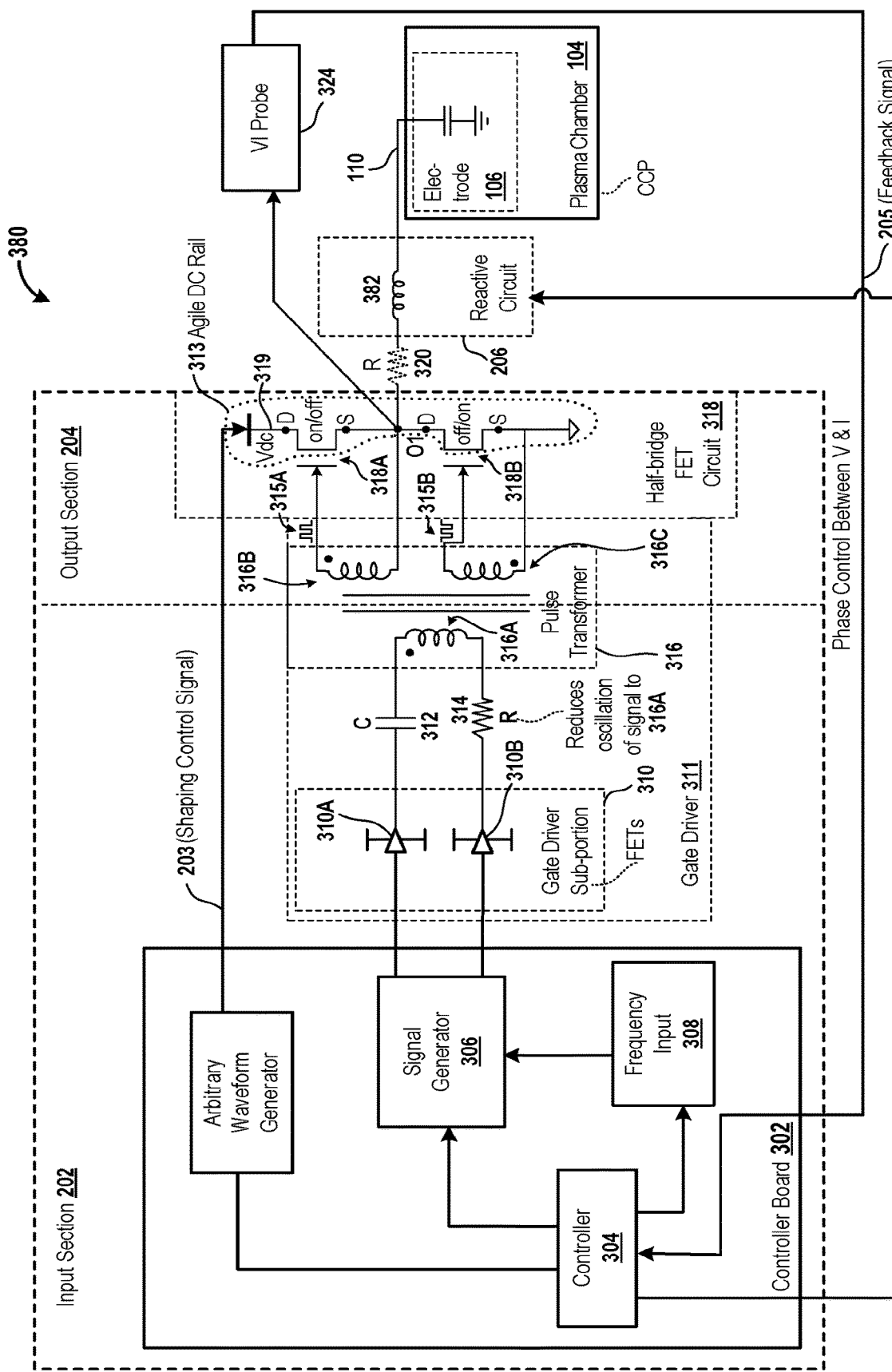
FIG. 3D is a diagram of an embodiment of a system to illustrate use of the reactive circuit having an inductor coupled to a capacitively coupled plasma (CCP) chamber.

It should be noted that the diodes illustrated in the embodiment of FIG. 3C can be coupled to the corresponding FETs in any of the embodiments of FIGS. 3A, 3B, and 3D.

FIG. 3D is a diagram of an embodiment of a system 380 to illustrate the reactive circuit 206 having an inductor 382 that is coupled to the plasma chamber 104 when the plasma chamber 104 is a CCP plasma chamber. The system 380 is the same as the system 300 of FIG. 3A, except that in the system 380, the plasma chamber 104 is a CCP plasma chamber. When the plasma chamber 104 is a CCP plasma chamber, the reactive circuit 206 includes an inductor 382 instead of the capacitor 322A. The inductor 382 is coupled to the output O1 and to the electrode 106, such as an upper electrode or a lower electrode of a chuck of the CCP chamber.

In some embodiments, instead of the inductor 382, a variable inductor is used. An inductance of the variable inductor is controlled by the controller 304 in the same manner that the capacitance of the capacitor 322A is controlled by the controller 304. In various embodiments, the reactive circuit 206 includes multiple inductors that are coupled to each other in series, or in parallel, or a combination thereof. Some of the inductors are variable and the remaining of the inductors are fixed. As another example, all the inductors of the reactive circuit 206 are variable or fixed.

Figure 4A:
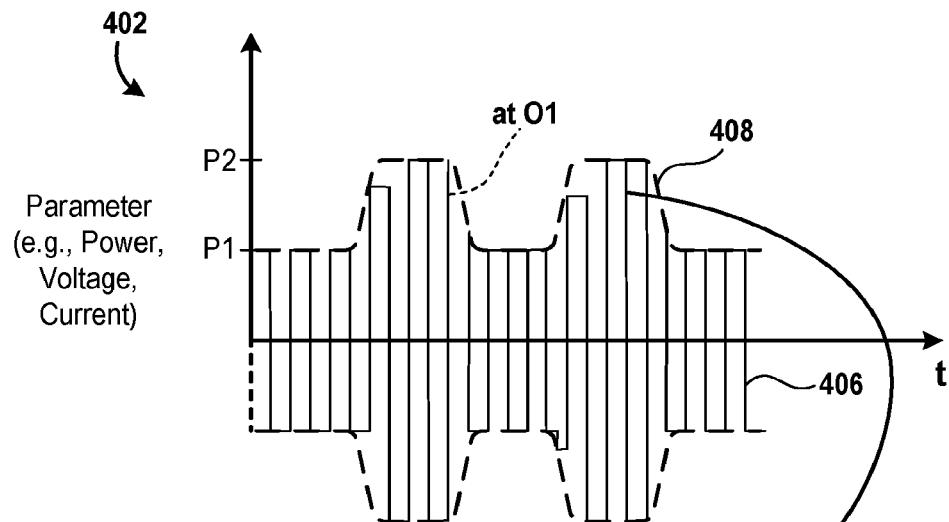
FIG. 4A is an embodiment of a graph to illustrate a shaping of an envelope of an amplified square waveform generated at an output of the half-bridge FET circuit of the system of FIGS. 3A and 3B.

FIG. 4A is an embodiment of a graph 402 to illustrate a shaping of an envelope 408 of an amplified square waveform 406, which is an example of the amplified square waveform generated at the output O1 of the half-bridge FET circuit 318 (FIGS. 3A and 3B). The graph 402 plots the parameter of the amplified square waveform 406 versus time t. As shown, the amplified square waveform 406 transitions between multiple parameter levels, such as a low level P1 and a high level P2. The low level P1 has lower peak-to-peak magnitudes than peak-to-peak magnitudes of the high level P2.

It should be noted that in some embodiments, instead of the amplified square waveform 406 having the shaped envelope 408, another amplified square waveform having the shaped envelope of a different shape, such as an arbitrary shape, a multi-level pulse shape, a continuous wave shape, or a triangular shape, is generated.

Figure 4B:
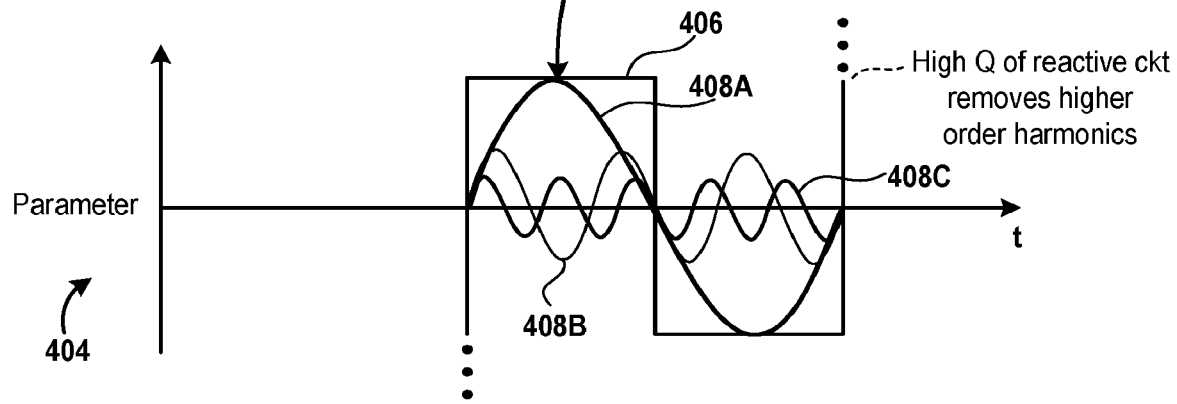
FIG. 4B is an embodiment of a graph to illustrate a removal of higher-order harmonics from the amplified square waveform.

FIG. 4B is an embodiment of a graph 404 to illustrate a removal of the higher-order harmonics of the amplified square waveform 406 that is generated at the output O1 of the half-bridge FET circuit 318 (FIGS. 3A and 3B). The graph 404 plots the parameter of the amplified square waveform 406 versus the time t. The amplified square waveform 406 is made up of a waveform 408A having a fundamental frequency and a large number of waveforms, such as a waveform 408B and 408C, having higher-order harmonic frequencies. The waveform 408B has a second order harmonic frequency and the waveform 408C has a third order harmonic frequency. The high-quality factor of the reactive circuit 206 (FIGS. 3A and 3B) facilitates removal of the higher-order harmonics from the amplified square waveform 406 to provide the waveform 408A at the output of the reactive circuit 206. The waveform 408A is supplied to the electrode 106 from the reactive circuit 206. The waveform 408A is an example of the shaped sinusoidal waveform that is output from the reactive circuit 206.

Figure 5A:
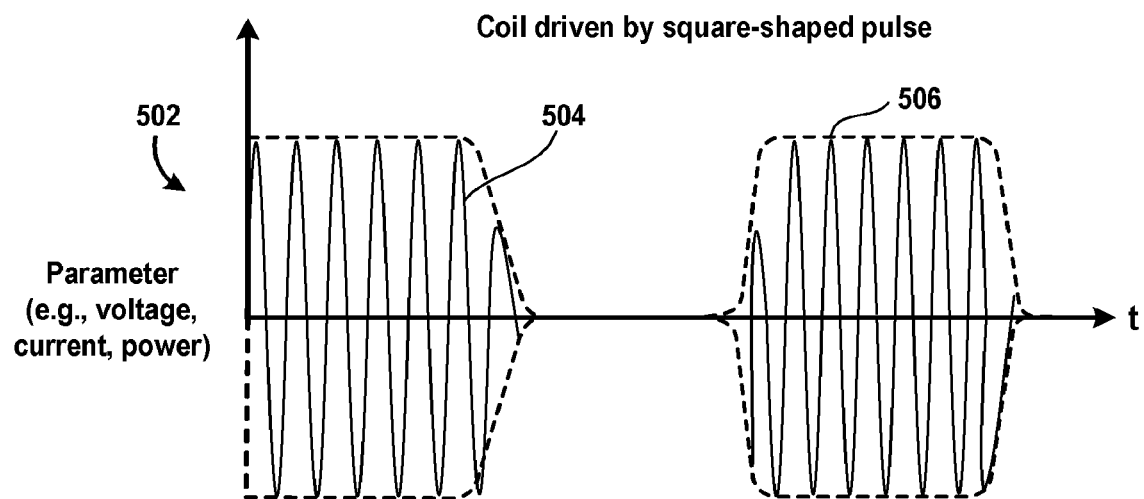
FIG. 5A is an embodiment of a graph to illustrate a pulse-shaped sinusoidal waveform that is output from a reactive circuit of the system of FIGS. 3A and 3B.

FIG. 5A is an embodiment of the graph 502 to illustrate a shaped sinusoidal waveform 504 having an envelope 506, which is an example of the shaped envelope. The shaped sinusoidal waveform 504 is an example of the shaped sinusoidal waveform that is output from the reactive circuit 206 (FIG. 2). The graph 502 plots the parameter of the shaped sinusoidal waveform 504 versus the time t. The envelope 506 is a peak-to-peak parameter, such as a peak-to-peak voltage, and has a square-shape, such as a pulse shape.

Figure 5B:
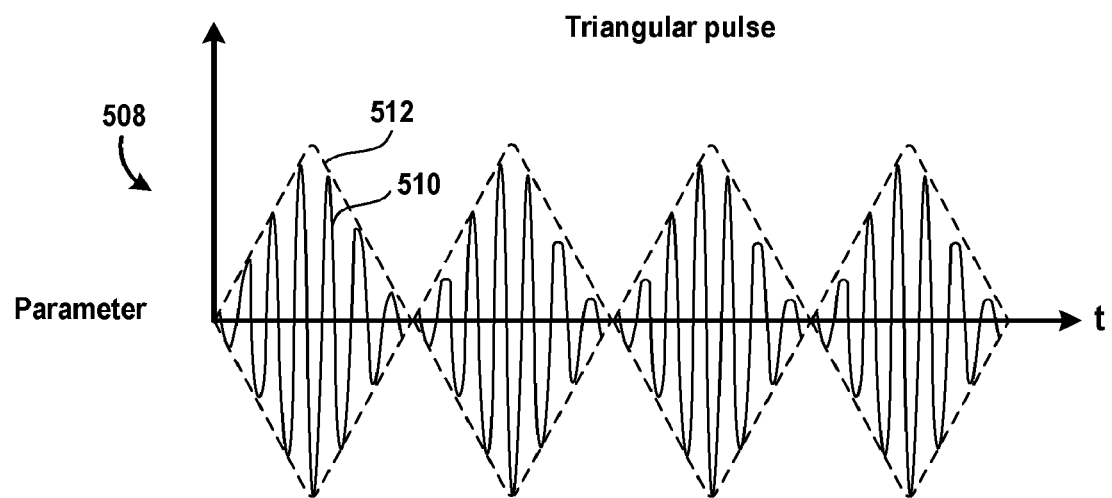
FIG. 5B is an embodiment of a graph to illustrate a triangular-shaped sinusoidal waveform that is output from the reactive circuit.

FIG. 5B is an embodiment of the graph 508 to illustrate a triangular-shaped sinusoidal waveform 510. The triangular-shaped sinusoidal waveform 510 is an example of the shaped sinusoidal waveform that is output from the reactive circuit 206 (FIG. 2). The graph 508 plots the parameter of the triangular-shaped sinusoidal waveform 510 versus the time t. The shaped sinusoidal waveform 510 has a triangular envelope 512, which is an example of the shaped envelope.

In some embodiments, a shaped sinusoidal waveform that is output from the reactive circuit 206 (FIG. 2) has an envelope that is a sawtooth waveform.

Figure 5C:
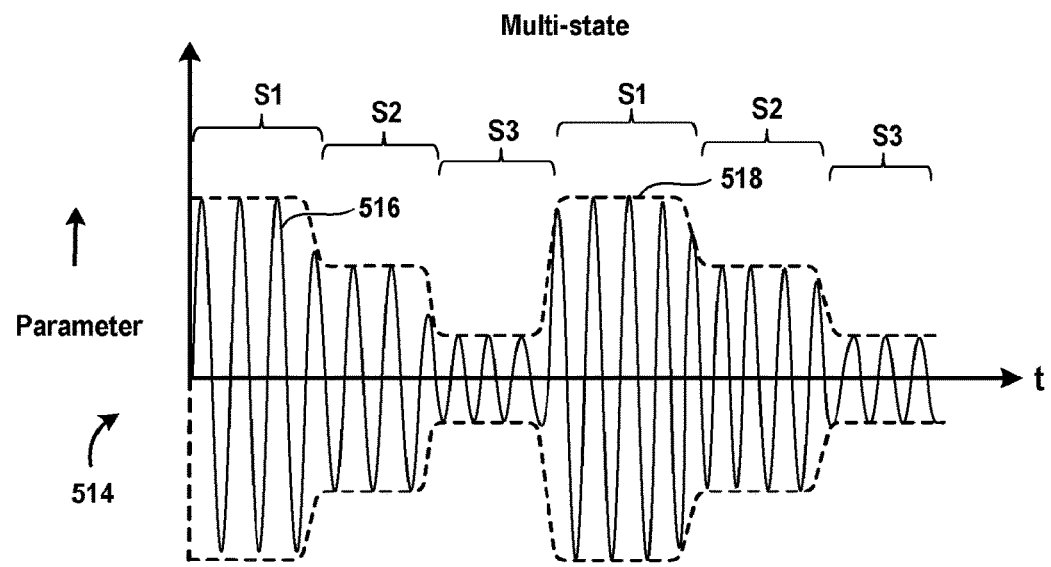
FIG. 5C is an embodiment of a graph to illustrate a multi-state pulsed sinusoidal waveform that is output from the reactive circuit.

FIG. 5C is an embodiment of the graph 514 to illustrate a multi-state sinusoidal waveform 516. The graph 514 plots the parameter of the multi-state sinusoidal waveform 516 versus the time t. The shaped sinusoidal waveform 516 is an example of the shaped sinusoidal waveform that is output from the reactive circuit 206 (FIG. 2). The multi-state sinusoidal waveform 516 has an envelope 518 having multiple states S1, S2, and S3. The envelope 518 is an example of the shaped envelope. A peak-to-peak parameter of the multi-state sinusoidal waveform 516 during the state S1 is greater than a peak-to-peak parameter of the multi-state sinusoidal waveform 516 during the state S2. Moreover, the peak-to-peak parameter of the multi-state sinusoidal waveform 516 during the state S2 is greater than a peak-to-peak parameter of the multi-state sinusoidal waveform 516 during the state S3. The states S1, S2, and S3 repeat at a frequency that is lower than the operating frequency of the signal generator 306 (FIGS. 3A and 3B). The shaped sinusoidal waveform 516 has the operating frequency.

In some embodiments, a peak-to-peak parameter of the multi-state sinusoidal waveform 516 during the state S1 is different from, such as less than or greater than, a peak-to-peak parameter of the multi-state sinusoidal waveform 516 during the state S2. Moreover, the peak-to-peak parameter of the multi-state sinusoidal waveform 516 during the state S2 is different from, such as greater than or less than, a peak-to-peak parameter of the multi-state sinusoidal waveform 516 during the state S3. Also, the peak-to-peak parameter of the multi-state sinusoidal waveform 516 during the state S3 is different from, such as greater than or less than, the peak-to-peak parameter of the multi-state sinusoidal waveform 516 during the state S1.

Figure 5D:
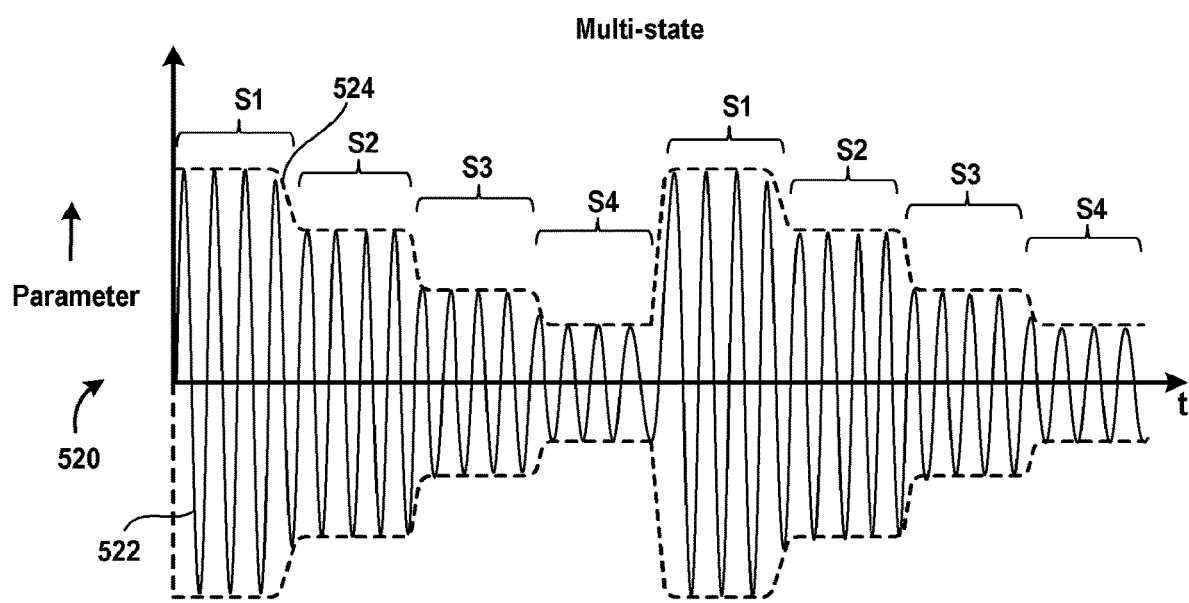
FIG. 5D is an embodiment of a graph to illustrate another multi-state pulsed sinusoidal waveform that is output from the reactive circuit.

FIG. 5D is an embodiment of a graph 520 illustrate a multi-state sinusoidal waveform 522. The graph 520 plots the parameter of the multi-state sinusoidal waveform 522 versus the time t. The shaped sinusoidal waveform 522 is an example of the shaped sinusoidal waveform that is output from the reactive circuit 206 (FIG. 2). The multi-state sinusoidal waveform 522 has an envelope 524 having multiple states S1, S2, S3, and S4. The envelope 524 is an example of the shaped envelope. A peak-to-peak parameter of the multi-state sinusoidal waveform 522 during the state S1 is greater than a peak-to-peak parameter of the multi-state sinusoidal waveform 522 during the state S2. Moreover, the peak-to-peak parameter of the multi-state sinusoidal waveform 522 during the state S2 is greater than a peak-to-peak parameter of the multi-state sinusoidal waveform 522 during the state S3. Furthermore, the peak-to-peak parameter of the multi-state sinusoidal waveform 522 during the state S3 is greater than a peak-to-peak parameter of the multi-state sinusoidal waveform 522 during the state S4. As illustrated in the FIG. 5D, the states S1, S2, S3, and S4 repeat at a frequency that is lower than the operating frequency of the signal generator 306 (FIGS. 3A and 3B). The shaped sinusoidal waveform 522 has the operating frequency.

In some embodiments, a peak-to-peak parameter of the multi-state sinusoidal waveform 522 during the state S1 is different from, such as less than or greater than, a peak-to-peak parameter of the multi-state sinusoidal waveform 522 during the state S2. Moreover, the peak-to-peak parameter of the multi-state sinusoidal waveform 522 during the state S2 is different from, such as greater than or less than, a peak-to-peak parameter of the multi-state sinusoidal waveform 522 during the state S3. Also, the peak-to-peak parameter of the multi-state sinusoidal waveform 522 during the state S3 is different from, such as greater than or less than, a peak-to-peak parameter of the multi-state sinusoidal waveform 522 during the state S4. The peak-to-peak parameter of the multi-state sinusoidal waveform 522 during the state S4 is different from, such as greater than or less than, the peak-to-peak parameter of the multi-state sinusoidal waveform 522 during the state S1.

Figure 5E:
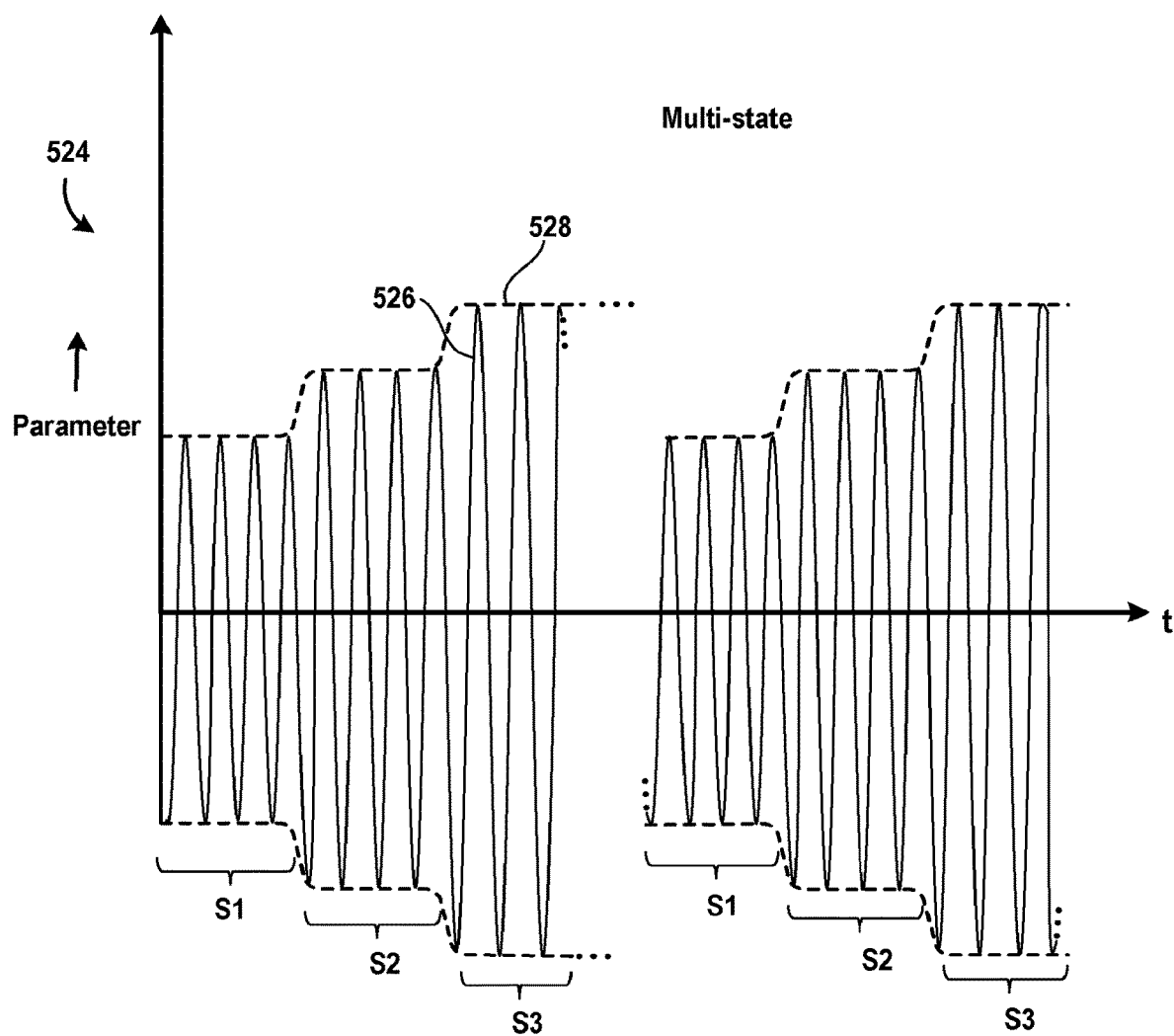
FIG. 5E is an embodiment of a graph to illustrate still another multi-state pulsed sinusoidal waveform that is output from the reactive circuit.

FIG. 5E is an embodiment of the graph 524 to illustrate multi-state pulsing of a shaped sinusoidal waveform 526. The graph 524 plots the parameter of the multi-state sinusoidal waveform 526 versus the time t. The shaped sinusoidal waveform 526 is an example of the shaped sinusoidal waveform that is output from the reactive circuit 206 (FIG. 2). The shaped sinusoidal waveform 526 has a multi-state envelope 528 that alternates among states S1 through Sn, where n is an integer greater than one. For example, the multi-state envelope 528 transitions from the state S1 to the state S2. The multi-state envelope 528 further transitions from the state S2 to the state S3, and so on, until the state Sn is reached. As an example, a value of n ranges from 4 to 1000. To illustrate, the shaped sinusoidal waveform 526 has 100 states. The states S1 through Sn repeat periodically. The envelope 528 is an example of the shaped envelope.

It should be noted that a parameter level, such as a peak-to-peak parameter value, during one of the states S1 through Sn is different from a parameter level during another one of the states S1 through Sn. For example, the peak-to-peak parameter values during the states S1 through S5 are different from each other. As illustrated in the FIG. 5E, the states S1 through Sn repeat at a frequency that is lower than the operating frequency of the signal generator 306 (FIGS. 3A and 3B). The shaped sinusoidal waveform 526 has the operating frequency.

Figure 5F:
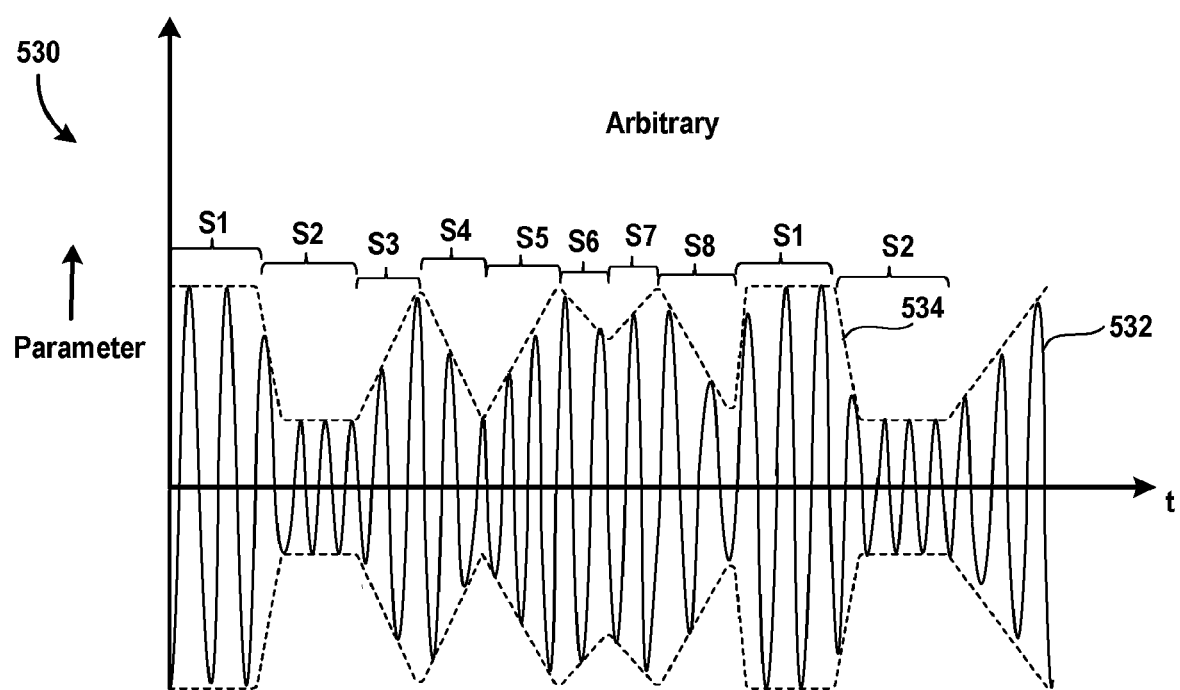
FIG. 5F is an embodiment of a graph to illustrate an arbitrary-shaped sinusoidal waveform that is output from the reactive circuit.

FIG. 5F is an embodiment of a graph 530 that illustrates an envelope 534 of a shaped sinusoidal waveform 532. The envelope 534 is an example of the shaped envelope. The shaped sinusoidal waveform 532 is an example of the shaped sinusoidal waveform that is output from the reactive circuit 206 (FIG. 2). The graph 530 plots the parameter of the shaped sinusoidal waveform 532 versus the time t.

The shaped sinusoidal waveform 532 has the envelope 534 that is of an arbitrary shape. For example, the envelope 534 has multiple states S1 through S8 that repeat periodically. During each state S1 and S2, the envelope 534 has a zero slope. Moreover, during the state S3, the envelope 534 has a positive slope, and during the state S4, the envelope 534 has a negative slope. Furthermore, during the state S5, the envelope 534 has a positive slope. During the state S6, the envelope 534 has a negative slope and during the state S7, the envelope 534 has a positive slope. During the state S8, the envelope 534 has a negative slope. As illustrated in the FIG. 5F, the states S1 through S8 repeat at a frequency that is lower than the operating frequency of the signal generator 306 (FIGS. 3A and 3B). The shaped sinusoidal waveform 532 has the operating frequency.

It should be noted that in some embodiments, the envelope 532 has different slopes during one or more of the states S1 through S8 than that illustrated in FIG. 5F. For example, during the state S4, instead of the negative slope, the shaped sinusoidal waveform 532 has a positive slope or a zero slope. It is another example, during the state S5, instead of the positive slope, the shaped sinusoidal waveform 532 has a negative slope or a zero slope.

Figure 5G:
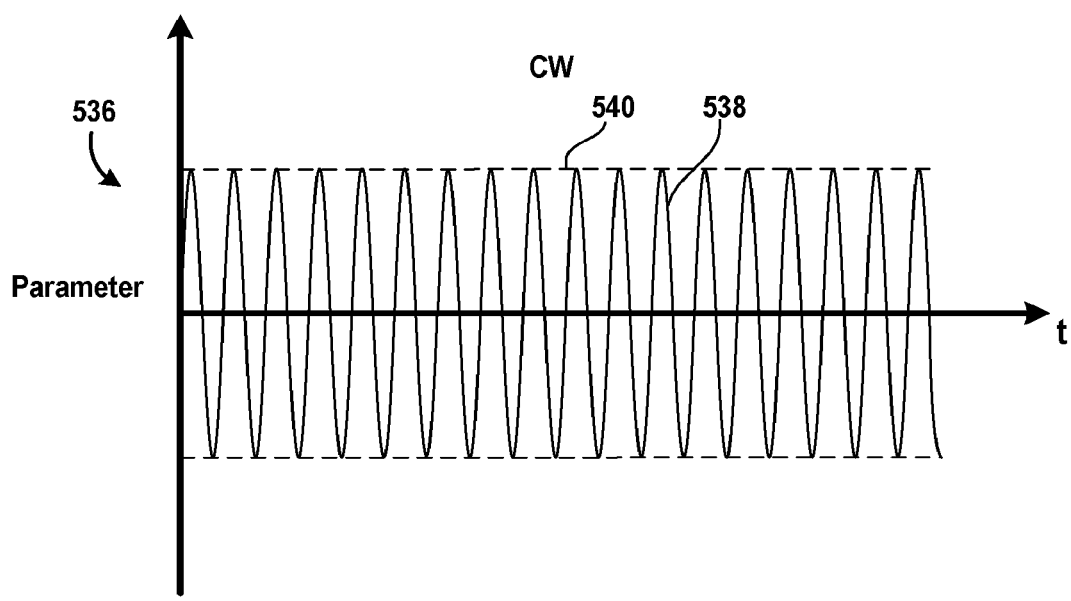
FIG. 5G is an embodiment of a graph to illustrate a continuous wave sinusoidal waveform that is output from the reactive circuit.

FIG. 5G is an embodiment of the graph 536 to illustrate a shaped sinusoidal waveform 538 having a continuous waveform. For example, the shaped sinusoidal waveform 538 has an envelope 540 that is continuous and is not pulsed from one parameter level to another parameter level. To further illustrate, a peak-to-peak parameter of the shaped sinusoidal waveform 538 is constant or lies between the constant and a pre-determined variance of the constant. The envelope 540 is an example of the shaped envelope. The graph 536 plots the parameter of the shaped sinusoidal waveform 538 versus the time t. The shaped sinusoidal waveform 538 is an example of the shaped sinusoidal waveform that is output from the reactive circuit 206 (FIG. 2).

Figure 5H:
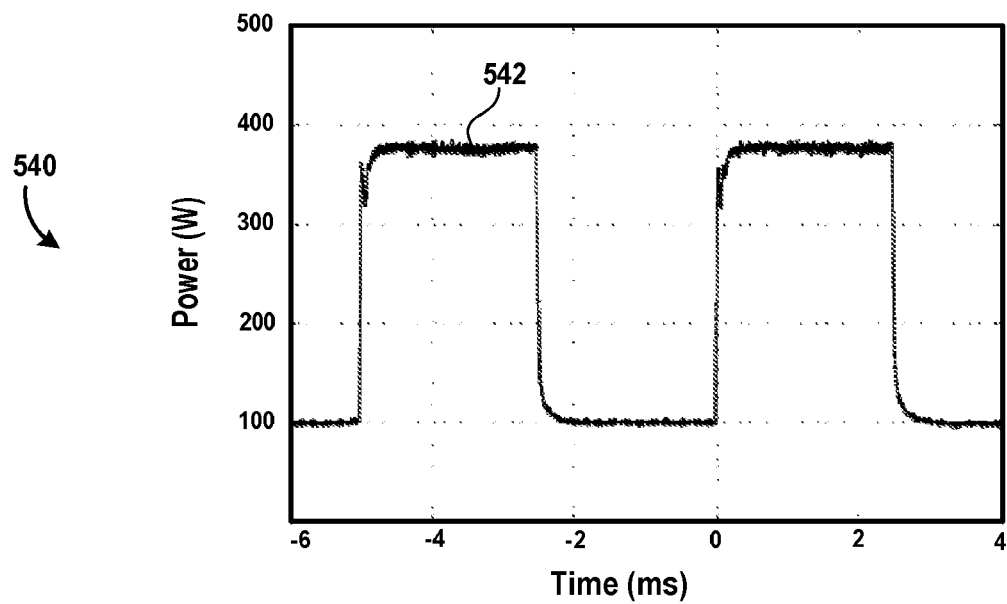
FIG. 5H is an embodiment of a graph to illustrate an envelope of a pulse-shaped sinusoidal waveform that is output from a reactive circuit.

FIG. 5H is an embodiment of a graph 540 to illustrate an envelope 542 of a pulse-shaped sinusoidal waveform that is output from the reactive circuit 206 (FIG. 2). The graph 540 plots power of the pulse-shaped sinusoidal waveform versus the time t, measured in milliseconds. The pulse-shaped sinusoidal waveform having the envelope 542 is similar to the sinusoidal waveform 504 of FIG. 5A. The envelope 542 has a shape of a pulse and transitions between a low state and a high state. The low state has power levels, such as one or more power amounts, lower than power levels of the high state. For example, all power amounts of the high state range between 350 and 400 watts and all power amounts of the low state range between 80 watts and 120 watts.

Figure 5I:
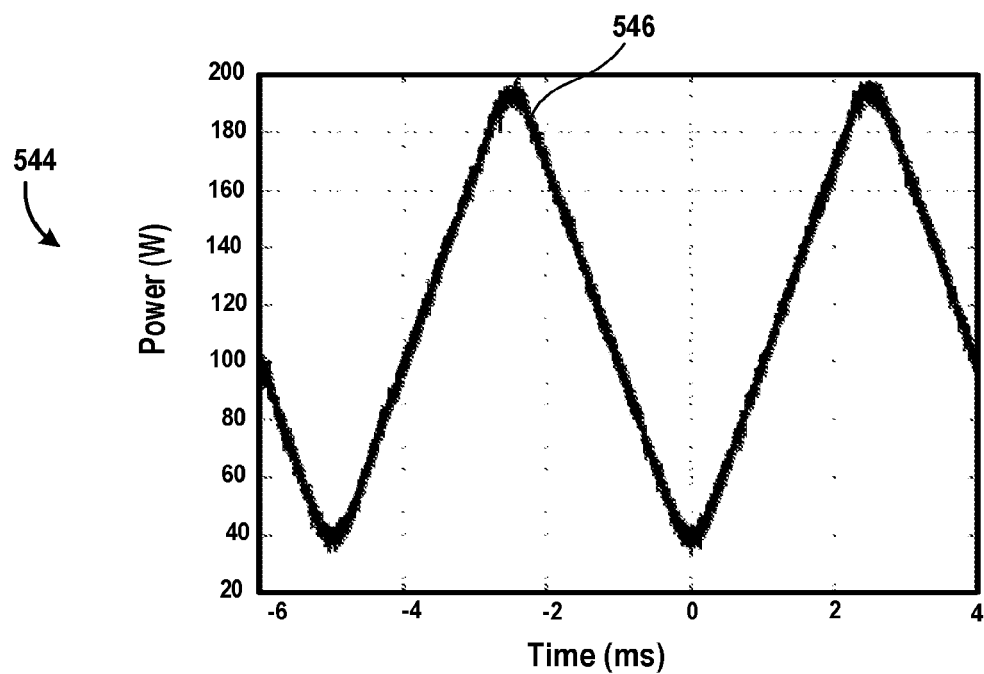
FIG. 5I is an embodiment of a graph to illustrate an envelope of a triangular-shaped sinusoidal waveform that is output from the reactive circuit.

FIG. 5I is an embodiment of a graph 544 to illustrate an envelope 546 of a shaped sinusoidal waveform that is output from the reactive circuit 206 (FIG. 2). The graph 544 plots power of the shaped sinusoidal waveform versus the time t, measured in milliseconds. The shaped sinusoidal waveform having the envelope 546 is similar to the sinusoidal waveform 510 of FIG. 5B. The envelope 546 is triangular-shaped. For example, the envelope 546 has a positive slope immediately followed by a negative slope. The negative slope is immediately followed by another positive slope, which is followed by another negative slope.

FIG. 6A is an embodiment of the graph 600, which is a resonance plot to illustrate a change in a magnitude of a ratio of current and voltage associated with the electrode 106 (FIG. 1) with a change in the operating frequency of the signal generator 306 (FIGS. 3A and 3B). The graph 600 is generated when no plasma is lit within the plasma chamber 104 (FIG. 1). The current and voltage are measured at the electrode 106. The graph 600 plots the change in the magnitude of the ratio of the current and voltage versus the operating frequency of the signal generator 306. As evident from the graph 600, the quality factor Q of the electrode 106 is high when plasma is not lit within the plasma chamber 104.

FIG. 6B is an embodiment of a graph 602, which is a resonance plot to illustrate a change in voltage, current, and power at the electrode 106 (FIG. 1) with the change in the operating frequency of the signal generator 306 (FIGS. 3A and 3B). The graph 602 plots power, voltage, and current measured at the electrode 106 versus the operating frequency of the signal generator 306. The graph plots the power, voltage and current when plasma is lit within the plasma chamber 104 (FIG. 1). The operating frequency of the signal generator 306 is controlled by the controller 304 (FIGS. 3A and 3B) to control the power, voltage, and current measured at the electrode 106. As evident from the graph 602, the quality factor Q at the electrode 106 decreases compared to the quality factor shown in the graph 600 because of consumption of energy by plasma within the plasma chamber 104.

Figure 7B:
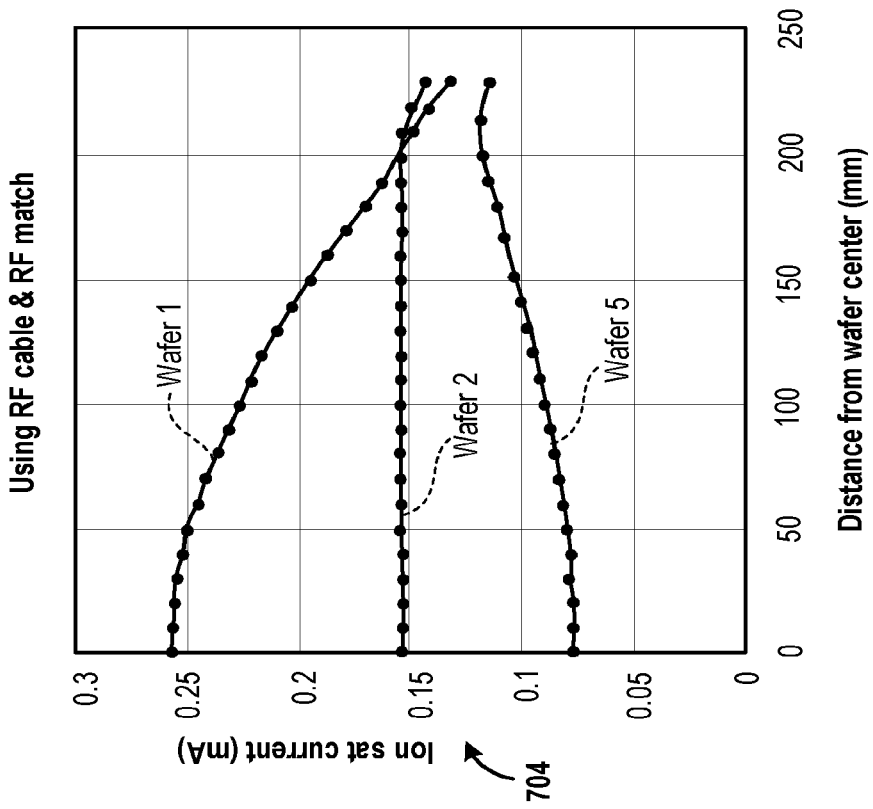
FIG. 7B is an embodiment of a graph to illustrate an ion saturation current when a 50 Ohm RF generator, the RF match and the RF cable are used.
Figure 7A:
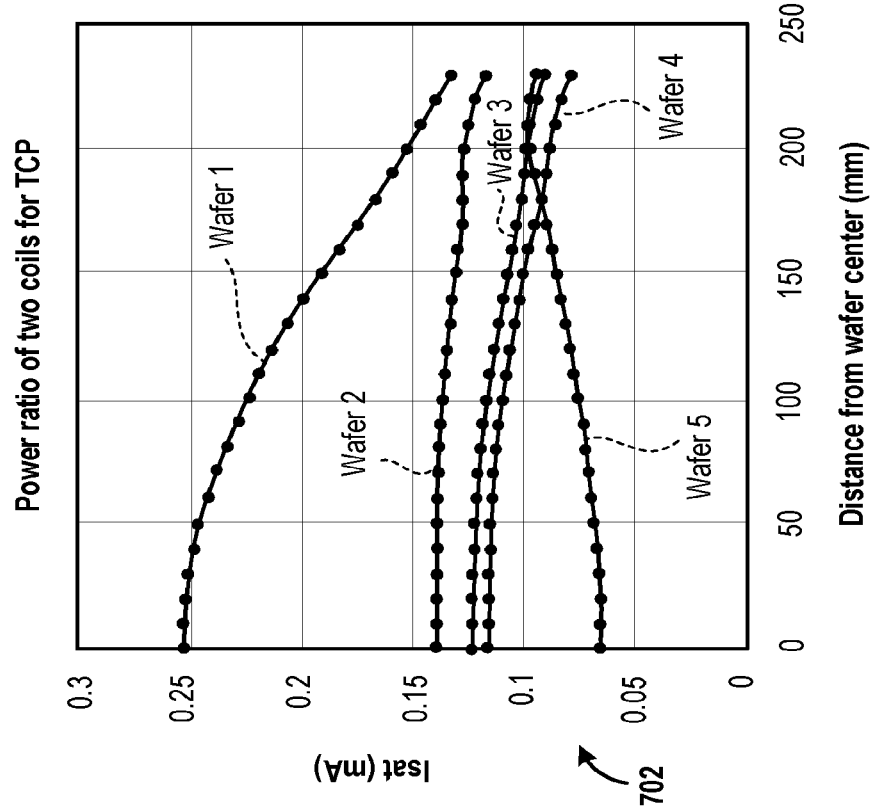
FIG. 7A is an embodiment of a graph to illustrate an ion saturation current across a surface of a wafer when the system of FIG. 1 is used.

FIG. 7A is an embodiment of the graph 702 to illustrate an ion saturation current Isat, measured in milliamperes (mA), across a surface of a wafer. The graph 702 plots the ion saturation current versus distance from a wafer center for different wafers processed in the plasma chamber 104 (FIG. 1) that is coupled to the matchless plasma source 102 (FIG. 1) without coupling the RF match and the RF cable between the matchless plasma source 102 and the plasma chamber 104. The distance from the wafer center is measured in millimeters (mm). The different power ratio effect on radial ion saturation current is illustrated in FIG. 7A.

Figure 19:
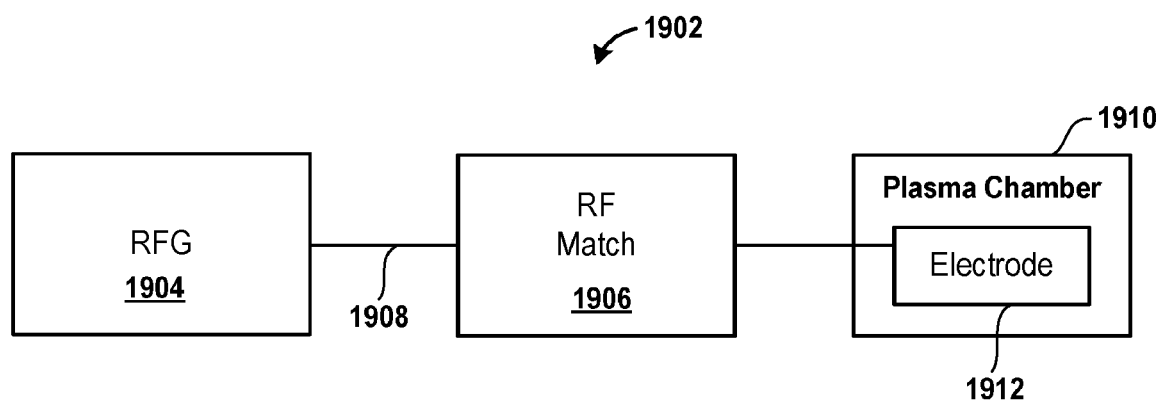
FIG. 19 is a block diagram of an embodiment of a system to illustrate the RF cable and the RF match.

FIG. 7B is an embodiment of the graph 704 to illustrate an ion saturation current when the RF match and the RF cable are used in a system 1902, illustrated below in FIG. 19. The system 1902 includes an RF cable 1908 and RF match 1906 (FIG. 19). The graph 704 plots the ion saturation current versus the distance from the wafer center. The different power ratio effect on radial ion saturation current is shown in the graph 704. It should be noted that, there is similarity in the ion saturation current across the surfaces of the wafers when the system 100 (FIG. 1) or the system 1302 is used.

Figure 8:
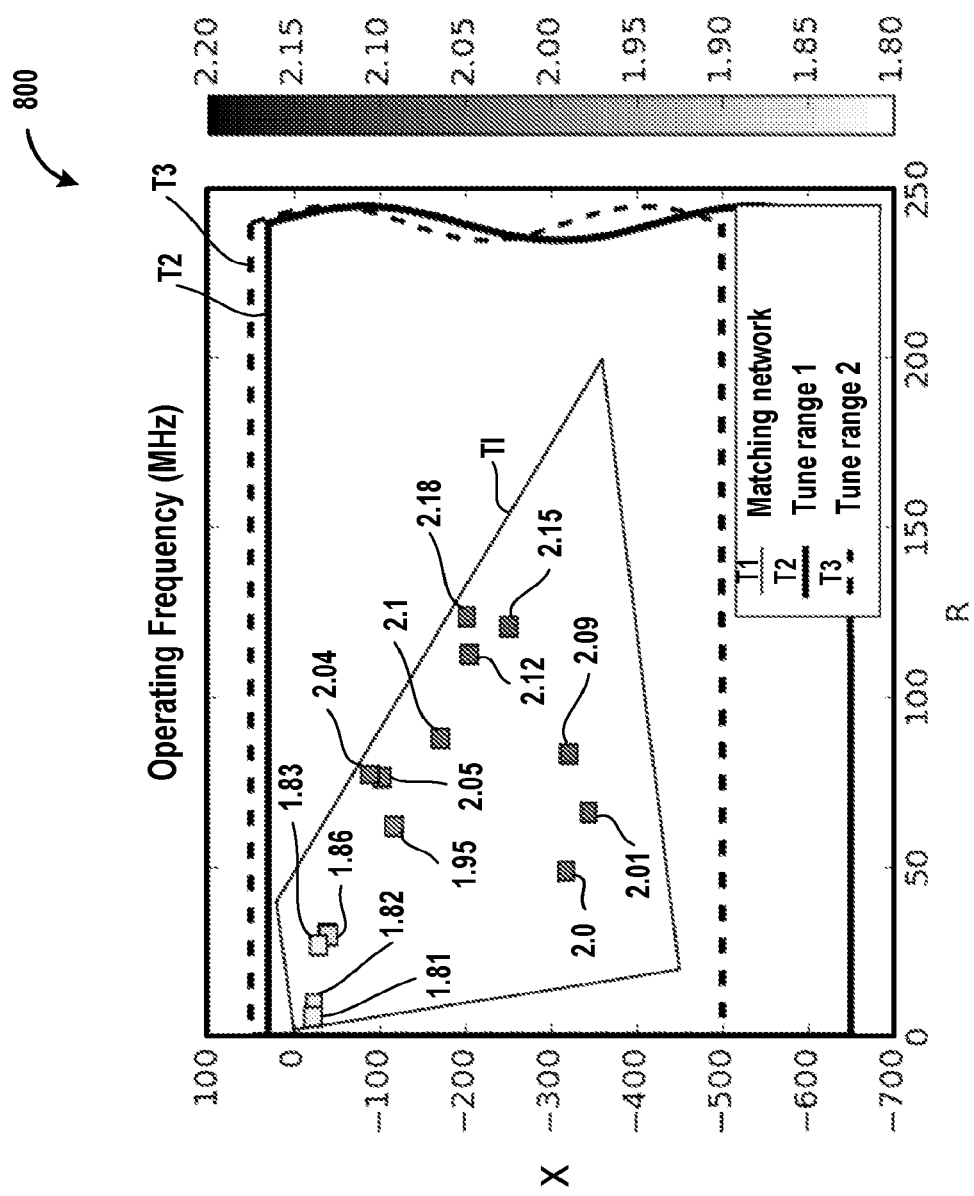
FIG. 8 is an embodiment of a graph to illustrate that use of the system of FIG. 1 facilitates achieving multiple tune ranges of plasma impedance within the plasma chamber and the tune ranges are similar to those achieved by use of the 50 Ohm RF generator, RF match and the RF cable.

FIG. 8 is an embodiment of a graph 800 to illustrate that use of the system 100 of FIG. 1 facilitates achieving a similar tuning range of impedances of plasma within the plasma chamber 104 (FIG. 1) compared to that achieved using the RF match. The graph 800 plots a reactance X of plasma within the plasma chamber 104 versus a resistance R of the plasma. The graph 800 includes multiple tuning ranges T1, T2 and T3 having values of resistances and reactances of the plasma, and the tuning ranges T1, T2 and T3 are achieved when the matchless plasma source 102 is coupled to the plasma chamber 104 as illustrated in FIG. 1. All tuning ranges T1, T2 and T3 of resistances and reactances of the plasma are achieved using the system 100 of FIG. 1.

Figure 9A:
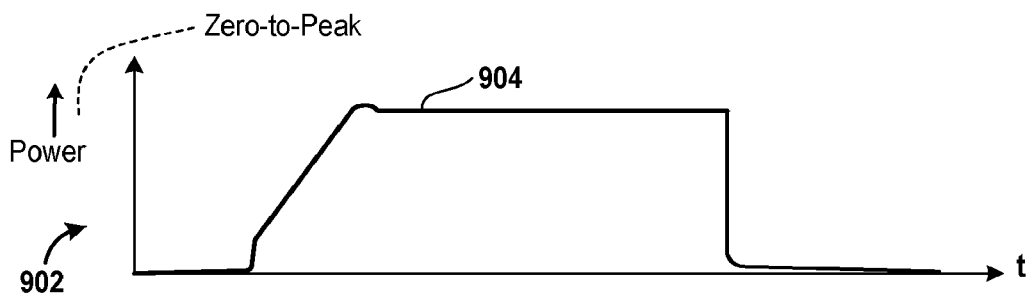
FIG. 9A is an embodiment of a graph to illustrate power that is supplied at the output of the reactive circuit to provide to the electrode.

FIG. 9A is an embodiment of a graph 902 to illustrate power that is supplied at the output of the reactive circuit 206 (FIG. 2) to provide to the electrode 106 (FIG. 2). The power is shaped according to an envelope 904. The graph 902 plots the power versus the time t.

Figure 9B:
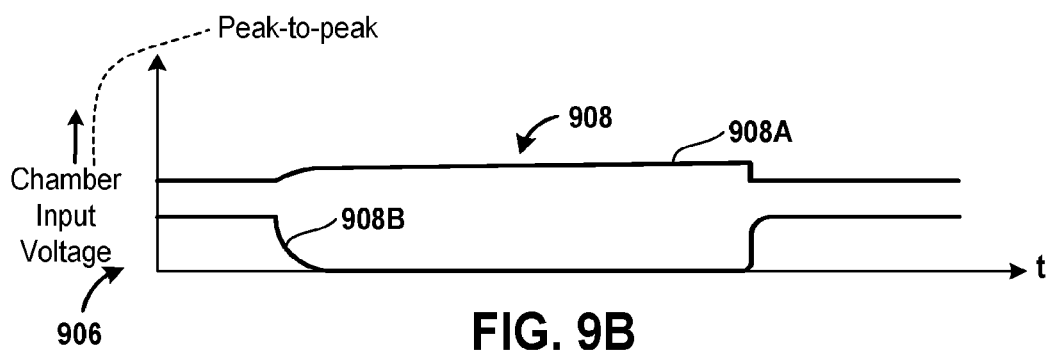
FIG. 9B is an embodiment of a graph to illustrate a voltage of a pulse shaped sinusoidal waveform that is supplied to the electrode versus time.

FIG. 9B is an embodiment of a graph 906 to illustrate a voltage of the shaped sinusoidal waveform that is supplied to the plasma chamber 104 (FIG. 1) versus the time t. The voltage has a pulse-shaped envelope 908 further having an upper boundary 908A and a lower boundary 908B. The boundaries 908A and 908B define a peak-to-peak voltage.

Figure 9C:
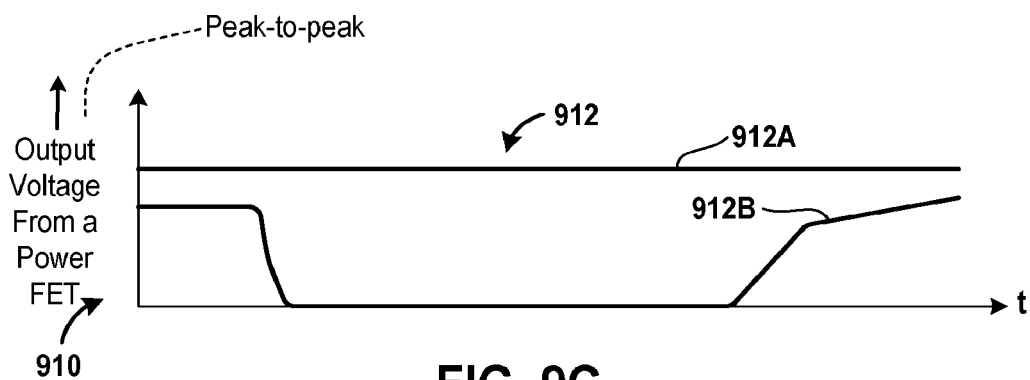
FIG. 9C is an embodiment of a graph to illustrate an output voltage that is output from a power FET of the system of FIGS. 3A and 3B.

FIG. 9C is an embodiment of the graph 910 to illustrate a voltage that is provided from a power FET, such as the FET 318A or the FET 318B (FIGS. 3A, 3B, & 3D), at the output O1 (FIGS. 3A & 3B). The voltage at the output O1 has an envelope 912 further having an upper boundary 912A and a lower boundary 912B. The boundaries 912A and 912B define a peak-to-peak voltage.

Figure 9D:
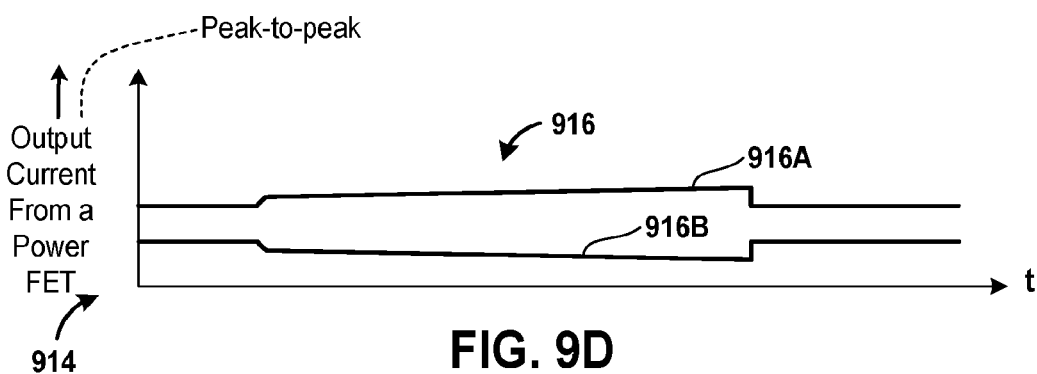
FIG. 9D is an embodiment of a graph to illustrate an output current that is output from the power FET.

FIG. 9D is an embodiment of a graph 914 to illustrate a current that is provided from the power FET (FIGS. 3A, 3B, & 3D) at the output O1. The current at the output O1 has an envelope 916 further having an upper boundary 916A and a lower boundary 916B. The boundaries 916A and 916B define a peak-to-peak current.

FIG. 10A is an embodiment of the graph 1000 illustrate a plot 1002 of the operating frequency of the signal generator 306 (FIGS. 3A and 3B) versus the time t, measured in milliseconds (ms). The operating frequency is tuned by the controller 304 (FIGS. 3A, 3B, & 3D) in less than a predetermined time period, such as in less than or equal to 50 microseconds (μs). For example, any change in the operating frequency of the signal generator 306 by the controller 304 is propagated via the gate driver 311, the half-bridge FET circuit 318, and the reactive circuit 206 (FIGS. 3A, 3B, & 3D) to the electrode 106 in less than or equal to 50 microseconds. The predetermined time period facilitates achieving a plasma impedance of the plasma within the plasma chamber 104. Another example of the pre-determined time period includes 100 microseconds. For example, the operating frequency is tuned in a time period between 10 microseconds and 100 microseconds. Yet another example of the pre-determined time period includes 70 microseconds. For example, the operating frequency is tuned in a time period between 20 microseconds and 70 microseconds. Self-regulation of the signal generator 306 occurs when the operating frequency is tuned.

FIG. 10B is an embodiment of a graph 1004 to illustrate that a voltage signal 1006B and a current signal 1006A measured at the output O1 of the half-bridge FET circuit 318 (FIGS. 3A, 3B, & 3D) are in phase during a first time period to achieve a level of power for supply to the electrode 106. The graph 1004 plots the current signal 1006A and the voltage signal 1006B versus the time t. As evident from the graph 1004, at a time of 0.95 milliseconds, both the current signal 1006A and the voltage signal 1006B are in phase.

FIG. 10C is an embodiment of a graph 1008 to illustrate that the voltage signal 1006B and the current signal 1006A are in phase during a second time period to achieve the level of power for supply to the electrode 106. The graph 1008 plots the current signal 1006A and the voltage signal 1006B versus the time t. As evident from the graph 1008, at a time of about 1 milliseconds, both the current signal 1006A and the voltage signal 1006B are in phase.

FIG. 10D is an embodiment of a graph 1010 to illustrate that the voltage signal 1006B and the current signal 1006A are in phase during a third time period to achieve the level of power for supply to the electrode 106. The graph 1010 plots the current signal 1006A and the voltage signal 1006B versus the time t. As evident from the graph 1010, at a time of 1.05 milliseconds, both the current signal 1006A and the voltage signal 1006B are in phase. Hence, it should be noted that during the first second and third time periods, the current signal 1006A is in phase with the voltage signal 1006B to achieve the level of power during the first, second, and third time periods.

FIG. 11A is a diagram of an embodiment of a system 1100 to illustrate a tree 1101 of FETs 1102A, 1102B, 1102C, 1102D, 1102E, 1102F, 1102G, 1102H, 1102I, 1102J, 1102K, 1102L, 1102M, 1102N, 11020, and 1102P, and of transformers 1106A, 1106B, 1106C, 1106D, 1106E, 1106F, and 1106G.

The system 1100 includes the tree 1101, the capacitor 322A, and a plasma load. The plasma load includes the electrode 106 and plasma when lit. The tree 1101 includes multiple half-bridge circuits 1104A, 1104B, 1104C, 1104D, 1104E, 1104F, 1104G, and 1104H. The half-bridge circuit 1104A includes the FETs 1102A and 1102B. Similarly, the half-bridge circuit 1104B includes the FETs 1102C and 1102D, the half-bridge circuit 1104C includes the FETs 1102E and 1102F, the half-bridge circuit 1104D includes the FETs 1102G and 1102H, and the half-bridge circuit 1104E includes the FETs 1102I and 1102J. Moreover, the half-bridge circuit 1104F includes the FETs 1102K and 1102L, the half-bridge circuit 1104G includes the FETs 1102M and 1102N, and the half-bridge circuit 1104H includes the FETs 11020 and 1102P.

Gate terminals of the FETs 1102A, 1102C, 1102E, 1102G, 1102I, 1102K, 1102M, and 11020 are coupled to a gate driver 1152A (FIG. 11B), and gate terminals of the FETs 1102B, 1102D, 1102F, 1102H, 1102J, 1102L, 1102N, and 1102P are coupled to another gate driver 1152B (FIG. 11B).

An output OUT1 of the half-bridge circuit 1104A is coupled to a primary winding 1108A of the transformer 1106A. Similarly, an output OUT2 of the half-bridge circuit 1104B is coupled to a primary winding 1108B of the transformer 1106A. Moreover, an output OUT3 of the half-bridge circuit 1104C is coupled to a primary winding 1108C of the transformer 1106B and an output OUT4 of the half-bridge circuit 1104D is coupled to a primary winding 1108D of the transformer 1106B. Also, an output OUT5 of the half-bridge circuit 1104E is coupled to a primary winding 1108E of the transformer 1106C and an output OUT6 of the half-bridge circuit 1104F is coupled to a primary winding 1108F of the transformer 1106C. An output OUT7 of the half-bridge circuit 1104G is coupled to a primary winding 1108G of the transformer 1106D and an output OUT8 of the half-bridge circuit 1104H is coupled to a primary winding 1108H of the transformer 1106D.

Moreover, a secondary winding 1108H of the transformer 1106A is coupled to a primary winding 1108L of the transformer 1106E. Also, a secondary winding 1108I of the transformer 1106B is coupled to a primary winding 1108M of the transformer 1106E. Similarly, a secondary winding 1108J of the transformer 1106C is coupled to a primary winding 1108N of the transformer 1106F. Also, a secondary winding 1108K of the transformer 1106D is coupled to a primary winding 11080 of the transformer 1106F.

A secondary winding 1108P of the transformer 1106E is coupled to a primary winding 1108R of the transformer 1106G. Similarly, a secondary winding 1108Q of the transformer 1106F is coupled to a primary winding 1108S of the transformer 1106G. A secondary winding 1108T of the transformer 1106G is coupled via the output O1 to the capacitor 322A.

It should be noted that when the FETs 1102A, 1102C, 1102E, 1102G, 1102I, 1102K, 1102M, and 11020 are on, the FETs 1102B, 1102D, 1102F, 1102H, 1102J, 1102L, 1102N, and 1102P are off. For example, at a time or during a time interval in which the FETs 1102A, 1102C, 1102E, 1102G, 1102I, 1102K, 1102M, and 11020 are turned on by a signal from the gate driver 1152A, the FETs 1102B, 1102D, 1102F, 1102H, 1102J, 1102L, 1102N, and 1102P are turned off by a signal from the gate driver 1152B. Similarly, at a time or during a time interval in which the FETs 1102B, 1102D, 1102F, 1102H, 1102I, 1102L, 1102N, and 1102P are turned on by a signal from the gate driver 1152B, the FETs 1102A, 1102C, 1102E, 1102G, 1102I, 1102K, 1102M, and 11020 are turned off by a signal from the gate driver 1152A.

When the FETs 1102A, 1102C, 1102E, 1102G, 1102I, 1102K, 1102M, and 11020 are on, positive voltages generated at the outputs OUT1 and OUT2 are transformed via the transformers 1106A, 1106E, and 1106G; positive voltages generated at the outputs OUT3 and OUT4 are transformed via the transformers 1106B, 1106E, and 1106G; positive voltages generated at the outputs OUT5 and OUT6 are transformed via the transformers 1106C, 1106F, and 1106G; and positive voltages generated at the outputs OUT7 and OUT8 are transformed via the transformers 1106D, 1106F, and 1106G to a positive voltage at the output O1.

Similarly, when the FETs 1102B, 1102D, 1102F, 1102H, 1102J, 1102L, 1102N, and 1102P are on, negative voltages generated at the outputs OUT1 and OUT2 are transformed via the transformers 1106A, 1106E, and 1106G; negative voltages generated at the outputs OUT3 and OUT4 are transformed via the transformers 1106B, 1106E, and 1106G; negative voltages generated at the outputs OUT5 and OUT6 are transformed via the transformers 1106C, 1106F, and 1106G; and negative voltages generated at the outputs OUT7 and OUT8 are transformed via the transformers 1106D, 1106F, and 1106G to a negative voltage at the output O1.

It should be noted that voltage signals that are generated by the DC voltage sources Vdc of the tree 1101 are controlled by the controller 304 (FIGS. 3A, 3B, & 3D) in the same manner in which the voltage signal generated by the voltage source Vdc (FIGS. 3A, 3B, & 3D) is controlled. For example, the controller 304 is coupled to the DC voltage sources Vdc of the tree 1101 to control the voltage signals generated by the DC voltage sources.

It should be noted that a pre-determined power level is achieved based on a number of DC voltage sources of the tree 1101, a number of the FETs used in the tree 1101, and a maximum achievable voltage of each voltage source of the tree 1101. For example, the pre-determined power level at the output O1 changes with a change in a number of the half-bridge circuits used in the tree 1101. To illustrate, when the number of the half-bridge circuits increases, a number of the FETs increase. With the increase in the number of FETs, there is an increase in output impedances of the FETs. Also, with the increase in the number of half-bridge circuits in the tree 1101, there is an increase in a number of DC voltage sources. As a result, there is a change in the predetermined power level that is achieved at the output O1.

In various embodiments, a maximum achievable voltage of a DC voltage source coupled a half-bridge circuit of the tree 1101 is different from a maximum achievable voltage of another DC voltage source coupled another half-bridge circuit of the tree 1101. For example, a voltage source having a maximum achievable voltage Vdc1 is coupled to the half-bridge circuit 1104A and another voltage source having a maximum achievable voltage Vdc2 is coupled to the half-bridge circuit 1104B.

In some embodiments, a pre-determined number of the FETs are integrated on a chip. For example, two FETs of a half-bridge circuit are integrated on one chip and two FETs of another half-bridge circuit are integrated on another chip. As another example, four of the FET sub-circuits are integrated on one chip and another set of four FET sub-circuits are integrated on another chip.

FIG. 11B is a diagram of an embodiment of a system 1150 to illustrate use of a tree 1156 of FETs 318A, 318B, 318C, 318D, 318E, and 318F to generate the amplified square waveform at the output O1. The system 1150 is the same as the system 300 of FIG. 3A or the system 348 of FIG. 3B except that in the system 1150, a greater number of FETs are used compared to that used in the system 300 or 348. Moreover, the system 1150 uses a gate driver circuit 1158 instead of the gate driver 311 (FIGS. 3A, 3B, & 3D). The gate driver circuit 1158 is used instead of the gate driver 311 (FIGS. 3A, 3B, & 3D) within the matchless plasma source 102 (FIG. 1). Moreover, instead of the half-bridge FET circuit 318 (FIGS. 3A, 3B, & 3D), the tree 1156 is used within the matchless plasma source 102.

The system 1150 includes the gate driver circuit 1158, the tree 1156, the capacitor 322A, and the electrode 106. The gate driver circuit 1158 includes the gate driver 1152A and the gate driver 1152B. The gate driver 1152B acts as a NOT gate. Inputs of the gate drivers 1152A and 1152B are coupled to the signal generator 306 (FIGS. 3A, 3B, & 3D). Moreover, an output of the gate driver 1152A is coupled to gate terminal of the FETs 318A through 318C. Also, a supply voltage terminal of the gate driver 1152A is coupled to the output O1. Similarly, an output of the gate driver 1152B is coupled to gate terminal of the FETs 318D through 318F and a supply voltage terminal of the gate driver 1152B is coupled to the ground potential.

The drain terminal D of the FET 318A is coupled to a DC voltage source 1154A, the drain terminal D of the FET 318B is coupled to another DC voltage source 1154B and a drain terminal of the FET 318C is coupled to yet another DC voltage source 1154C. A source terminal of each of the FETs 318A, 318B, and 318C is coupled to the output O1. Moreover, a source terminal of each of the FETs 318D, 318E, and 318F is coupled to the ground potential. A drain terminal of each of the FETs 318D, 318E, and 318F is coupled to the output O1.

It should be noted that the FETs 318A and 318F form a half-bridge circuit. Similarly, the FETs 318B and 318E form another half-bridge circuit. Also, the FETs 318C and 318D form yet another half-bridge circuit.

The square wave signal that is generated by the signal generator 306 is received by the gate driver 1152A and amplified to generate a gate drive signal 1160A. Similarly, the square wave signal that is generated by the signal generator 306 is received by the gate driver 1152B and amplified to generate a gate drive signal 1160B, which is reversely pulsed compared to the gate drive signal 1160A. For example, during a time or a time interval in which the gate drive signal 1160A has a high level, such as a high power level, the gate drive signal 1160B has a low level, such as low power level. Moreover, during a time or a time interval in which gate drive signal 1160A has a low level, such as a low power level, the gate drive signal 1160B has a high level, such as high power level. As another example, at a time or during a time interval in which the gate drive signal 1160A transitions from the low level to the high level, the gate drive signal 1160B transitions from the high level to the low level. Similarly, at a time or during a time interval in which the gate drive signal 1160A transitions from the high level to the low level, the gate drive signal 1160B transitions from the low level to the high level.

The gate drive signal 1160A is supplied from the output of the gate driver 1152A to the gate terminals of the FETs 318A through 318C. Moreover, the gate drive signal 1160B is supplied from the output of the gate driver 1152B to the gate terminals of the FETs 318D through 318F. Because the gate drive signal 1160B is reversely pulsed compared to the gate drive signal 1160A, during a time or a time interval in which the FETs 318A, 318B, and 318C are on, the FETs 318D, 318E, and 318F are off. On the other hand, during a time or a time interval in which the FETs 318A, 318B, and 318C are of, the FETs 318D, 318E, and 318F are on.

Moreover, the controller 304 (FIGS. 3A, 3B, & 3D) is coupled via a conductor to the voltage source 1154A, is coupled via a conductor to the voltage source 1154B, and is coupled via a conductor to the voltage source 1154C. The controller 304 provides voltage values to the voltage sources 1154A through 1154C. During a push mode, upon receiving the voltage values, the voltage source 1154A generates a voltage signal, which is transferred via the FET 318A, when on, to the output O1. Similarly, during the push mode, upon receiving the voltage values, the voltage source 1154B generates a voltage signal, which is transferred via the FET 318B, when on, to the output O1. Also, during the push mode, in response to receiving the voltage values, the voltage source 1154C generates a voltage signal, which is transferred via the FET 318C, when on, to the output O1. When the FETs 318A through 318C are in the push mode, a positive voltage is generated at the output O1.

The controller 304 shapes an envelope of the amplified square waveform that is provided at the output by changing the voltage values that are supplied to the voltage sources 1154A through 1154C. For example, the amplified square waveform having an envelope of the arbitrary shape, or an envelope of the multi-state pulse shape, or an envelope of the continuous waveform shape is generated at the output O1 based on a rate of change of the voltage values that are supplied to the voltage sources 1154A through 1154C. To illustrate, to generate the envelope of the multi-state pulse shape, the voltage values are changed instantly by the controller 304. As another illustration, to generate the envelope of the triangular-shaped pulse, the voltage values are changed periodically in a common direction, such as increased or decreased, for a set time interval by the controller 304. As yet another illustration, to generate the envelope of the arbitrary waveform, the voltage values are changed instantly and are changed periodically in the common direction in a random manner.

Moreover, in a pull mode, the FETs 318A through 318C are turned off by the gate drive signal 1160A and the FETs 318D through 318F are turned on by the gate drive signal 1160B. During a time interval in which the FETs 318A through 318C are turned off and the FETs 318D through 318F are turned on, a negative voltage is generated at the output O1. The amplified square waveform is generated at the output O1 by operating the FETs 318A through 318F in the push and pull mode. The amplified square waveform is transferred via the output O1 to the capacitor 322A.

It should be noted that in some embodiments, optionally, a diode is coupled in parallel between a drain terminal and a source terminal of a FET of the tree 1156. For example, a diode D1 is coupled between the drain terminal and the source terminal of the FET 318A. Similarly, a diode D2 is coupled between the drain terminal and the source terminal of the FET 318B, a diode D3 is coupled between the drain terminal and the source terminal of the FET 318C, a diode D4 is coupled between the drain terminal and the source terminal of the FET 318D. Also, a diode D5 is coupled between the drain terminal and the source terminal of the FET 318E and a diode D6 is coupled between the drain terminal and the source terminal of the FET 318F. The diodes D1 through D3 limit a positive voltage at the output O1 and the diodes D4 through D6 limit a negative voltage at the output O1.

It should further be noted that although the tree 1156 shows six FETs, in some embodiments, any other number of half-bridge circuits of FETs is used. For example, instead of 3 half-bridge circuits, four, five, six, or ten half-bridge circuits are used.

Figure 11C:
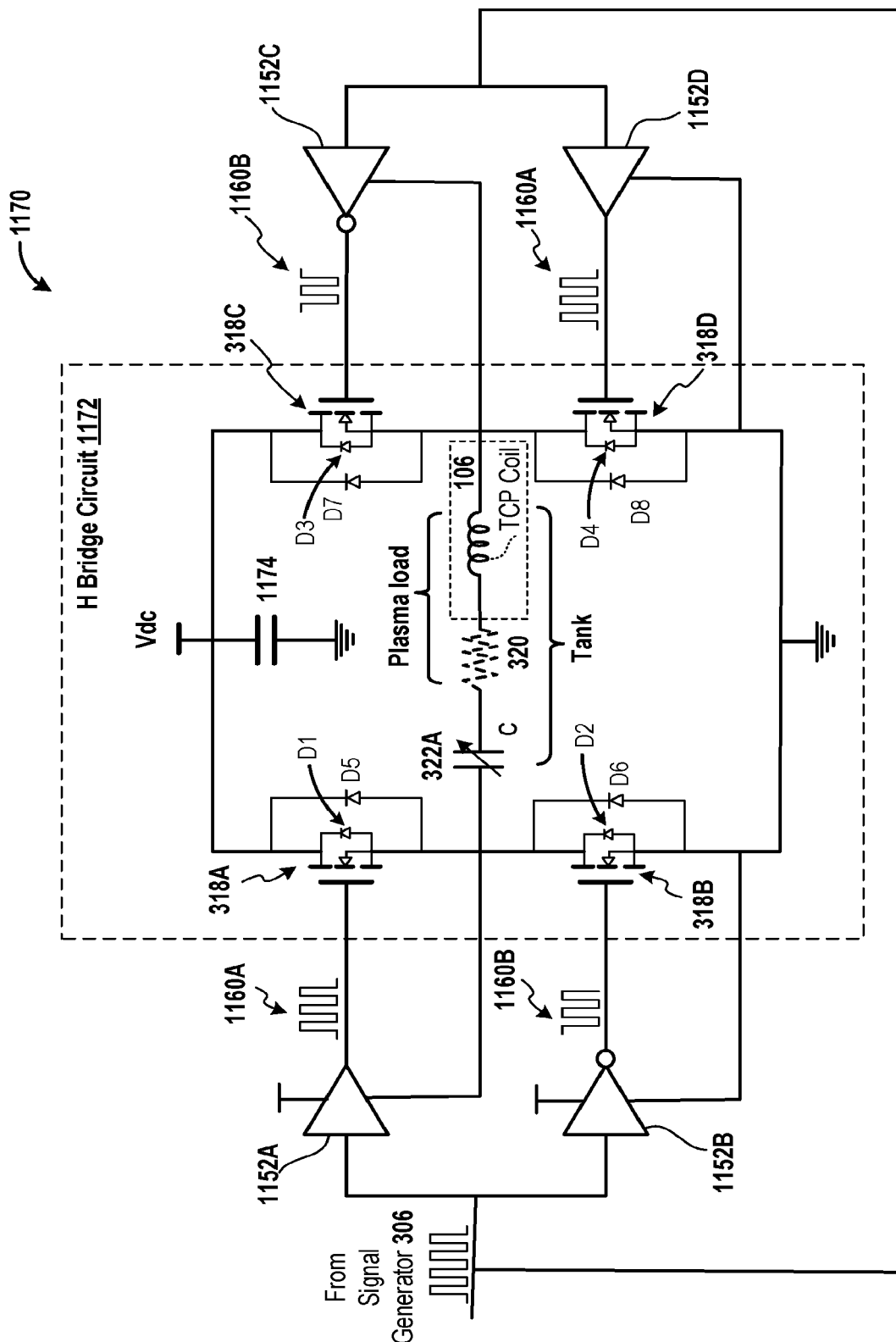
FIG. 11C is a diagram of an embodiment of an H bridge circuit used to power the electrode.

FIG. 11C is a diagram of an embodiment of a system 1170 to illustrate use of an H bridge circuit 1172 to power the electrode 106. The H bridge circuit 1172 is used instead of a half-bridge circuit. The system 1170 includes the voltage source Vdc, a capacitor 1174, the FETs 318A through 318D, the gate drivers 1152A and 1152B, a gate driver 1152C, and a gate driver 1152D. The gate driver 1152C is the same as, such as has the structure and function as, the gate driver 1152B and the gate driver 1152D is the same as the gate driver 1152A.

The system 1170 further includes multiple diodes D5, D6, D7, and D8. The diode D5 is coupled between the drain terminal and the gate terminal of the FET 318A. Similarly, the diode D6 is coupled between the drain terminal and the gate terminal of the FET 318B. Moreover, the diode D7 is coupled between the drain terminal and the gate terminal of the FET 318C and the diode D8 is coupled between the drain terminal and the gate terminal of the FET 318D.

Moreover, an output of the gate driver 1152A is coupled to the gate terminal of the FET 318A and an output of the gate driver 1152B is coupled to the gate terminal of the FET 318B. Similarly, an output of the gate driver 1152C is coupled to the gate terminal of the FET 318C and an output of the gate driver 1152D is coupled to the gate terminal of the FET 318D. Inputs of the gate drivers 1152A through 1152D are coupled to the output of the signal generator 306. The capacitor 322A and the electrode 106 are coupled between the source terminals of the FETs 318A and 318C and between the drain terminals of the FETs 318B and 318D.

When the FETs 318A and 318D are turned on, the FETs 318B and 318C are turned off. For example, the FETs 318A and 318D receive the gate drive signal 1160A and are turned on. Moreover, the FETs 318B and 318C receive the gate drive signal 1160B and are turned off. As another example, at a time or during a time period in which the FETs 318A and 318D are turned on, the FETs 318B and 318C are turned off.

Similarly, when the FETs 318B and 318C are turned on, the FETs 318A and 318D are turned off. For example, the FETs 318B and 318C receive the gate drive signal 1160B and are turned on. Moreover, the 318A and 318D receive the gate drive signal 1160B and are turned off. As another example, at a time or during a time period in which the FETs 318B and 318C are turned on, the FETs 318A and 318D are turned off.

When the FETs 318A and 318D are turned on, current flows from the voltage source Vdc via the FET 318A, the capacitor 322A, the electrode 106, and the FET 318D to ground. Similarly, when the FETs 318B and 318C are turned on, current flows from the voltage source Vdc via the FET 318C, the electrode 106, the capacitor 322A, and the FET 318B to ground. As such, current flows via the electrode 106 in two opposite directions to create positive and negative voltage across terminals of the electrode 106 during a period of a clock cycle.

Figure 12A:
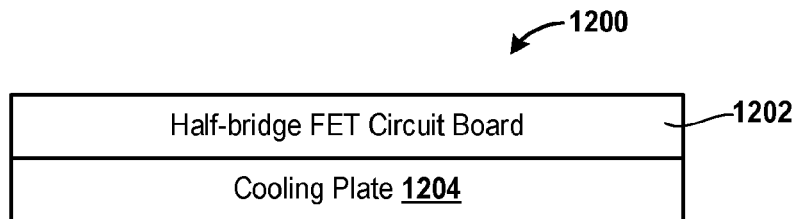
FIG. 12A is a diagram of an embodiment of a system to illustrate a cooling plate used to cool a transistor circuit board.

FIG. 12A is a diagram of an embodiment of a system 1200 illustrate a cooling plate 1204 used to cool a FET circuit board 1202, such as a half-bridge or an H bridge circuit board. The half-bridge FET circuit 318 (FIGS. 3A, 3B, & 3D) or the H bridge circuit 1172 (FIG. 11C) or the tree 1101 (FIG. 11A) or the tree 1156 (FIG. 11B) is connected to the FET circuit board 1202. The cooling plate 1204 includes a cooling liquid that passes through a cooling pipe within the cooling plate 1204 to cool FETs, such as the FETs 318A-318F (FIGS. 3A, 3B, and 11B) or the FETs of FIG. 11A, or the FETs of FIG. 11C of the FET circuit board 1202.

In some embodiments, instead of the cooling plate 1204 located below the FET circuit board 1202, the cooling plate 1204 is located above the FET circuit board 1202.

Figures 1, 12B:
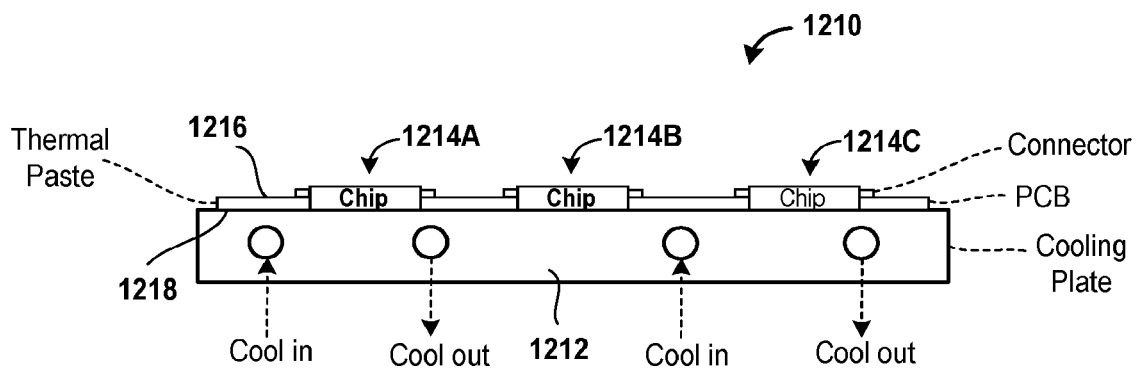
Figures 2, 12B:
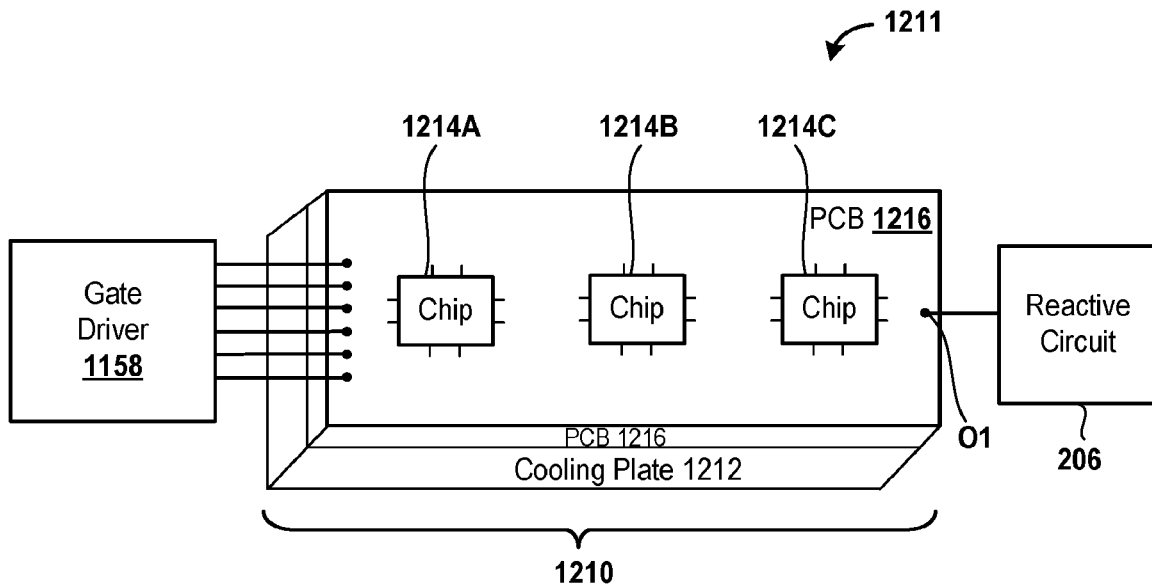

FIG. 12B-1 is a side view of an embodiment of a system 1210 to illustrate cooling of multiple integrated circuit chips 1214A, 1214B, and 1214C. The system 1210 includes a cooling plate 1212, a printed circuit board (PCB) 1216, and the chips 1214A, 1214B, and 1214C. Each chip 1214A, 1214B, and 1214C includes a circuit, such as the half-bridge FET circuit 318 (FIGS. 3A, 3B, & 3D) or the H bridge circuit 1172 (FIG. 11C) or the tree 1101 (FIG. 11A) or the tree 1156 (FIG. 11B). In some embodiments, each chip 1214A, 1214B, and 1214C includes any number of transistors or any number of half-bridge circuits or H bridge circuits or trees.

The cooling plate 1212 is coupled to the printed circuit board 1216 and to the chips 1214A, 1214B, and 1214C via a thermal paste 1218, such as a thermal grease or a thermal compound, which is used to conduct heat. Each chip 1214A, 1214B, and 1214C is fitted to the printed circuit board 1216 via a cut out in the printed circuit board 1216 so that the chips are in contact with the cooling plate 1212. Moreover, each chip 1214A, 1214B, and 1214C is electrically coupled to the printed circuit board 1216 via multiple connectors at the edges of the chip. For example, the chips 1214A, 1214B, and 1214C are soldered to the printed circuit board 1216.

When a cooling liquid, such as water, is transferred via one or more cooling channels, such as cooling pipes, within the cooling plate 1212, the cooling plate 1212 cools to transfer heat generated by the transistors of the chips 1214A, 1214B, and 1214C away from the chips. Each cooling channel as an inlet for entry of the cooling liquid and an outlet for exit of the cooling liquid. Moreover, the thermal paste 1218 aides in conduction of heat that is generated by the transistors of the chips 1214A, 1214B, and 1214C away from the chips.

FIG. 12B-2 is a top isometric view of an embodiment of a system 1211 to illustrate cooling of the integrated circuit chips 1214A, 1214B, and 1214C. The system 1211 includes the gate driver circuit 1158, the system 1210, and the reactive circuit 206. The gate driver 1158 is coupled to the printed circuit board 1216 via a plurality of input connectors on the printed circuit board 1216. Moreover, the output O1 on the printed circuit board 1216 is coupled to the reactive circuit 206. The cooling plate 1212 is located below the printed circuit board 1216 and is coupled to the printed circuit board 1216 via the thermal paste 1218 (FIG. 12B-1). It should be noted that the cooling plate 1212 and the chips 1214A, 1214B, and 1214C are placed horizontally. For example, the cooling plate 1212 lies in a horizontal plane and the chips 1214A, 1214B, and 1214C lie is another horizontal plane.

Figure 12C:
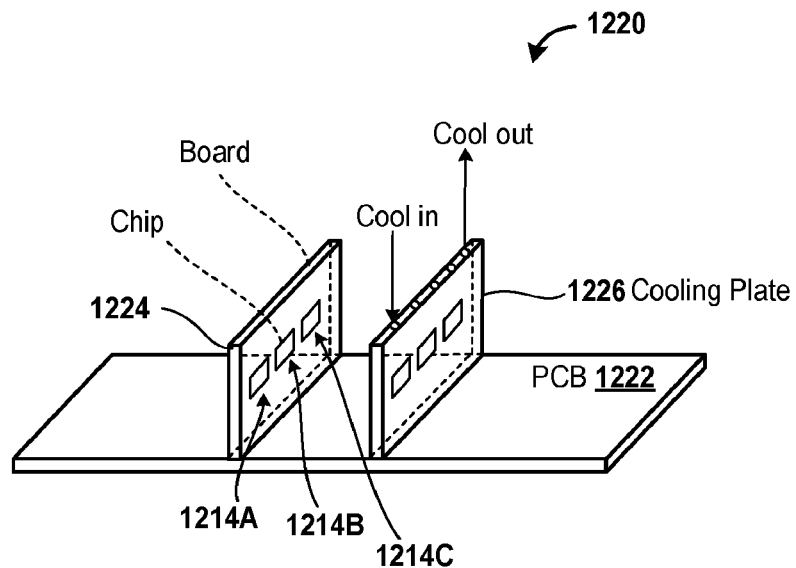
FIG. 12C is a top isometric view of an embodiment of a system to illustrate cooling of the integrated circuit chips when the chips are mounted vertically on a printed circuit board.

FIG. 12C is a top isometric view of an embodiment of a system 1220 to illustrate cooling of the integrated circuit chips 1214A, 1214B, and 1214C, when the chips are mounted vertically on a printed circuit board 1222. The system 1220 includes the printed circuit board 1222, a cooling plate 1226, and a board 1224. The chips 1214A, 1214B, and 1214C are electrically coupled to the board 1224, which is coupled to the printed circuit board 1222. Moreover, the cooling plate 1226 is fitted vertically with respect to the printed circuit board 1222. There is a space between the board 1224 and the cooling plate 1226. The cooling liquid passes through one or more cooling channels within the cooling plate 1226 to cool the cooling plate 1226. When the cooling plate 1226 is cold, heat that is generated by the chips 1214A, 1214B, and 1214C transfers via conduction and convection to an area away from the chips.

Figure 12D:
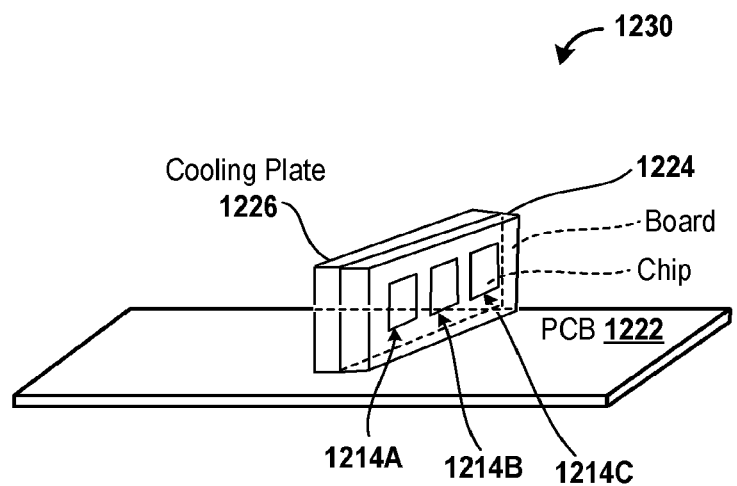
FIG. 12D a top isometric view of an embodiment of a system to illustrate cooling of the integrated circuit chips when the cooling plate is placed adjacent to a vertically-mounted board.

FIG. 12D a top isometric view of an embodiment of a system 1230 illustrate cooling of the integrated circuit chips 1214A, 1214B, and 1214C when the cooling plate 1226 is placed adjacent to the board 1224. The cooling plate 1226 is fitted vertically to the printed circuit board 1222 and is coupled to the board 1224 to be placed beside the board 1224. There is no space between the cooling plate 1226 and the board 1224. The lack of the space decreases any stray capacitance between the cooling plate 1226 and the board 1224. The cooling plate 1226 is placed to the left of the board 1224 as illustrated in FIG. 12D.

In various embodiments, the thermal paste 1218 (FIG. 12B-1) is applied between the cooling plate 1226 and the board 1224 to facilitate conduction between the cooling plate 1226 and the board 1224 to further facilitate cooling of the chips 1214A, 1214B, and 1214C.

In some embodiments, the cooling plate 1226 is placed to the right of and adjacent to the board 1224 instead of to the left.

Figure 12E:
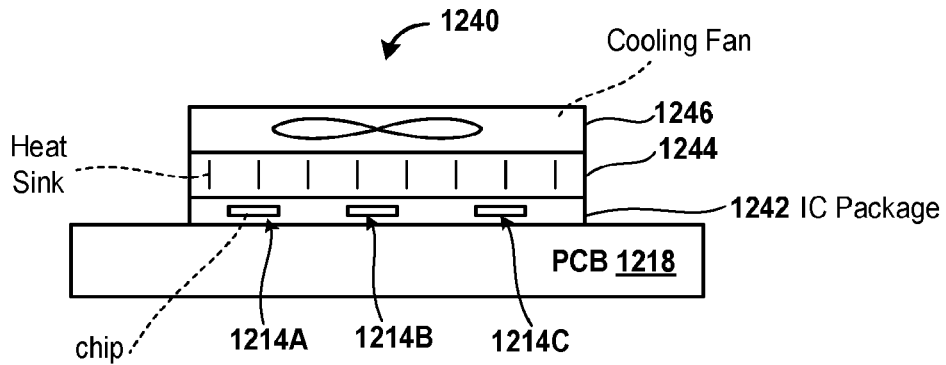
FIG. 12E is a side view of an embodiment of a system to illustrate an embodiment for cooling the integrated circuit chips.

FIG. 12E is a side view of an embodiment of a system 1240 to illustrate an embodiment for cooling the chips 1214A, 1214B, and 1214C. The system 1240 includes the printed circuit board 1218, an integrated circuit package 1242, a heat sink 1244, and a cooling fan 1246. The heat sink 1244 has a plurality of fins that are made up of a metal, such as aluminum. The package 1242 is coupled to and placed on a top surface of the printed circuit board 1218. Moreover the heat sink 1244 is coupled to and placed on a top surface of the package 1242. Also, the cooling fan 1246 is coupled to and placed over the heat sink 1244. The chips 1214A, 1214B, and 1214C are embedded within the package 1242.

Heat that is generated by the chips 1214A, 1214B, and 1214C is transferred away from the chips via the heat sink 1244. Moreover, the cooling fan 1246 is operated to transferred the heat away from the chips 1214A, 1214B, and 1214C.

In various embodiments, instead of the cooling fan 1246, multiple cooling fans are used. In some embodiments, instead of the heat sink 1244, multiple heat sinks are used.

Figure 12F:
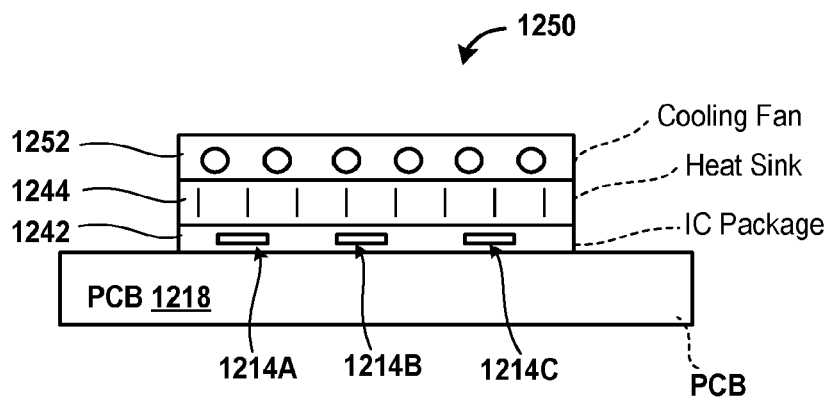
FIG. 12F is a side view of an embodiment of a system to illustrate another embodiment for cooling the integrated circuit chips.

FIG. 12F is a side view of an embodiment of a system 1250 to illustrate another embodiment for cooling the chips 1214A, 1214B, and 1214C. The system 1250 includes the printed circuit board 1218, the package 1242, the heat sink 1244, and a cooling plate 1252. The system 1250 is the same as the system 1240 (FIG. 12E) except instead of the cooling fan 1246 (FIG. 12E), the cooling plate 1252 is placed on and coupled to a top surface of the heat sink 1244.

The cooling liquid is transferred through one or more channels of the cooling plate 1252 to cool the cooling plate 1252. When the cooling plate 1252 is cooled, the heat that is generated by the chips 1214A, 1214B, and 1214C is transferred away from the chips via the heat sink 1244 and the cooling plate 1252 to cool the chips.

Figure 12G:
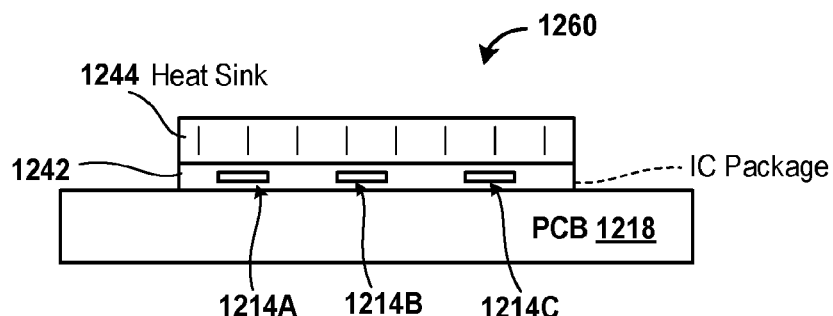
FIG. 12G is a side view of an embodiment of a system to illustrate yet another embodiment for cooling the integrated circuit chips.

FIG. 12G is a side view of an embodiment a system 1260 to illustrate yet another embodiment for cooling the chips 1214A, 1214B, and 1214C. The system 1216 includes the printed circuit board 1218, the package 1242, and the heat sink 1244. The heat that is generated by the chips 1214A, 1214B, and 1214C is transferred to the heat sink 1244 by conduction.

Figure 12H:
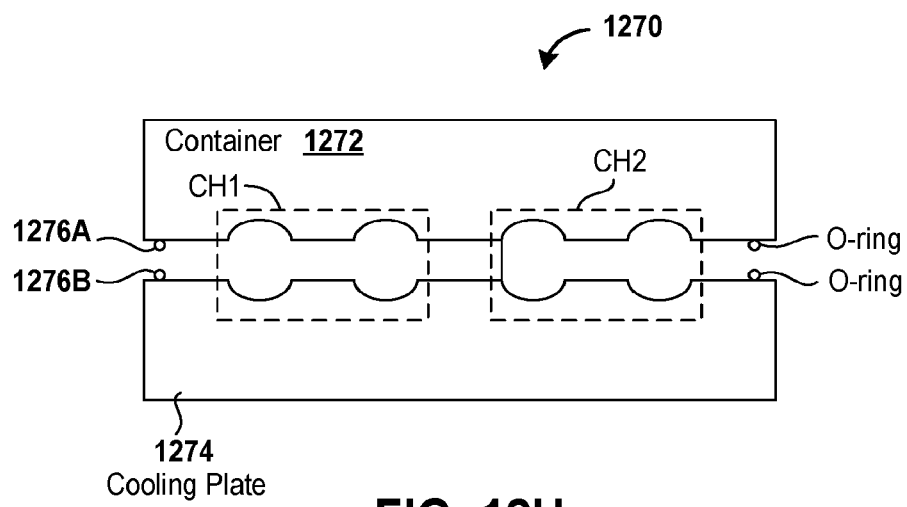
FIG. 12H is a side view of an embodiment of a system to illustrate a cooling plate and a container in which channels are milled.

FIG. 12H is a side view of an embodiment of a system 1270 to illustrate a cooling plate 1274 and a container 1272 in which channels CH1 and CH2 are milled. The container 1272 houses the matchless plasma source 102 (FIG. 1). For example, the matchless power plasma source 102 is located on a printed circuit board within the container 1272. A portion of the channel CH1 is milled within a bottom surface of the container 1272 and the remaining portion of the channel CH1 is milled within a top surface of the cooling plate 1274. Similarly, a portion of the channel CH2 is milled within the bottom surface of the container 1272 and the remaining portion of the channel CH2 is milled within the top surface of the cooling plate 1274. Each channel CH1 and CH2 is of an U-shape.

Moreover, an O-ring 1276A is attached to the bottom surface of the container 1272 and another O-ring 1276B is attached to the top surface of the cooling plate 1274. The container 1272 and the cooling plate 1274 brought in contact with each other so that the O-rings 1276A and 1276B form a seal such that a cooling liquid within the channels CH1 and CH2 is sealed. The cooling liquid is used to cool powered components, such as the half-bridge circuit 318 (FIGS. 3A, 3B, & 3D), or the H bridge circuit 1172 (FIG. 11C), or the tree 1101 (FIG. 11A) or the tree 1156 (FIG. 11B).

In some embodiments, each channel CH1 and CH2 is of a different shape than the U-shape. In various embodiments, any number of channels are milled within the container 1272 and the cooling plate 1274. For example, instead of each channel CH1 and CH2 being of the U-shape, there are four linear channels formed within the container 1272 and the cooling plate 1274.

Figure 13:
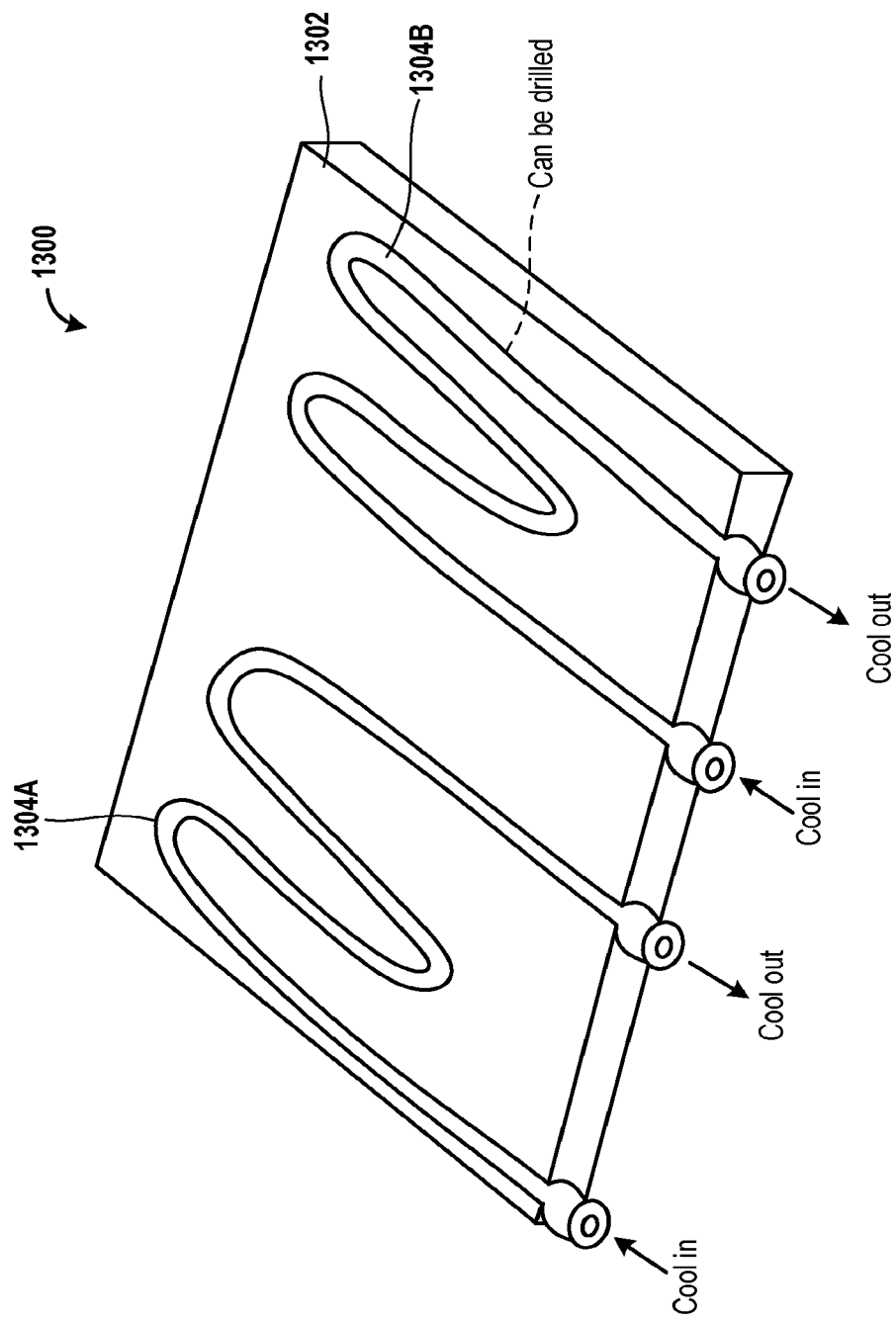
FIG. 13 is an isometric view of an embodiment of a cooling plate.

FIG. 13 is an isometric view of an embodiment of a cooling plate 1300. The cooling plate 1300 is an example of any of the cooling plates 1204 (FIG. 12A), 1212 (FIGS. 12B-1 & 12B-2), 1226 (FIGS. 12C & 12D), and 1252 (FIG. 12F). The cooling plate 1300 includes a cooling channel 1304A, such as a pipe, and another cooling channel 1304B. Each cooling channel 1304A and 1304B has an inlet for receiving the cooling liquid and an outlet for exit of the cooling liquid. The cooling channels 1304A and 1304B are embedded within a body 1302, such as a metal plate, of the cooling plate 1300.

In some embodiments, instead of a pipe, holes are drilled into the body 1302 to form one or more channels within the cooling plate 1300 for passage of the cooling liquid.

In various embodiments, a smart cold plate is used. For example, a cold plate, described herein, is coupled to a thermocouple. The thermocouple is further coupled to the controller 304 (FIGS. 3A, 3B, & 3D). Signals from the thermocouple are sent to the controller 304. The controller 304 determines a temperature of the cold plate from the signals received from the thermocouple. Moreover, the controller 304 is coupled to a driver that is coupled to the smart cold plate to control a flow of the cooling liquid into and out from one or more channels of the cold plate to further control a temperature of the smart cold plate. The control of the temperature of the smart cold plate is used to control a temperate of a half-bridge circuit that is placed in a vicinity of, such as adjacent to or a short distance away from, the smart cold plate. Such control of temperate of the smart cold plate reduces chances of condensation to further reduce chances of corrosion of the smart cold plate and of a half-bridge circuit, described herein.

FIG. 14A is a diagram of an embodiment of a system 1400 to illustrate use of an ICP chamber 1402 with the matchless plasma source 102. The chamber 1402 includes a TCP coil 1404, a dielectric window 1410, and a vacuum enclosure of the chamber 1402. The dielectric window 1410 is on top of the vacuum enclosure. The TCP coil 1404 is located over the dielectric window 1410.

The TCP coil 1404 is coupled to the matchless plasma source 102 at one end and is coupled to the ground potential or to a capacitor at an opposite end. The capacitor at the opposite end is coupled to the ground potential. The vacuum enclosure further includes a substrate holder 1412, such as an electrostatic chuck or a lower electrode. The substrate holder 1412 is coupled via an RF match 1406 to an RF generator 1408. An RF match, as used herein, is further described below with reference to FIG. 19. An RF generator, as used herein, includes an RF power supply, which is an oscillator that generates a sine wave signal. This is in comparison to the signal generator 306 (FIGS. 3A, 3B, & 3D) that generates the square wave signal. The RF match 1406 is coupled to the RF generator 1408 via an RF cable 1409.

The matchless plasma source 102 supplies the shaped sinusoidal waveform to the TCP coil 1404. Moreover, the RF generator 1408 generates an RF signal, such as the sine wave signal, that is supplied to the RF match 1406. The RF match 1406 matches an impedance of a load, such as the substrate holder 1412 and plasma within the plasma chamber 1402, coupled to an output of the RF match 1406 with that of a source, such as the RF generator 1408 and the RF cable 1409, coupled to an input of the RF match 1406 to generate a modified RF signal. When the shaped sinusoidal waveform is supplied to the TCP coil 1404 and the modified RF signal is supplied to the substrate holder 1412 in addition to supplying one or more process gases to a gap between the substrate holder 1412 and the dielectric window 1410, plasma is lit or is sustained within the vacuum enclosure to process the substrate 108 placed within the plasma chamber 1402. Examples of the process gases include as oxygen containing gases, nitrogen containing gases, and fluorine containing gases.

FIG. 14B is a diagram of an embodiment of a system 1403 to illustrate use of the ICP chamber 1402 in which the matchless plasma source 102 is coupled to the substrate holder 1412 and the TCP coil 1404 is coupled to the RF generator 1408 via the RF match 1406. The matchless plasma source 102 is coupled via the connection 110 to the substrate holder 1412 on which the substrate 108 is placed for processing. Moreover, the RF generator 1408 is coupled via the RF cable 1409 and the RF match 1406 to the TCP coil 1404. The modified RF signal is supplied to the TCP RF coil 1404 from the RF match 1406 and the shaped sinusoidal waveform is supplied from the matchless plasma source 102 to the substrate holder 1412 in addition to supplying the one or more process gases to the gap between the substrate holder 1412 and the dielectric window 1410 to strike or sustain plasma within the plasma chamber 1402.

FIG. 14C is a diagram of an embodiment of a system 1405 to illustrate another use of the ICP chamber 1402 in which the matchless plasma source 102 is coupled to the substrate holder 1412 and another matchless plasma source 102 is coupled to the TCP coil 1404. The matchless plasma source 102 supplies the shaped sinusoidal waveform to the TCP coil 1404 and the matchless plasma source 102 supplies the shaped sinusoidal waveform to the substrate holder 1412. When the one or more process gases are supplied to the gap between the substrate holder 1412 and the dielectric window 1410 in addition to supplying the shaped sinusoidal waveforms to the TCP coil 1404 and the substrate holder 1412, plasma is generated or maintained within the plasma chamber 1402.

It should be noted that in some embodiments, the matchless plasma source 102 that is coupled to the TCP coil 1404 has a different number of transistors of the amplification circuit or a tree compared to a number of transistors of the matchless plasma source 102 that is coupled to the substrate holder 1412. For example a number of half-bridge circuits within the matchless plasma source 102 coupled to the TCP coil 1404 is different than a number of half-bridge circuits within the matchless plasma source 102 coupled to the substrate holder 1412.

In various embodiments, the frequency of operation of the matchless plasma source 102 that is coupled to the TCP coil 1404 is different from the frequency of operation of the matchless plasma source 102 that is coupled to the substrate holder 1412.

In some embodiments, the frequency of operation of the matchless plasma source 102 that is coupled to the TCP coil 1404 is the same as the frequency of operation of the matchless plasma source 102 that is coupled to the substrate holder 1412.

It should further be noted that the any of the system 1400 (FIG. 14A), 1403 (FIG. 14B), or 1405 is used to process, such as to perform conductor etching on, the substrate 108.

Figure 14D:
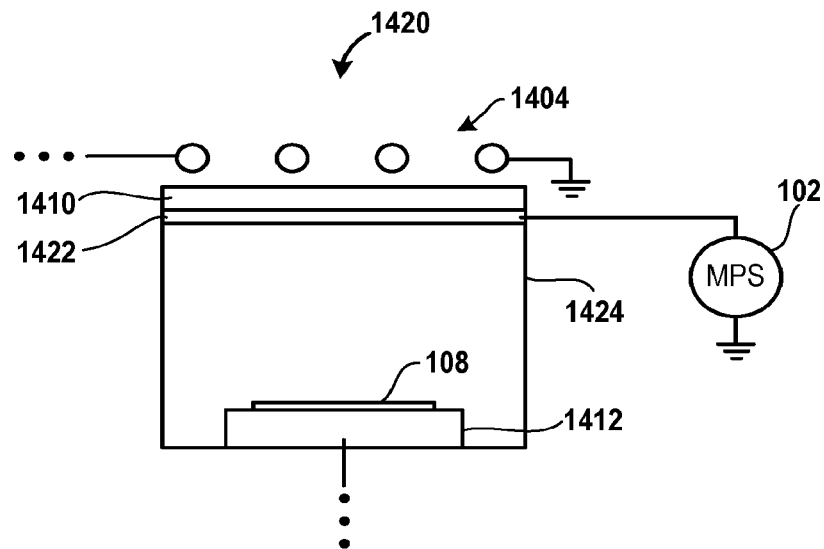
FIG. 14D is a diagram of an embodiment of a system to illustrate a coupling of the matchless plasma source to a Faraday shield.

FIG. 14D is a diagram of an embodiment of a system 1420 that illustrates a coupling of the matchless plasma source 102 to a Faraday shield 1422. The system 1420 includes an ICP plasma chamber 1424. The plasma chamber 1424 includes the TCP coil 1404, the dielectric window 1410, the Faraday shield 1422, and the vacuum chamber. The Faraday shield 1422 is below the dielectric window 1410. The matchless plasma source 102 is coupled to the Faraday shield 1422 to supply the shaped sinusoidal waveform to the Faraday shield 1422 to reduce chances of remnant materials of a process performed within the plasma chamber 1424 from depositing on the dielectric window 1410. As a result, walls of the plasma chamber 1424 are protected from erosion.

In some embodiments, the Faraday shield 1422 is located between the TCP coil 1404 and the dielectric window 1410.

Figure 14E:
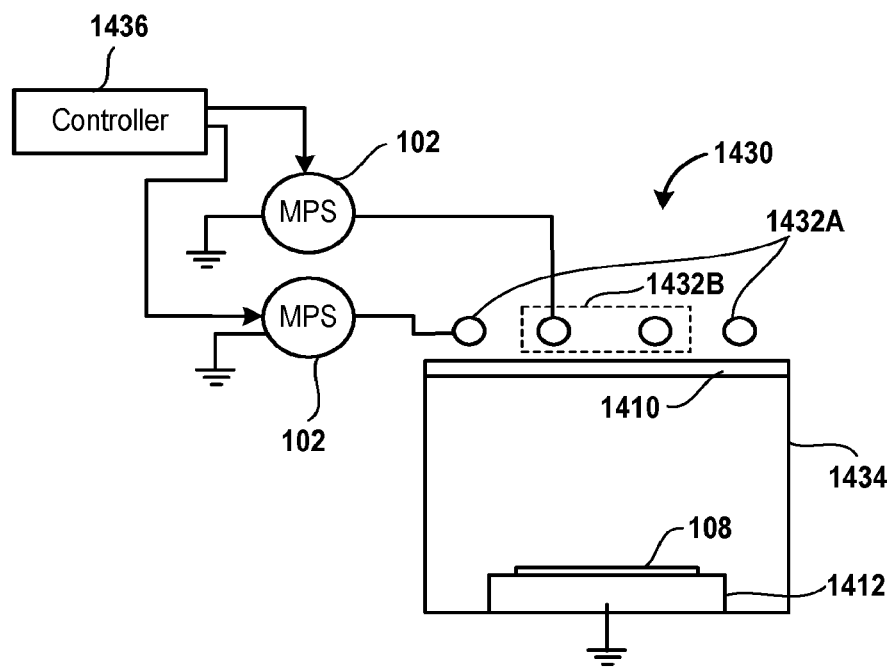
FIG. 14E is a diagram of an embodiment of a system to illustrate a multiplexing operating in which different TCP coils of a TCP plasma chamber are operated in a multiplexed manner.

FIG. 14E is a diagram of an embodiment of a system 1430 to illustrate multiplexing of a TCP coil 1432A and another TCP coil 1432B. The system 1430 includes an ICP chamber 1434. The ICP chamber 1434 includes the substrate holder 1412, the dielectric window 1410, and the TCP coils 1432A and 1432B.

The TCP coil 1432A is coupled to the matchless power source 102 and the TCP coil 1432B is coupled to another matchless power source 102. The system 1430 further includes a controller 1436 that is coupled to the matchless power source 102 and the other matchless power source 102.

The matchless power source 102 and the other matchless power source 102 are multiplexed with respect to each other. For example, at a time or during a time interval in which the controller 1436 sends a signal to turn on the matchless power source 102 coupled to the TCP coil 1432A, the controller 1436 sends a signal to turn off the matchless power source 102 coupled to the TCP coil 1432B. Similarly, at a time or during a time interval in which the controller 1436 sends a signal to turn on the matchless power source 102 coupled to the TCP coil 1432B, the controller 1436 sends a signal to turn off the matchless power source 102 coupled to the TCP coil 1432A.

As such, when the matchless power source 102 coupled to the TCP coil 1432A provides power to the TCP coil 1432A, the matchless power source 102 coupled to the TCP coil 1432B does not provide power to the TCP coil 1432B. Similarly, when the matchless power source 102 coupled to the TCP coil 1432B provides power to the TCP coil 1432B, the matchless power source 102 coupled to the TCP coil 1432A does not provide power to the TCP coil 1432A. For example, during a time period in which power is provided from the matchless power source 102 to the TCP coil 1432A, the other matchless power source 102 does not provide power to the TCP coil 1432B. Similarly, during a time period in which power is provided from the matchless power source 102 to the TCP coil 1432B, the other matchless power source 102 does not provide power to the TCP coil 1432A.

In some embodiments, instead of performing the multiplexing operation in which the matchless power source 102 coupled to the TCP coil 1432A and the other matchless power source 102 coupled to the other TCP coil 1432B are multiplexed, both the matchless power sources are operated simultaneously. For example, when the matchless power source 102 coupled to the TCP coil 1432A provides power to the TCP coil 1432A, the matchless power source 102 coupled to the TCP coil 1432B also provides power to the TCP coil 1432B. To illustrate, during a time period in which power is provided from the matchless power source 102 to the TCP coil 1432A, the other matchless power source 102 also provides power to the TCP coil 1432B.

FIG. 15A is a diagram of an embodiment of a system 1500 to illustrate use of the matchless plasma source 102 with a CCP chamber 1502. The system 1500 includes the CCP chamber 1502 and the matchless plasma source 102. The CCP chamber 1502 includes the substrate holder 1412, such as electrostatic chuck, and further includes an upper electrode 1504, which faces the substrate holder 1412. The substrate holder 1412 is coupled to the RF generator 1408 via the RF match 1406. The matchless plasma source 102 supplies the shaped sinusoidal waveform via the connection 110 to the upper electrode 1504 to generate or maintain plasma within the plasma chamber 1502. In addition, the modified RF signal is supplied from the RF match 1406 to the substrate holder 1412. Moreover, when the one or more process gases are supplied to a gap between the substrate holder 1412 and the upper electrode 1504 in addition to the shaped sinusoidal waveform, plasma is generated or maintained within the CCP chamber 1502 to process the substrate 108, which is placed on top of the substrate holder 1412.

In some embodiments, instead of the substrate holder 1412 being coupled to the ground potential, the substrate holder 1412 is coupled via an RF match to an RF generator. The RF generator generates an RF signal that is provided to the RF match. The RF match modifies the RF signal to generate a modified RF signal. The modified RF signal is supplied to the substrate holder 1412 to generate or maintain plasma within the plasma chamber 1502.

In various embodiments, instead of being coupled to the RF generator, the substrate holder 1412 is coupled to the ground potential.

FIG. 15B is a diagram of an embodiment of a system 1510 to illustrate use of the matchless plasma source 102 with the CCP chamber 1502 in which the matchless plasma source 102 is coupled to the substrate holder 1412. Moreover, the upper electrode 1504 is coupled to the ground potential. The matchless plasma source 102 supplies the shaped sinusoidal waveform via the connection 110 to the substrate holder 1412. Moreover, when the one or more process gases are supplied to the gap between the substrate holder 1412 and the upper electrode 1504 in addition to the supply of the shaped sinusoidal waveform to the substrate holder 1412, plasma is generated or maintained within the CCP chamber 1502. The plasma is generated or maintained to process the substrate 108, which is placed on top of the substrate holder 1412.

In some embodiments, instead of the upper electrode 1504 being coupled to the ground potential, the upper electrode 1504 is coupled via an RF match to an RF generator. The RF generator generates an RF signal that is provided to the RF match. The RF match modifies the RF signal to generate a modified RF signal. The modified RF signal is supplied to the upper electrode 1504 to generate or maintain plasma within the plasma chamber 1502.

FIG. 15C is a diagram of an embodiment of the system 1520 to illustrate use of the matchless plasma source 102 with the CCP chamber 1502 in which the matchless plasma source 102 is coupled to the substrate holder 1412 and another matchless plasma source 102 is coupled to the upper electrode 1504. The matchless plasma source 102 supplies the shaped sinusoidal waveform via the connection 110 to the substrate holder 1412 and the matchless plasma source 102 supplies the shaped sinusoidal waveform via the connection 110 to the upper electrode 1504. Moreover, when the one or more process gases are supplied to the gap between the substrate holder 1412 and the upper electrode 1504 in addition to the supply of the shaped sinusoidal waveforms to the substrate holder 1412 and the upper electrode 1504, plasma is generated or maintained within the CCP chamber 1502. The plasma is generated or maintained to process the substrate 108, which is placed on top of the substrate holder 1412.

It should be noted that any of the system 1500 (FIG. 15A), 1510 (FIG. 15B), or 1520 is used to process, such as perform a dielectric etch operation on, the substrate 108.

FIG. 15D is a diagram of an embodiment of a system 1530 to illustrate coupling of the matchless power source 102 and of RF generators 1408 and 1534 to the substrate holder 1412 of the CCP chamber 1502. As an example, the operating frequency of the matchless power source 102 is different from the operating frequency of the RF power generator 1408, and the operating frequency of the RF power generator 1408 is different from the operating frequency of the RF power generator 1534. To illustrate, the operating frequency of the matchless power source 102 is 400 kHz, an operating frequency of the RF power generator 1408 is 2 MHz or 13.56 MHz or 27 MHz, and an operating frequency of the RF power generator 1534 is 60 MHz. Each of the RF power generators 1408 and 1534 includes an oscillator that generates a sinusoidal waveform for supply of RF power to the substrate holder 1412. None of the RF power generators 1408 and 1534 have the signal generator 306 (FIGS. 3A, 3B, and 3D).

The matchless power source 102 provides the shaped sinusoidal waveform to the substrate holder 1412. In addition, the RF power generators 1408 and 1534 provide RF power to the substrate holder 1412 to process the substrate 108.

FIG. 15E is a diagram of an embodiment of a system 1540 to illustrate coupling of the matchless power source 102 and of the RF power generators 1408 and 1534 to the upper electrode 1504 of the CCP chamber 1502. The matchless power source 102 provides the shaped sinusoidal waveform to the upper electrode 1504. In addition, the RF power generators 1408 and 1534 provide RF power to the upper electrode 1504 to process the substrate 108.

FIG. 15F is a diagram of an embodiment of a system 1550 to illustrate coupling of the matchless power source 102 and of the RF power generators 1408 and 1534 to the substrate holder 1412 of the CCP chamber 1502, and to further illustrate coupling of the matchless power source 102 and of the RF power generators 1408 and 1534 to the upper electrode 1504 of the CCP chamber 1502. The matchless power source 102 provides the shaped sinusoidal waveform to the upper electrode 1504. Also, another matchless power source 102 provides the shape sinusoidal waveform to the substrate holder 1412. In addition, the RF power generators 1408 and 1534 provide RF power to the upper electrode 1504 and another set of the RF power generators 1408 and 1534 provide RF power to the substrate holder 1412 to process the substrate 108.

In some embodiments, the substrate holder 1412 is coupled to multiple matchless plasma sources, each of which is the matchless plasma source 102. Each of the matchless plasma sources has a different operating frequency. For example, a first one of the matchless plasma sources has an operating frequency of 400 kHz or 2 MHz. A second one of the matchless plasma sources has an operating frequency of 27 MHz and a third one of the matchless plasma sources has an operating frequency of 60 MHz.

In various embodiments, the upper electrode 1504 is coupled to multiple matchless plasma sources, each of which is the matchless plasma source 102. Each of the matchless plasma sources has a different operating frequency as described above.

In some embodiments, the upper electrode 1504 is coupled to multiple matchless plasma sources, each of which is the matchless plasma source 102. Moreover, the substrate holder 1412 is coupled to multiple matchless plasma sources, each of which is the matchless plasma source 102. Each of the matchless plasma sources coupled to the substrate holder 1412 has a different operating frequency as described above. Similarly, each of the matchless plasma sources coupled to the upper electrode 1504 has a different operating frequency as described above.

FIG. 16A is a diagram of an embodiment of a system 1600 to illustrate a plasma chamber 1602 having a showerhead 1604 that is coupled to the matchless plasma source 102. The system 1600 includes the plasma chamber 1602 and the matchless plasma source 102. The plasma chamber 1602 has the showerhead 1604 and the substrate holder 1412, which is coupled to the ground potential. The showerhead 1604 has multiple openings for allowing a passage of the process materials, such as the process gases or liquid materials, such as metallic materials, to a gap between the showerhead 1604 and the substrate holder 1412 to process the substrate 108. For example, the showerhead 1604 is used to perform atomic layer deposition or chemical vapor deposition on the substrate 108. When the one or more process materials are supplied to the gap between the substrate holder 1412 and the showerhead 1604 in addition to the supply of the shaped sinusoidal waveform to an upper electrode within the showerhead 1604, plasma is generated or maintained within the plasma chamber 1602. The plasma is generated or maintained to process the substrate 108, which is placed on top of the substrate holder 1412.

In some embodiments, instead of the substrate holder 1412 of the plasma chamber 1602 being coupled to the ground potential, the substrate holder 1412 is coupled via an RF match to an RF generator. The RF generator generates an RF signal that is provided to the RF match. The RF match modifies the RF signal to generate a modified RF signal. The modified RF signal is supplied to the substrate holder 1412 within the plasma chamber 1602 to generate or maintain plasma within the plasma chamber 1602.

FIG. 16B is a diagram of an embodiment of a system 1610 to illustrate a coupling of the matchless plasma source 102 to the substrate holder 1412 instead of to the showerhead 1604. The system 1610 includes the plasma chamber 1602. The matchless plasma source 102 is coupled via the connection 110 to the substrate holder 1412 and the showerhead 1604 is coupled to the ground potential. When the one or more process materials are supplied to the gap between the substrate holder 1412 and the showerhead 1604 in addition to the supply of the shaped sinusoidal waveform to the substrate holder 1412, plasma is generated or maintained within the plasma chamber 1602. The plasma is generated or maintained to process the substrate 108, which is placed on top of the substrate holder 1412.

In some embodiments, instead of the upper electrode within the showerhead 1604 being coupled to the ground potential, the upper electrode is coupled via an RF match to an RF generator. The RF generator generates an RF signal that is provided to the RF match. The RF match modifies the RF signal to generate a modified RF signal. The modified RF signal is supplied to the upper electrode within the showerhead 1604 to generate or maintain plasma within the plasma chamber 1602.

FIG. 16C is a diagram of an embodiment of a system 1620 to illustrate a coupling of the matchless plasma source 102 to the substrate holder 1412 and another matchless plasma source 102 to the showerhead 1604. The system 1620 includes the multiple matchless plasma sources 102 and the plasma chamber 1602. The matchless plasma source 102 supplies the shaped sinusoidal waveform via the connection 110 to the substrate holder 1412 and the matchless plasma source 102 supplies the shaped sinusoidal waveform via the connection 110 to the upper electrode of the showerhead 1604. When the one or more process materials are supplied to the gap between the substrate holder 1412 and the showerhead 1604 in addition to the supply of the shaped sinusoidal waveforms to the upper electrode within the showerhead 1604 and to the substrate holder 1412, plasma is generated or maintained within the plasma chamber 1602. The plasma is generated or maintained to process the substrate 108, which is placed on top of the substrate holder 1412.

Figure 17A:
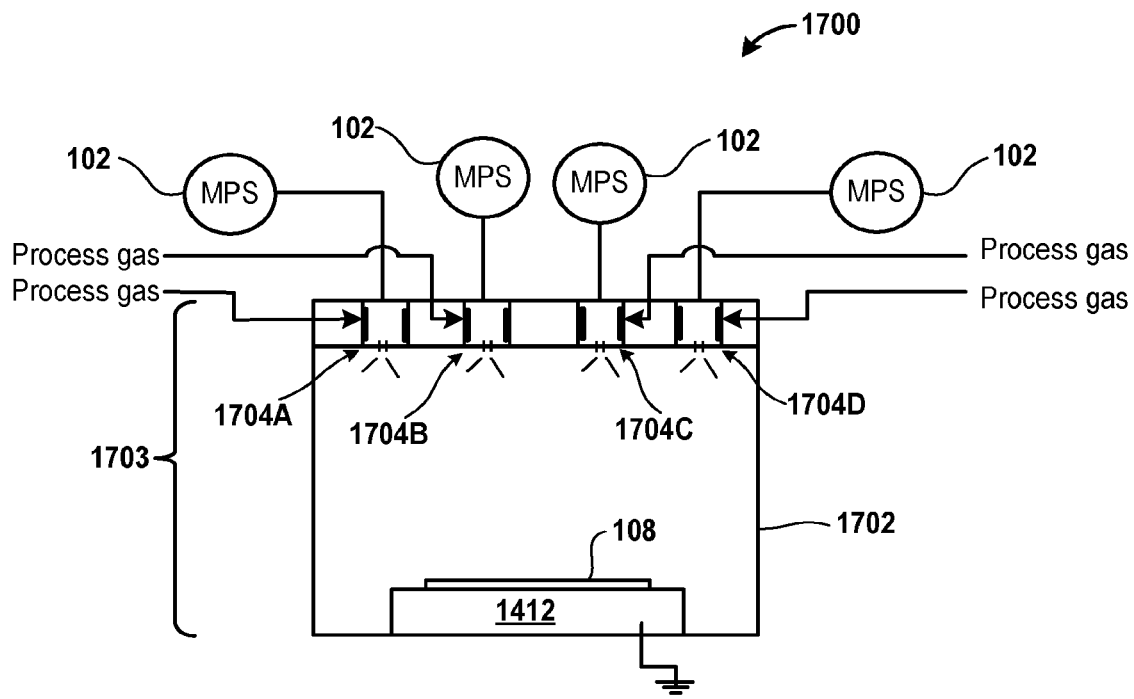
FIG. 17A is a diagram of an embodiment of a system to illustrate a coupling of multiple matchless plasma sources to multiple microsources.

FIG. 17A is a diagram of an embodiment of a system 1700 to illustrate a coupling of multiple matchless plasma sources, such as the matchless plasma source 102, to multiple microsources 1704A, 1704B, 1704C, and 1704D. The system 1700 includes the multiple matchless plasma sources and a plasma chamber 1703. The plasma chamber 1703 includes multiple microsources 1704A through 1704D and a vacuum chamber 1702. The matchless plasma source 102 is coupled to an electrode of the microsource 1704A and another matchless plasma source 102 is coupled an electrode of to the microsource 1704B. Similarly, yet another matchless plasma source 102 is coupled to an electrode of the microsource 1704C and another matchless plasma source 102 is coupled to an electrode of the microsource 1704D. Each microsource 1704A through 1704D is an enclosure for forming plasma within the enclosure.

When the one or more process gases and the shaped sinusoidal waveform is supplied to the microsource 1704A, plasma is generated within the microsource 1704A and provided from an opening between the microsource 1704A and the vacuum chamber 1702 to the vacuum chamber 1702. Moreover, when the one or more process gases and the shaped sinusoidal waveform is supplied to the microsource 1704B, plasma is generated within the microsource 1704B and provided from an opening between the microsource 1704B and the vacuum chamber 1702 to the vacuum chamber 1702. Similarly, plasma generated within the microsources 1704C and 1704D is supplied to the vacuum chamber 1702.

The vacuum chamber 1702 includes the substrate holder 1412 on which the substrate 108 is placed. The plasma that enters into the vacuum chamber 1702 from the microsources 1704A through 1704D is used to process the substrate 108.

Figure 17B:
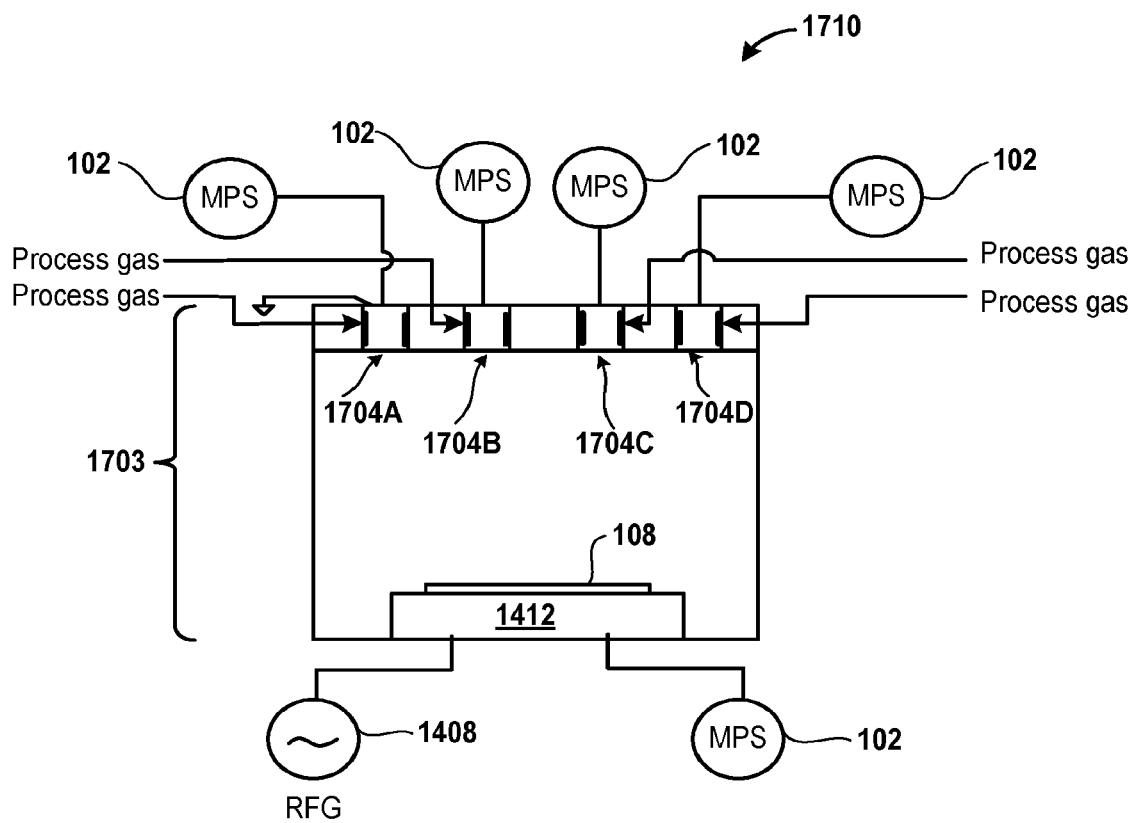
FIG. 17B is a diagram of an embodiment of a system to illustrate coupling of the substrate holder to the 50 Ohm RF generator and the matchless plasma source.

FIG. 17B is a diagram of an embodiment of a system 1710 to illustrate coupling of the substrate holder 1412 to the RF generator 1408 and the matchless plasma source 102. The system 1710 includes the microsources 1704A, 1704B, 1704C, and 1704D and the plasma chamber 1703.

Moreover, in the system 1710, the RF generator 1408 is coupled to the substrate holder 1412 and the matchless power source 102 is also coupled to the substrate holder 1412. The operating frequency of the matchless power source 102 that is coupled to the substrate holder 1412 is different from a frequency of operation of the RF generator 1408. For example, when the matchless power source 102 coupled to the substrate holder 1412 is operating at a frequency of 400 kHz or 2 MHz, the RF generator 1408 is operating at a frequency of 13.56 MHz or 27 MHz or 60 MHz. As another example, when the matchless power source 102 coupled to the substrate holder 1412 is operating at a frequency of 13.56 MHz or 27 MHz or 60 MHz, the RF generator 1408 is operating at a frequency of 400 kHz or 2 MHz. The matchless power source 102 supplies the amplified square waveform to the substrate holder 1412 and the RF generator 1408 supplies RF power to the substrate holder 1412 to process the substrate 108 within the plasma chamber 1703.

Figure 17C:
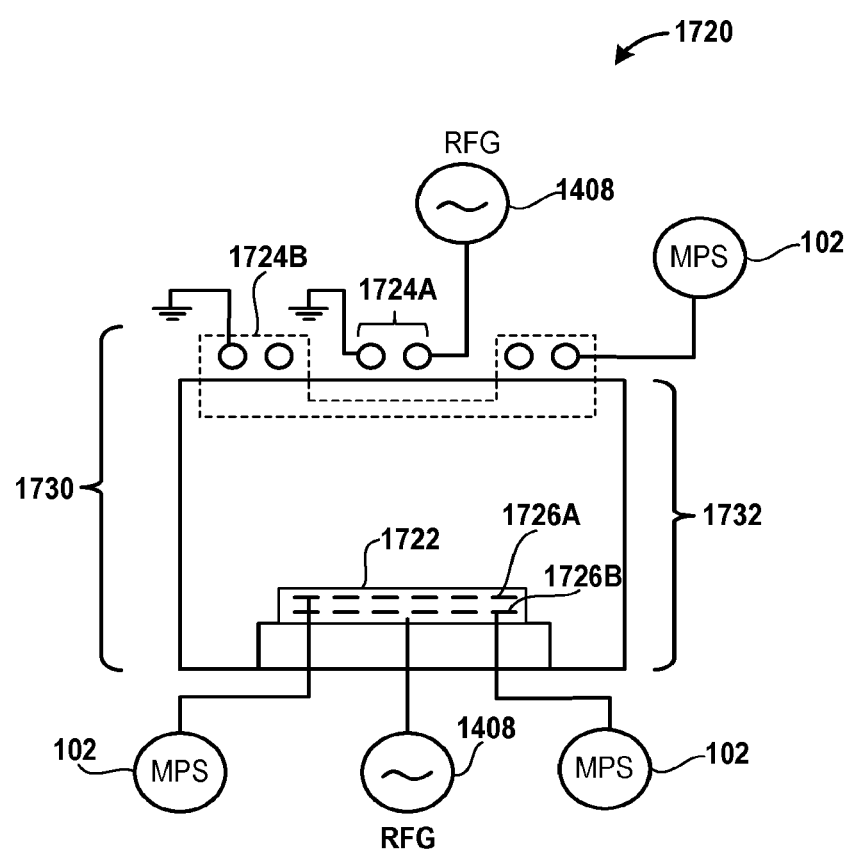
FIG. 17C is a diagram of an embodiment of a system to illustrate providing of RF power from the matchless plasma source to a grid within a chuck and providing of RF power from the 50 Ohm RF generator to a cathode of the chuck.

FIG. 17C is a diagram of an embodiment of a system 1720 to illustrate providing of RF power from the matchless plasma source 102 to grids 1726A and 1726B within a chuck 1722 and providing of RF power from the RF generator 1408 to a cathode of the chuck 1722. The system 1720 includes a plasma chamber 1730, the RF generator 1408, the matchless plasma source 102, another RF generator 1408, and another matchless plasma source 102. The plasma chamber 1730 includes an inner TCP coil 1724A and an outer TCP coil 1724B. Moreover, the plasma chamber 1730 includes the chuck 1722, such as an electrostatic chuck.

The RF generator 1408 is coupled to the inner TCP coil 1724A and the matchless plasma source is coupled to the outer TCP coil 1724B. Moreover, the matchless power source 102 is coupled to the grid 1726A of the chuck 1722 and the other matchless power source 102 is coupled to the grid 1726B. The other RF generator 1408 is coupled to the cathode of the chuck 1722.

The RF generator 1408 provides RF power to the inner TCP coil 1724A. Moreover, the matchless plasma source 102 coupled to the outer TCP coil 1724B supplies the amplified square waveform to the outer TCP coil 1724B. Furthermore, the matchless power source 102 coupled to the grid 1726A supplies the amplified square waveform to the grid 1726A. In addition, the matchless power source 102 coupled to the grid 1726B supplies the amplified square waveform to the grid 1726B. In addition, the RF generator 1408 coupled to the cathode provides RF power to the cathode to process the substrate 108.

Figure 18:
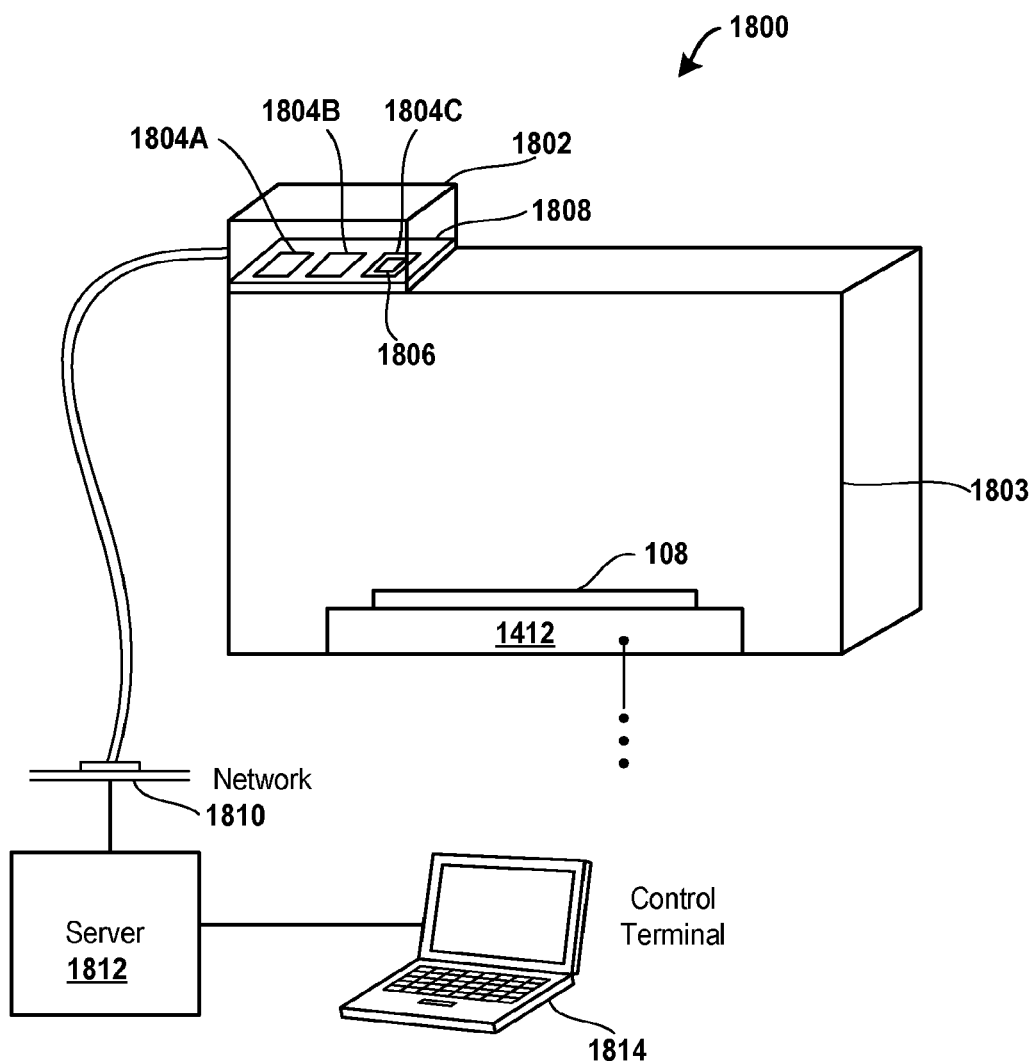
FIG. 18 is a diagram of an embodiment of a system to illustrate an enclosure that is used to house the matchless plasma source.

FIG. 18 is a diagram of an embodiment of a system 1800 to illustrate an enclosure 1802 that is used to house the matchless plasma source 102. The system 1800 includes the enclosure 1802 and a plasma chamber 1803. Examples of the plasma chamber 1803 include the plasma chamber 104 (FIG. 1), the ICP chamber 1402 (FIGS. 14A-14C), the ICP chamber 1424 (FIG. 14B), the CCP chamber 1502 (FIGS. 15A-15C), and the plasma chamber 1602 (FIG. 16A-16C) and the plasma chamber 1703 illustrated in FIG. 17A. The enclosure 1802, for example, has a similar size to that of a central processing unit (CPU) housing or that of a shoebox.

Moreover, the system 1800 includes a network 1810, a server 1812, and a control terminal 1814. The enclosure 1802 is a container for enclosing a printed circuit board 1808. Multiple chips 1804A, 1804B, and 1804C are coupled to the printed circuit board 1808. The chip 1804A has the controller board 302 (FIGS. 3A, 3B, & 3D). Moreover, the chip 1804 has a gate driver, such as a gate driver 311 (FIGS. 3A, 3B, & 3D) or the gate driver circuit 1158 (FIG. 11B), or the gate drivers 1152A through 1152D (FIG. 11C). Furthermore, the chip 1804C has the half-bridge FET circuit 318 (FIGS. 3A, 3B, & 3D), the H bridge circuit 1172 (FIG. 11C), the tree 1101 (FIG. 11A), or the tree 1156 (FIG. 11B).

An example of the network 1810 includes a computer network, such as the Internet, an intranet, or a combination thereof. Examples of the control terminal 1814 includes a computer, such as a laptop, desktop, a tablet, or a smart phone. The control terminal 1804 is connected via the server 1812 and the network 1810 to multiple enclosures, such as the enclosure 1802, to control multiple plasma chambers via the multiple enclosures.

It should be noted that a size of the enclosure 1802 is much smaller compared to a size of a housing of an RF generator and a housing of an RF match. The reduction in size of the enclosure 1802 results in cost savings in addition to savings in space used.

A cooling plate 1806 provides cooling to the chip 1804C. The cooling plate 1806 is located under or above the chip 1804C. For example, the cooling plate 1806 is coupled via a thermal paste to the chip 1804C.

In some embodiments, the controller board 302 and the gate driver are located on the same chip. Moreover, in various embodiments, the gate driver and any of the half-bridge FET circuit 318, the tree 1101, and the tree 1156 are located on the same chip. Furthermore, in several embodiments the controller board 302 and any of the half-bridge FET circuit 318, the tree 1101, and the tree 1156 are located on the same chip. Also, in some embodiments, the controller board 302, the gate driver, and any of the half-bridge FET circuit 318, the tree 1101, and the tree 1156 are located on the same chip.

FIG. 19 is a block diagram of an embodiment of the system 1902 to illustrate the RF cable 1908 and the RF match 1906. An example of the RF cable 1908 is a coaxial cable. An example of the RF match 1906 is an impedance match, or an impedance matching circuit, or an impedance matching network. The RF match 1906 has multiple circuit elements, such as inductors, capacitors, resistors, or a combination thereof. The system 1902 further includes an RF generator 1904 and a plasma chamber 1910 having an electrode 1912.

The RF generator 1904 includes an RF power supply that generates an RF signal, which is of the sine wave shape. The RF signal of the sine wave shape is supplied via the RF cable 1908 to the RF match 1906. The RF match 1906 matches an impedance of a load, such as the plasma chamber 1910, coupled to an output of the RF match 1906, with an impedance of a source, such as the RF generator 1904 and the RF cable 1908, coupled to an input of the RF match 1906 to generate a modified RF signal. The modified RF signal is supplied to the electrode 1912. The system 100 (FIG. 1) lacks the RF cable 1908 and the RF match 1906 between the matchless plasma source 102 and the plasma chamber 104 to reduces chances of power being reflected from the plasma chamber 104 via the RF match 1906 and the RF cable 1908 to the RF source 102 (FIG. 1).

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller, e.g., the host system, etc. is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as Application Specific Integrated Circuits (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, and any other semiconductor processing chamber that is associated or used in fabrication and/or manufacturing of semiconductor wafers.

It is further noted that although the above-described operations are described with reference to a transformer coupled plasma (TCP) reactor, in some embodiments, the above-described operations apply to other types of plasma chambers, e.g., conductor tools, etc.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer.

When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma source comprising:
an input section configured to generate a square wave signal; and
an output section coupled to the input section to receive the square wave signal, wherein the output section is configured to generate a plurality of pulsed signals based on the square wave signal, wherein the plurality of pulsed signals include a first pulsed signal and a second pulsed signal, wherein the first pulsed signal is in reverse synchronization with the second pulsed signal, wherein when the first pulsed signal transitions from a first low level to a first high level, the second pulsed signal transitions from a second high level to a second low level, wherein when the first pulsed signal transitions from the first high level to the first low level, the second pulsed signal transitions from the second low level to the second high level, wherein the output section is configured to amplify the plurality of pulsed signals to output an amplified square waveform, and wherein the input section includes an arbitrary waveform generator coupled to the output section to shape the amplified square waveform.

2. The plasma source of claim 1, wherein the input section includes:
a controller board, wherein the controller board is configured to generate the square wave signal; and
a gate driver portion coupled to the controller board, wherein the gate driver portion is configured to receive the square wave signal.

3. The plasma source of claim 2, wherein the square wave signal has a frequency, wherein the controller board includes a controller and a signal generator, wherein the controller is coupled to the signal generator, wherein the controller is configured to provide a signal indicating a frequency value of the frequency to the signal generator, and wherein the signal generator is configured to generate the square wave signal in response to receiving the signal indicating the frequency value.

4. The plasma source of claim 3, wherein the frequency value is 400 kilohertz, or 2 megahertz, or 13.56 megahertz, or 27 megahertz, or 60 megahertz.

5. The plasma source of claim 2, wherein the gate driver portion includes:
a gate driver sub-portion, wherein the gate driver sub-portion is configured to amplify the square wave signal to output an amplified signal; and
a primary winding coupled to the gate driver sub-portion for receiving the amplified signal.

6. The plasma source of claim 5, wherein the output section includes:
another gate driver portion including:
a first secondary winding; and
a second secondary winding, wherein the first secondary winding is configured to output the first pulsed signal upon reception of the amplified signal by the primary winding, wherein the second secondary winding is configured to output the second pulsed signal upon reception of the amplified signal by the primary winding.

7. The plasma source of claim 6, wherein the output section includes a half-bridge circuit coupled to the first secondary winding and the second secondary winding, wherein the half-bridge circuit is configured to output the amplified square waveform upon receiving the first pulsed signal and the second pulsed signal.

8. The plasma source of claim 7, wherein the half-bridge circuit includes a direct current (DC) voltage source, a DC rail, and a plurality of transistors, wherein the DC voltage source is coupled via the DC rail to the plurality of transistors, wherein the plurality of transistors include a first transistor and a second transistor, and wherein the amplified square waveform is output between the first transistor and the second transistor.

9. The plasma source of claim 8, wherein the DC voltage source is coupled to the input section.

10. The plasma source of claim 9, wherein the arbitrary waveform generator is coupled to the DC voltage source, wherein the arbitrary waveform generator is configured to generate a shaping control signal and provide the shaping control signal to the DC voltage source to shape an envelope of the amplified square waveform.

11. The plasma source of claim 8, wherein each of the plurality of transistors of the half-bridge circuit is fabricated from Silicon Carbide or Gallium Nitride.

12. A method comprising:
generating a plurality of pulsed signals including a first pulsed signal and a second pulsed signal, wherein the first pulsed signal is in reverse synchronization with the second pulsed signal, wherein when the first pulsed signal transitions from a first low level to a first high level, the second pulsed signal transitions from a second high level to a second low level, and wherein when the first pulsed signal transitions from the first high level to the first low level, the second pulsed signal transitions from the second low level to the second high level;
receiving the plurality of pulsed signals to output an amplified square waveform; and
shaping the amplified square waveform.

13. The method of claim 12, further comprising:
generating a shaping control signal; and
providing the shaping control signal to shape an envelope of the amplified square waveform.

14. A method comprising:
providing a frequency input having a frequency value;
generating an input signal, wherein the input signal is a square wave signal having a frequency based on the frequency value;
receiving the input signal to generate a plurality of pulsed signals, wherein one of the plurality of pulsed signals is in reverse synchronization with another one of the plurality of pulsed signals;
receiving the plurality of pulsed signals to output an amplified square waveform; and
shaping the amplified square waveform.

15. The method of claim 14, wherein the plurality of pulsed signals include a first pulsed signal and second pulsed signal, the method further comprising:
amplifying the input signal to output an amplified signal;
outputting the first pulsed signal and the second pulsed signal upon reception of the amplified signal.

16. A plasma system comprising:
a plasma source including:
an input section configured to generate a square wave signal;
an output section coupled to the input section to receive the square wave signal, wherein the output section is configured to generate a plurality of pulsed signals based on the square wave signal, wherein the plurality of pulsed signals include a first pulsed signal and a second pulsed signal, wherein the first pulsed signal is in reverse synchronization with the second pulsed signal,
wherein the output section is configured to amplify the plurality of pulsed signals to output an amplified square waveform,
wherein the input section includes an arbitrary waveform generator coupled to the output section to shape the amplified square waveform; and
a reactive circuit coupled to the plasma source, wherein the reactive circuit is configured to receive the amplified square waveform to output a shaped sinusoidal waveform having a fundamental frequency; and
a plasma chamber coupled to the reactive circuit for receiving the shaped sinusoidal waveform.

17. The plasma system of claim 16, wherein the reactive circuit includes a capacitor, wherein the capacitor is configured to remove higher-order frequencies of the amplified square waveform to output the shaped sinusoidal waveform having the fundamental frequency.

18. The plasma system of claim 16, wherein the plasma chamber includes a transformer coupled plasma (TCP) coil coupled to the reactive circuit.

19. The plasma system of claim 16, wherein the input section includes:
a controller board, wherein the controller board is configured to generate the square wave signal; and
a gate driver portion coupled to the controller board, wherein the gate driver portion is configured to receive the square wave signal.

* * * * *